(12) United States Patent
Yun

(10) Patent No.: US 12,211,825 B2
(45) Date of Patent: Jan. 28, 2025

(54) MEMORY ARRAY, INTEGRATED CIRCUIT INCLUDING THE SAME, AND MANUFACTURING METHOD THEREOF

(71) Applicant: Taiwan Semiconductor Manufacturing Company, Ltd., Hsinchu (TW)

(72) Inventor: Wei-Sheng Yun, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 722 days.

(21) Appl. No.: 17/460,324

(22) Filed: Aug. 30, 2021

(65) Prior Publication Data

US 2023/0061475 A1 Mar. 2, 2023

(51) Int. Cl.
*H01L 27/06* (2006.01)
*G11C 5/02* (2006.01)
*H01L 25/07* (2006.01)
*H01L 27/02* (2006.01)
*H10B 99/00* (2023.01)

(52) U.S. Cl.
CPC ............ *H01L 25/074* (2013.01); *G11C 5/025* (2013.01); *H01L 27/0207* (2013.01); *H01L 27/0688* (2013.01); *H10B 99/00* (2023.02)

(58) Field of Classification Search
None
See application file for complete search history.

(56) References Cited

U.S. PATENT DOCUMENTS

| | | | | |
|---|---|---|---|---|
| 6,200,904 | B1 * | 3/2001 | Tan | H01L 21/76897 |
| | | | | 257/E21.507 |
| 2009/0072297 | A1 * | 3/2009 | Lee | G11C 11/56 |
| | | | | 257/E21.21 |
| 2012/0281490 | A1 * | 11/2012 | Cho | H10B 12/09 |
| | | | | 257/E21.409 |

* cited by examiner

*Primary Examiner* — Monica D Harrison
(74) *Attorney, Agent, or Firm* — JCIPRNET

(57) ABSTRACT

A memory array includes a first bit-line stack disposed over a substrate, a first spacer, a first data storage structure, and a word line. The first bit-line stack includes a first bit line disposed over the substrate; and a first hard mask layer partially covering a top surface of the first bit line. The first spacer is disposed on a lower sidewall of a first sidewall of the first bit line. The first hard mask layer and the first spacer expose a top corner of the first bit line. The first data storage structure covers the top corner of the first bit line. The word line covers a sidewall of the first data storage structure.

20 Claims, 57 Drawing Sheets

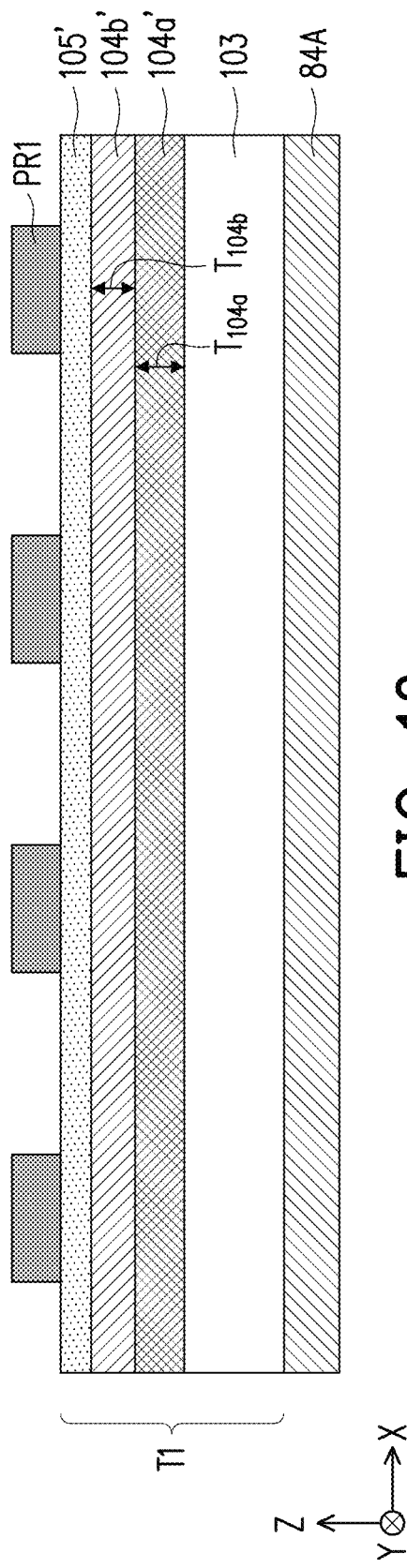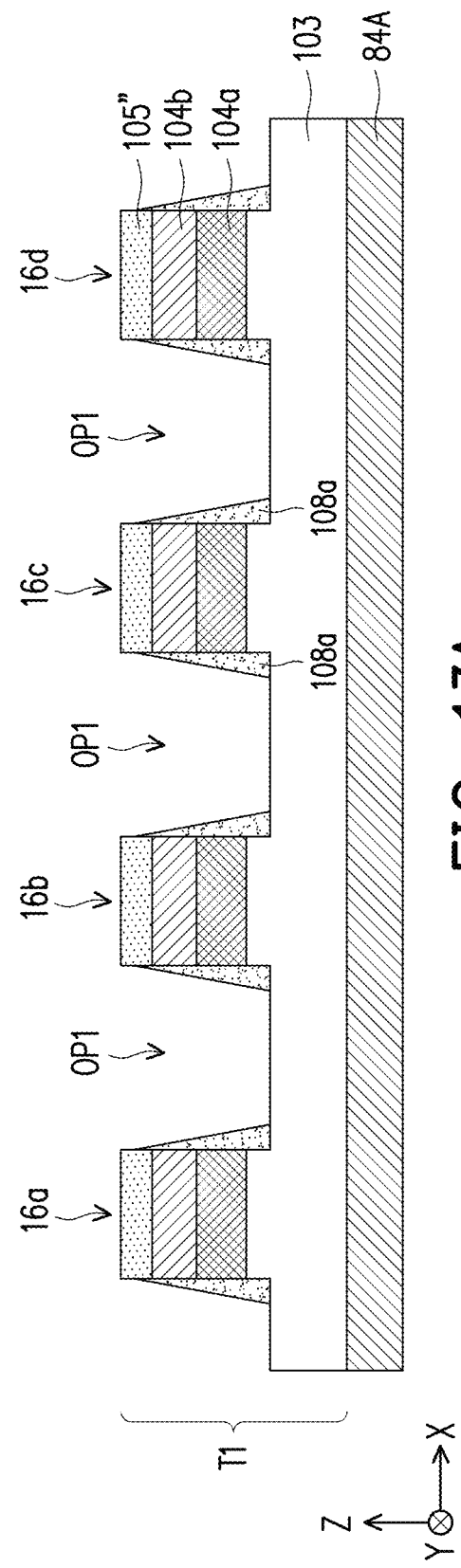

MEMORY ARRAY, INTEGRATED CIRCUIT INCLUDING THE SAME, AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 to FIG. 36D are schematic views of structures formed during a manufacturing method of the semiconductor device according to some embodiments.

DETAILED DESCRIPTION

Figure 1A:
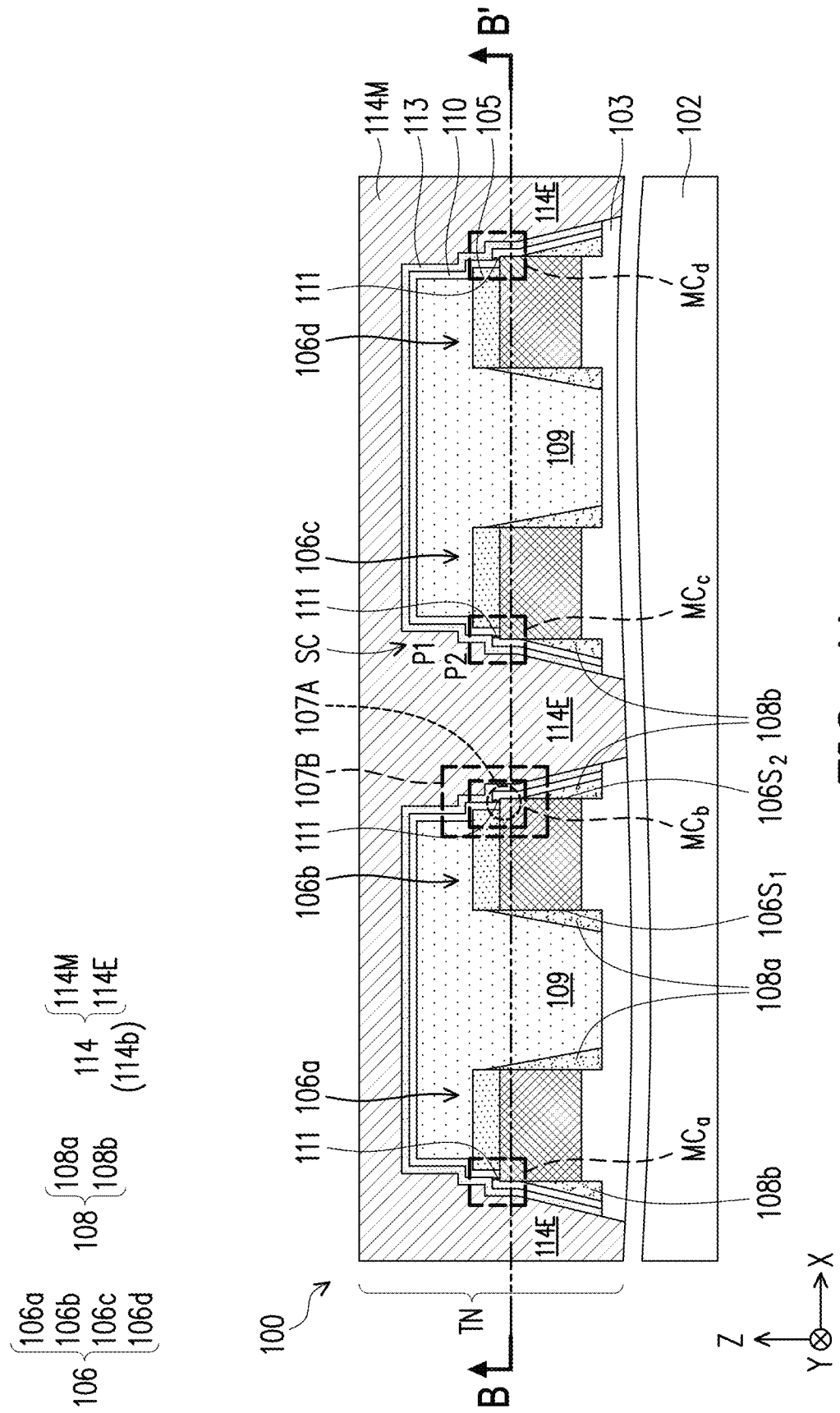
FIG. 1A to FIG. 1C are schematic various view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are configured to store data by switching between a high resistive state corresponding to a first data state (e.g., a "0") and a low resistive state corresponding to a second data state (e.g., a "1"). To enable such 'resistive switching,' RRAM devices have a lower electrode that is separated from an upper electrode by a data storage structure having a variable resistance. For example, a resistance of a data storage structure may be determined by the presence of a conductive filament comprising a plurality of oxygen vacancies within the data storage structure. If a conductive filament is not present, the data storage structure has a relatively high resistance associated with the first data state. If a conductive filament is present, the data storage structure has a relatively low resistance associated with the second data state. To change between data states, one or more applied bias voltages may move oxygen vacancies into or out of a data storage structure to form or break a conductive filament.

RRAM devices are typically arranged within an array in rows and/or columns. The array is coupled to control circuitry by way of a plurality of bit lines and a plurality of word lines. The plurality of bit lines may be disposed in bit line stacks, which comprise multiple bit lines stacked onto one another. The bit line stacks are arranged at a periodic and substantially even spacing over a substrate. The bit line stacks can be covered by a data storage structure that extends along opposing sides and an upper surface of the bit line stacks to define RRAM devices along sides of the bit lines. A selector is disposed over the data storage structure and a word line is disposed over the selector, such that the word line is separated from opposing sides of a bit line stack by the both the data storage structure and the selector. The selector is configured to control access to the RRAM devices by controlling a flow of current between the word line and a bit line.

During operation of such a memory array, data may be stored in the RRAM devices by applying a potential difference between a word line and a bit line to form a conductive filament between the word line and bit line. However, it has been appreciated that because the word line is disposed along opposing sides of a bit line, conductive filaments may form within the data storage structure along one or both sides of the bit line. Because the conductive filaments may form within the data storage structure along one or both sides of a bit line, variations in the number, size, and/or locations of conductive filaments can arise between different RRAM devices. This may lead to variations of electrical resistance in different RRAM devices. The variations of electrical resistance can degrade a read window of the RRAM devices within the memory array, thereby negatively impacting performance of the memory array.

The present disclosure, in some embodiments, relates to an integrated circuit (e.g., an integrated chip) comprising a memory array having a plurality of bit line stacks having staircase structures. Each bit line stack comprises a bit line and a hard mask layer on the bit line, and a top corner of a single side of the bit line is exposed.

A data storage structure is disposed over the plurality of bit line stacks and is in contact with the exposed top corner of the bit line, a selector is disposed over the data storage structure, and a word line is disposed over the selector. Because the data storage structure is constrained to be in contact with the top corners of the bit line and the word line has a protrusion part, and a bottom corner of protrusion part of the word line is separated from the top corners of the bit line by a small distance, a conductive filament will be consistently formed between the bottom corner of a protrusion part of the word line and the top corners of the bit line and variations in a number, size, and/or location of conductive filaments between different bit lines can be reduced, thereby improving performance of an RRAM device within a memory array.

Figure 1B:
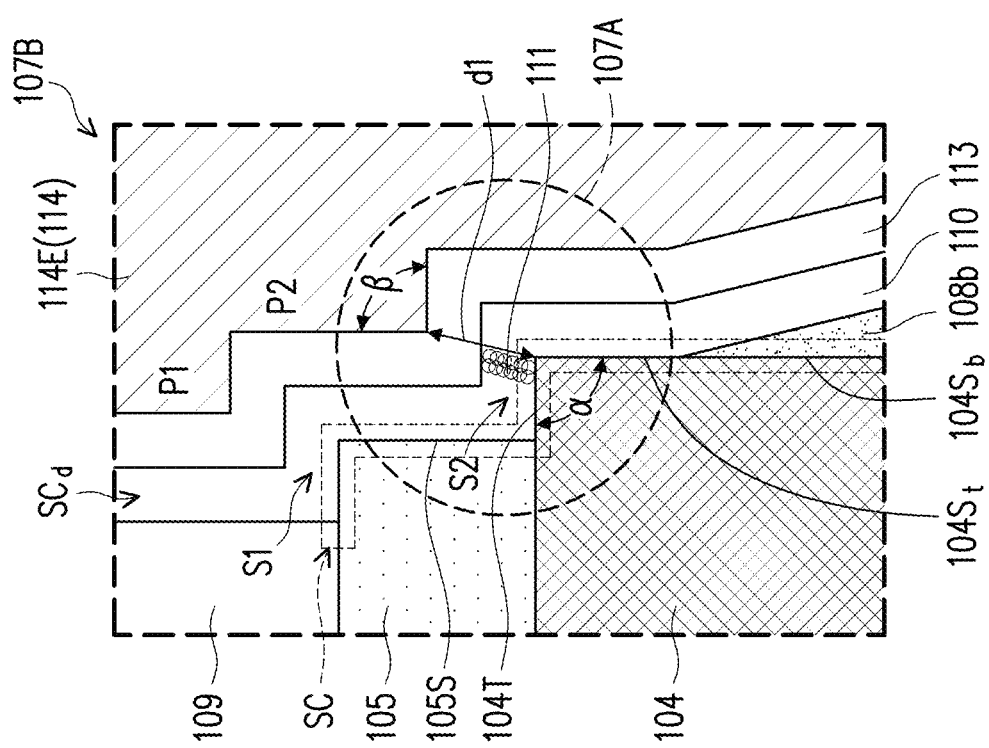
Figure 1C:
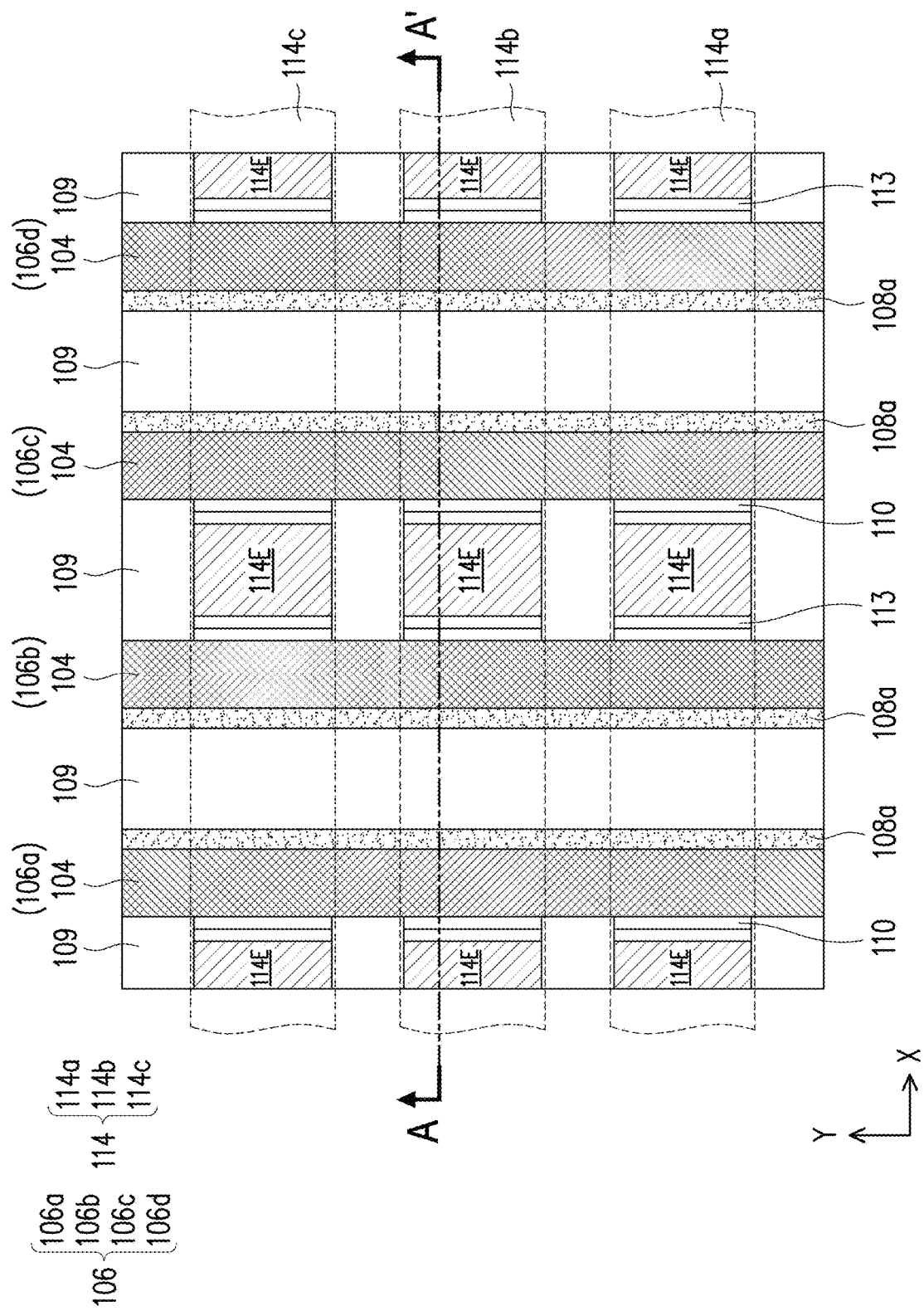

FIG. 1A to FIG. 1C illustrate some embodiments of an integrated circuit (e.g., an integrated chip) 100 having a memory array TN, and the memory array TN comprises a plurality of bit line stacks having staircase structure. The structure of FIG. 1A is taken in an XZ plane, and the structure of FIG. 1C is taken in an XY plane, where the directions X, Y, and Z define a set of orthogonal Cartesian coordinates. FIG. 1A illustrates a cross-sectional view of the integrated circuit along line A-A' of a top-view of the integrated circuit shown in FIG. 1C. FIG. 1C illustrates the top-view of the integrated circuit along line B-B' of the cross-sectional view of the integrated circuit shown in FIG. 1A. FIG. 1B illustrates an enlarged schematic diagram of an area 107B in FIG. 1A.

As shown in the cross-sectional view of FIG. 1A, the memory array TN of the integrated circuit 100 comprises a plurality of bit line stacks 106a, 106b, 106c, and 106d disposed over a substrate 102. The plurality of bit line stacks 106a, 106b, 106c, and 106d are laterally separated from one another. In some embodiments, the plurality of bit line stacks 106a, 106b, 106c, and 106d may be vertically separated from the substrate 102 by way of a dielectric layer 103. The bit line stacks 106a, 106b, 106c, and 106d may be referred to as a first bit line stack 106a, a second bit line stack 106b, a third bit line stack 106c, and a fourth bit line stack 106d. The bit line stacks 106a, 106b, 106c, and 106d may be collectively referred to as bit line stacks 106.

As shown in top-view of FIG. 1C, the plurality of bit line stacks 106a-106b extend over the substrate 102 along the Y direction and are laterally separated from one another along the X direction that is perpendicular to the Y direction. As shown in the cross-sectional view of FIG. 1A, the plurality of bit line stacks 106a-106b may respectively comprise a bit line 104 and a hard mask layer 105 on the bit line 104.

Referring to FIGS. 1A and 1C, the memory array TN further comprises spacers 108, a dielectric layer 109, and a plurality of word lines 114. The spacers 108 are disposed on sidewalls of the bit line stacks 106. The dielectric layer 109 is disposed over and a space between the bit line stacks 106a and 106b, and over and a space between the bit line stacks 106c and 106d. The selectors 113 are disposed over the dielectric layer 109, the bit line stacks 106a-106d, and the spacers 108. The word lines 114 comprises word lines 114a, 114b, and 114c. The plurality of word lines 114a, 114b, and 114c are laterally separated from one another. The plurality of word lines 114a, 114b, and 114c are disposed over the selectors 113.

Referring to FIG. 1A, during operation, voltages may be applied to bit lines 104 within the plurality of bit line stacks 106a-106d and/or to the word line 114. The voltages form a potential difference across the selector 113 and the data storage structure 110. If the potential difference between the word line 114 and a bit line is sufficiently large, the selector 113 may be configured to allow a current to flow across the data storage structure 110 at a location between the word line 114 and the bit line 104. The current may be used to read data from the data storage structure 110 or to write data to the data storage structure 110.

In some embodiments, the bit-line stack 106 has an asymmetric architecture. The opposite sidewalls 106S$_1$ and 106S$_2$ of the bit-line stack 106 have different contours. The sidewall 106S$_1$ of the bit-line stack 106 is covered by the dielectric layer 109, and the sidewall 106S$_1$ of the bit-line stack 106 is exposed by the dielectric layer 109. The sidewall 106S$_1$ may also be referred to as an inner sidewall, and the sidewall 106S$_2$ may also be referred to as an outer sidewall. The bit line 104 of the bit-line stack 106 is partially covered by the hard mask layer 105, and a portion of a top surface 104T of the bit line 104 near the edge thereof is exposed. In some embodiments, the sidewall 106S$_2$ of the bit-line stack 106 has a staircase structure SC, and the sidewall 106S$_1$ of the bit-line stack 106 does not have a staircase structure.

Referring to FIG. 1A and FIG. 1B, the spacers 108 include spacers 108a and 108b, which are respectively disposed on the sidewalls 106S$_1$ and 106S$_2$ of the bit-line stack 106. In some embodiments, the spacers 108a and 108b have an asymmetric architecture. The spacer 108a and 108b have different heights, and the height of the spacer 108b is lower than the height of the spacer 108a. The spacer 108a covers the sidewalls of the hard mask layer 105 and the bit line 104. The spacer 108b covers the sidewall of bit line 104, but exposes the sidewall 105S of hard mask layer 105. In some embodiments, the spacer 108b covers the lower sidewall 104S$_b$ of the bit line 104, and exposes the upper sidewall 104S$_t$ of the bit line 104. Therefore, the top surface 104T, a top corner α, and the upper sidewall 104St of the bit line 104 in the area 107A are exposed by the hard mask layer 105 and the spacer 108b.

Referring to FIG. 1A and FIG. 1B, the data storage structure 110 is disposed on top surfaces and sidewalls of the dielectric layer 109 and the hard mask layer 105 of the bit-line stacks 106, and continuously extends to the sidewall of the spacer 108b. The data storage structure 110 is in physical contact with the top corner α of the bit-line 104. In some embodiments, the data storage structure 110 is a conformal layer and has a staircase structure SC$_d$. For example, the staircase structure SC$_d$ of the data storage structure 110 comprises a first step S1 and a second step S2. The first step S1 is above the second step S2. The first step S1 is located on the top surface of the hard mask layer 105, and the second step S2 is located on the top surface 104T of the bit line 104. The staircase structure SC$_d$ may include more or fewer steps.

Referring to FIG. 1A, in some embodiments, a space between the first bit-line stack 106a and the second bit-line stack 106b is filled with the dielectric layer 109 and the spacer 108a, and a space between the second bit-line stack 106b and the third bit-line stack 106c is filled with the spacer 108b, the data storage structure 110, the selector 113, and a portion 114E of the word line 114, as shown in FIG. 1A.

In some embodiments, the word line 114 comprises a body part 114M. The body part 114M comprises one or more lower surfaces that are completely vertically over and that continuously extend laterally past the top surface of the bit-line stack 106a-106d. The word line 114 further comprises the portion (or referred to as an extension) 114E. The extension 114E extends outwardly from one or more lower surfaces to directly between sides of the second bit-line stack 106b and the third bit-line stack 106c. In such an embodiment, the word line 114 separates the second bit-line stack 106b from the third bit-line stack 106c by the extension 114E without separating the second bit-line stack 106b from the first bit-line stack 106b. The extension 114E of the word line 114 may be connected to the underlying conductive layer or element.

As shown in FIG. 1A and FIG. 1B, the extension 114E of the word line 114 disposed between the second bit-line stack 106b and the third bit-line stack 106c has a T-shape. In some embodiments, the extension 114E further has the protrusions P1 and P2 extending along the X direction, so that the extension 114E has an inversed staircase shape. The protrusion P1 extends toward the dielectric layer 109 along the X direction. The protrusion P2 extends toward the dielectric layer 109 and the hard mask layer 105 along the X direction. In some embodiments, a height of the bottom surface of the protrusion P2 is between the top surface and a bottom surface of the hard mask layer 105. The protrusion P2 has a bottom corner β. The bottom corner β of the protrusion P2 is opposite to the top corner α of the bit line 104, and bottom corner β having a base angle range between 87 degrees and 93 degrees. Moreover, compared to the bit line 104 outside the area 107A, the bit line 104 in the area 107A is closer to the bottom corner 3 of the protrusion P2 of the word line 114. The distance d1 between the bit line 104 and the protrusion P2 of the word line 114 in the area 107A is smaller than the distance between the bit line 104 and the protrusion P2 of the word line 114 outside the area 107A.

Referring to FIG. 1B, because the word line 114 has the protrusion P2, and the bottom corner β of the protrusion P2 is opposite to the top corner α of the bit line 104, and the distance d1 is small, when voltage is applied to the bit line 104 and the word line 114, the top corner α of the bit line 104 and the bottom corner β of the word line 114 have a strong electric field, so a conductive filament 111 may be selectively formed in the data storage structure 110 directly between the bit line 104 and the word line 114 in the area 107A. The conductive filament 111 will not be formed in the data storage structure 110 between the bit line 104 and the word line 114 other than the area 107A. In some embodiments, the conductive filament 111 is formed directly between the top corner α of the bit line 104 and the bottom corner β of the word line 114. In alternative embodiments, the conductive filament 111 is formed around the second step S2 of the data storage structure 110, but is not limited thereto.

In such embodiments, the data storage structures 110 directly between the second bit-line stack 106b and the third bit-line stack 106c are configured to define a plurality of memory cells to store data states (e.g., conductive filaments 111 may be selectively formed between the second bit-line stack 106b and the third bitline stack 106c), while the data storage structure 110 directly over the dielectric layer 109 between the first bit-line stack 106a and the second bit-line stack 106b, or between the first bit-line stack 106c and the second bit-line stack 106d is not configured to store a data state (e.g., no conductive filaments may be formed between the first bit-line stack 106a and the second bit-line stack 106b, or between the first bit-line stack 106c and the second bit-line stack 106d).

Referring to FIG. 1A, the data storage structures 110 define a plurality of memory cells, for example RRAM cells, $MC_a$-$MC_d$, which are configured to respectively store a data state along a single side of the bit-line 104 that is closest to a corresponding word line 114b. For example, the data storage structure 110 between the bit-line 104 of the first bit-line stack 106a and the word-line 114b defines a first memory cell MCa configured to store a first data state, the data storage structure 110 between the bit-line 104 of the second bit-line stack 106b and the word-line 114b defines a second memory cell MCb configured to store a second data state, etc.

By consistently forming a conductive filament 111 along a single side of a plurality of bit-lines stacks 106a-106d, variations in a number, size, and/or location of conductive filaments between different bit-lines may be reduced, thereby improving performance of RRAM devices within the memory array.

Figure 5:
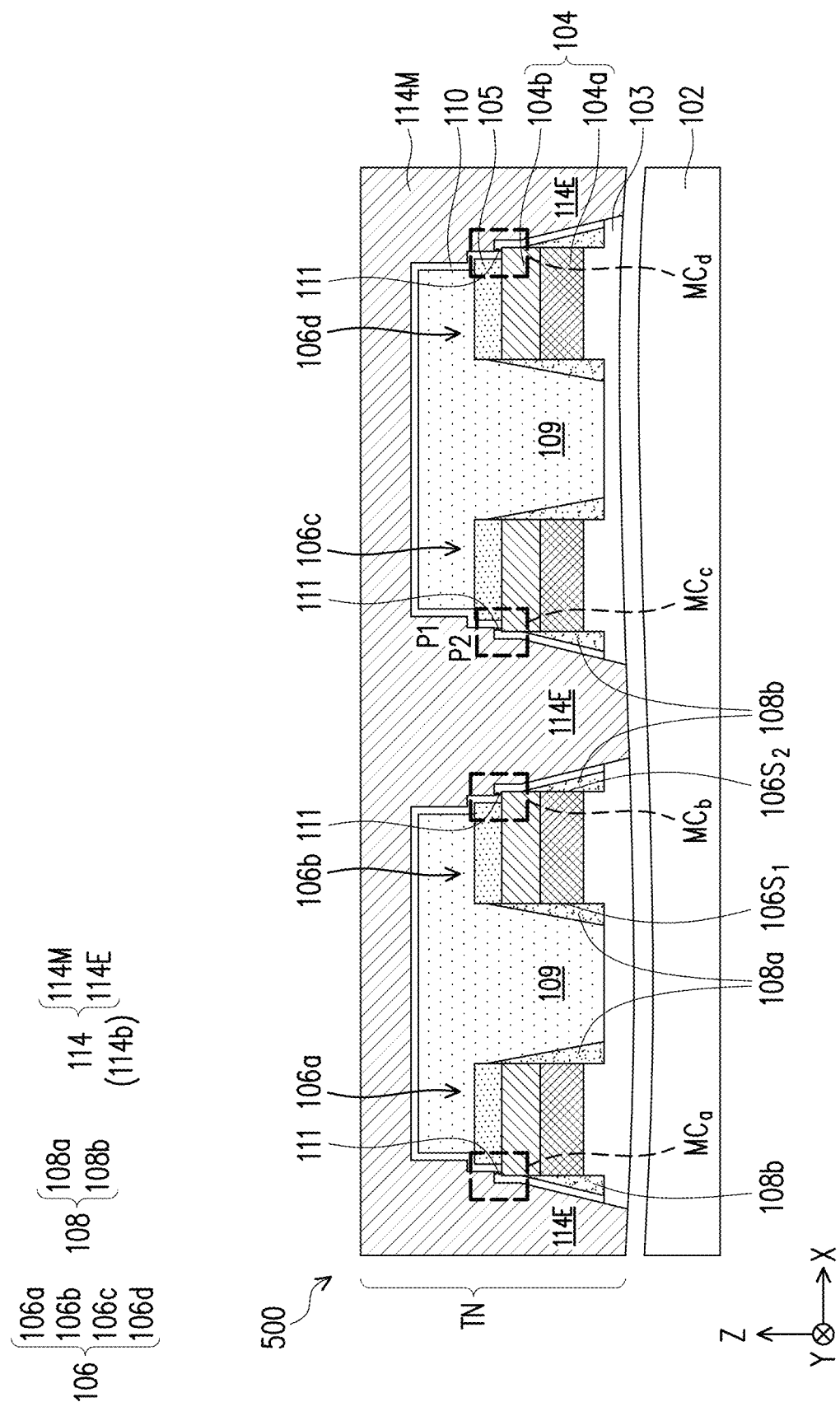
Figure 6:
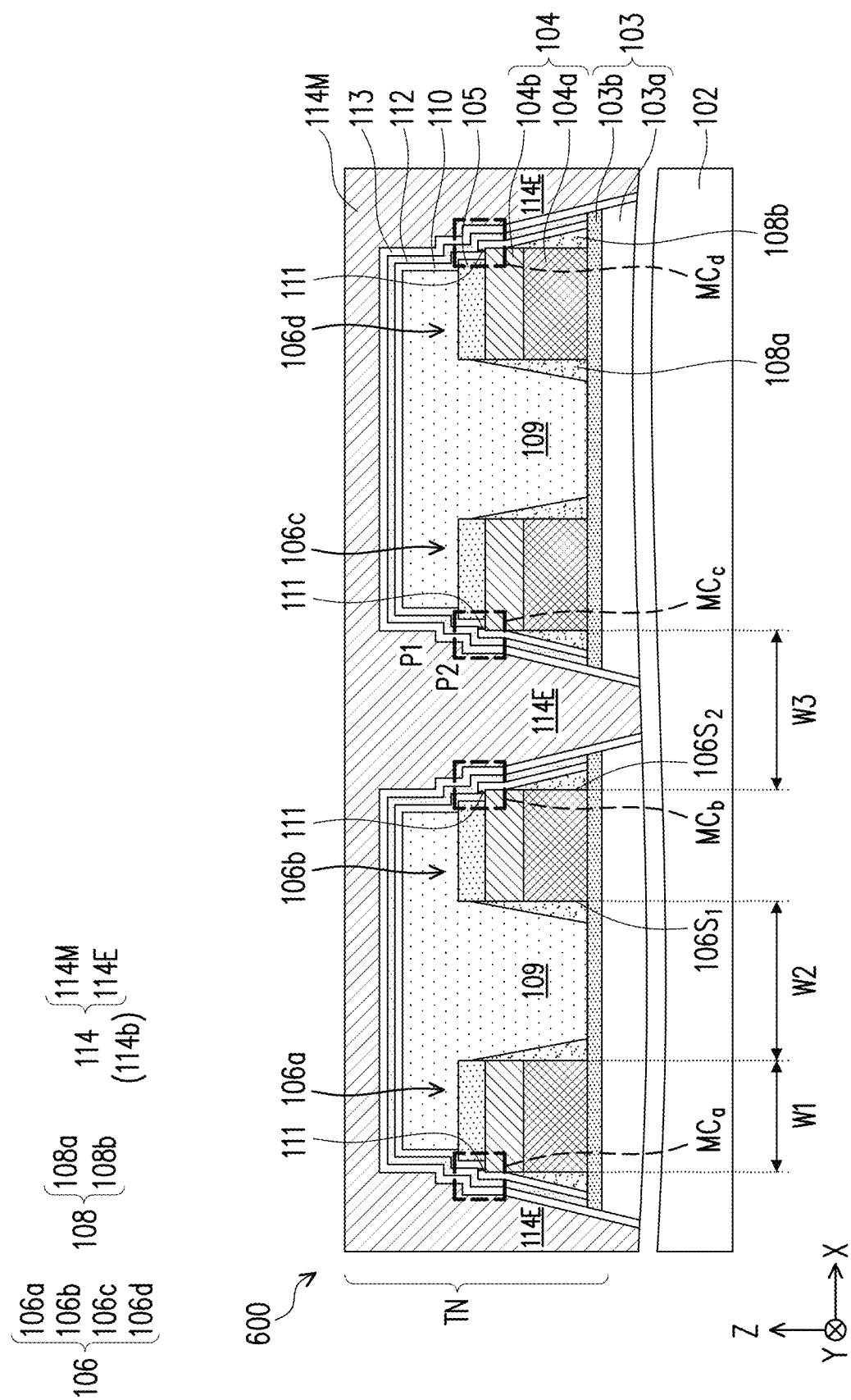
Figure 7A:
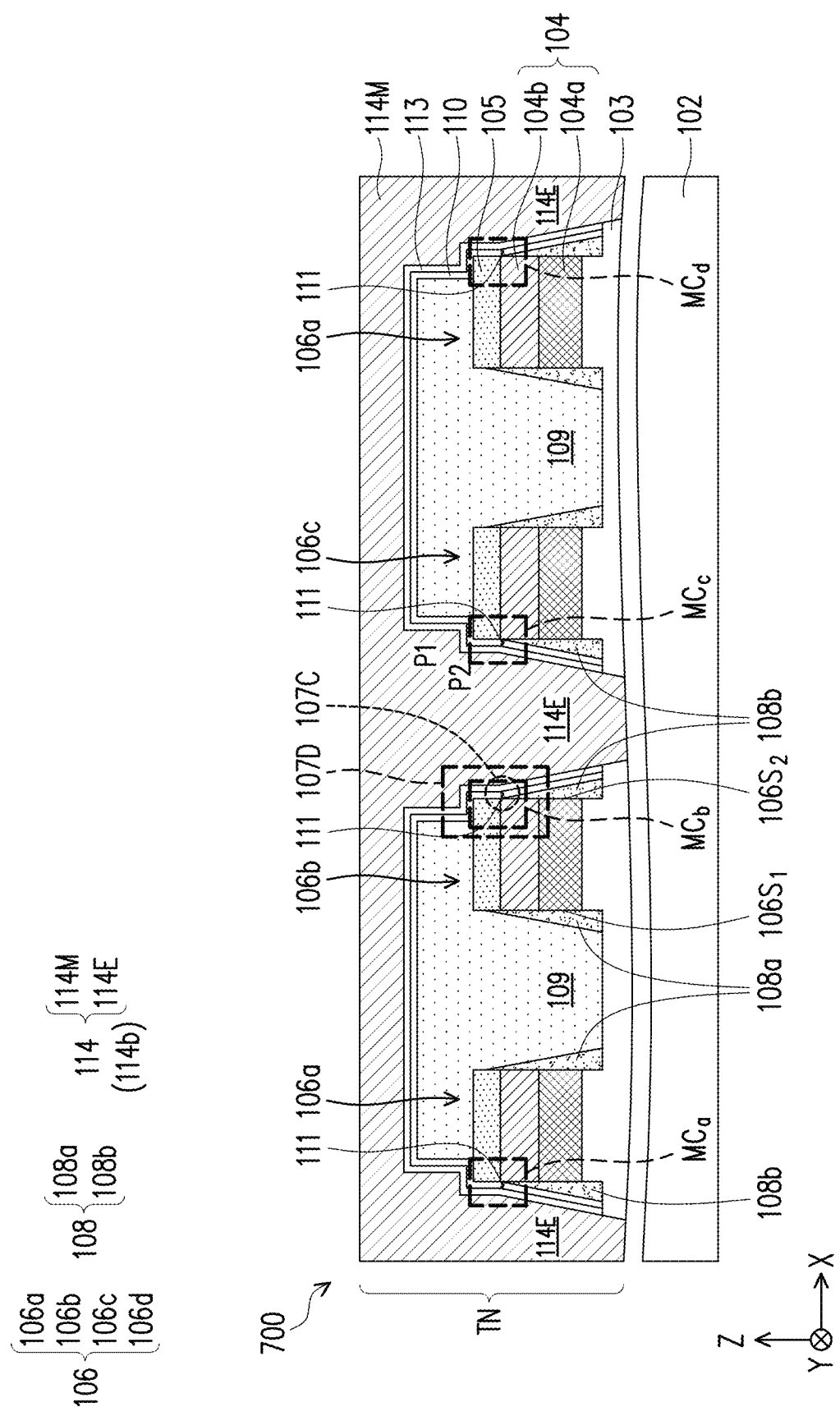
Figure 7B:
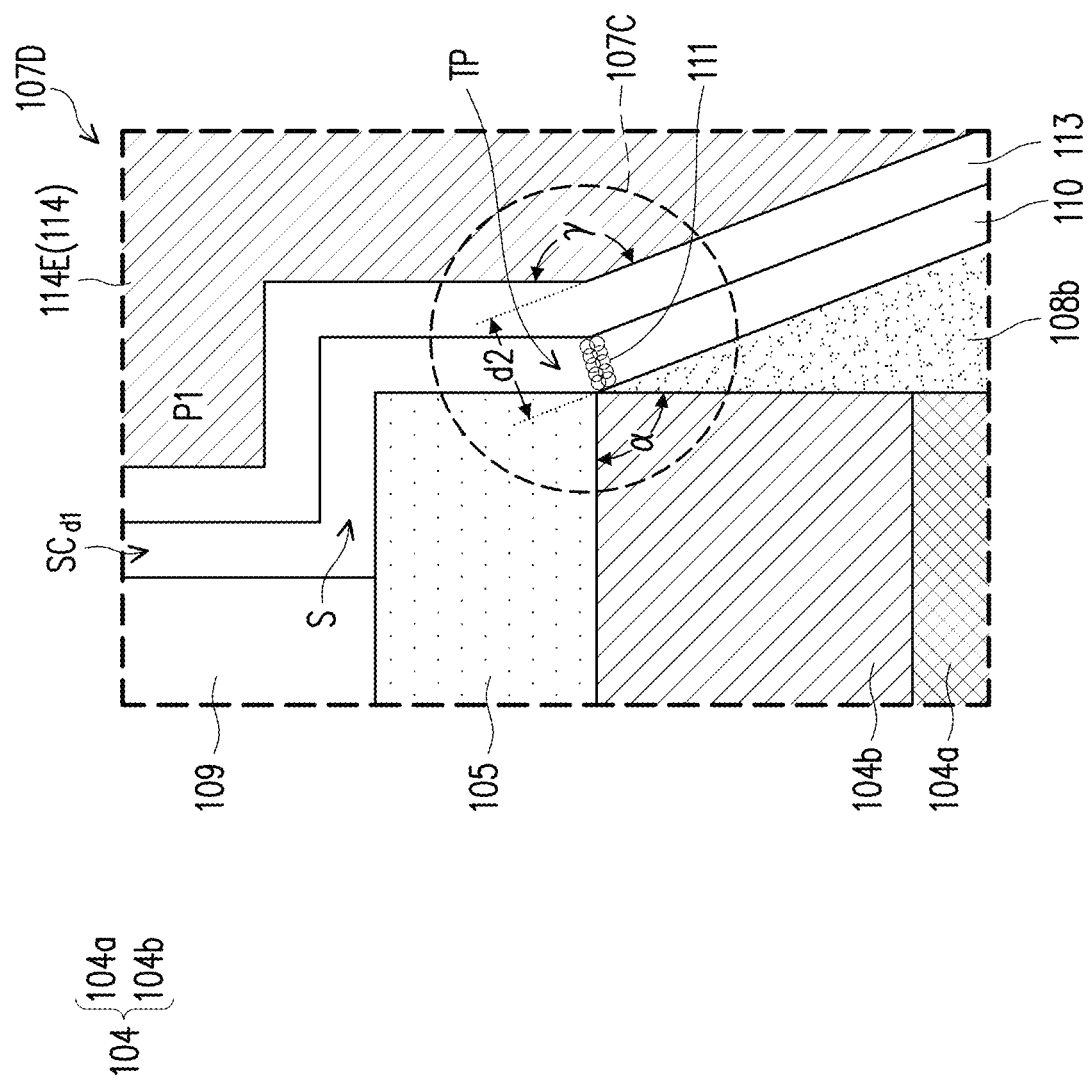

FIG. 2 to FIG. 7B show various views of integrated circuits having memory arrays in according to some additional embodiments. Each structure of FIG. 2 to FIG. 7A is taken in an XZ plane. FIG. 7B illustrates an enlarged schematic diagram of an area 107D in FIG. 7A. Each memory array comprises a plurality of bit-line stacks, and each bit-line stacks having a staircase structure. In the description below of FIG. 2 to FIG. 7B, identical reference numerals between different embodiments indicate that the descriptions provided above for the corresponding elements equally apply to the embodiments being described.

The bit-line stacks 106a-106d respectively include a bit line 104 and a hard mask layer 105 stacked on the bit line 104. In some embodiments, the hard mask layer 105 may include oxide (for example, aluminum oxide), nitride (for example, silicon nitride), carbide (for example, silicon carbide), or the like. In some embodiments, the hard mask layer 105 comprises a low dielectric constant dielectric material with a dielectric constant lower than 4. In some embodiments, the bit line 104 may include tungsten, aluminum, copper, ruthenium, doped polysilicon titanium nitride, tantalum nitride, or the like. In some embodiments, the bit line 104 is a single layer, as shown in FIG. 1A. In other embodiments, the bit line 104 has multiple layers, such as double layers, as shown in FIG. 2.

Figure 2:
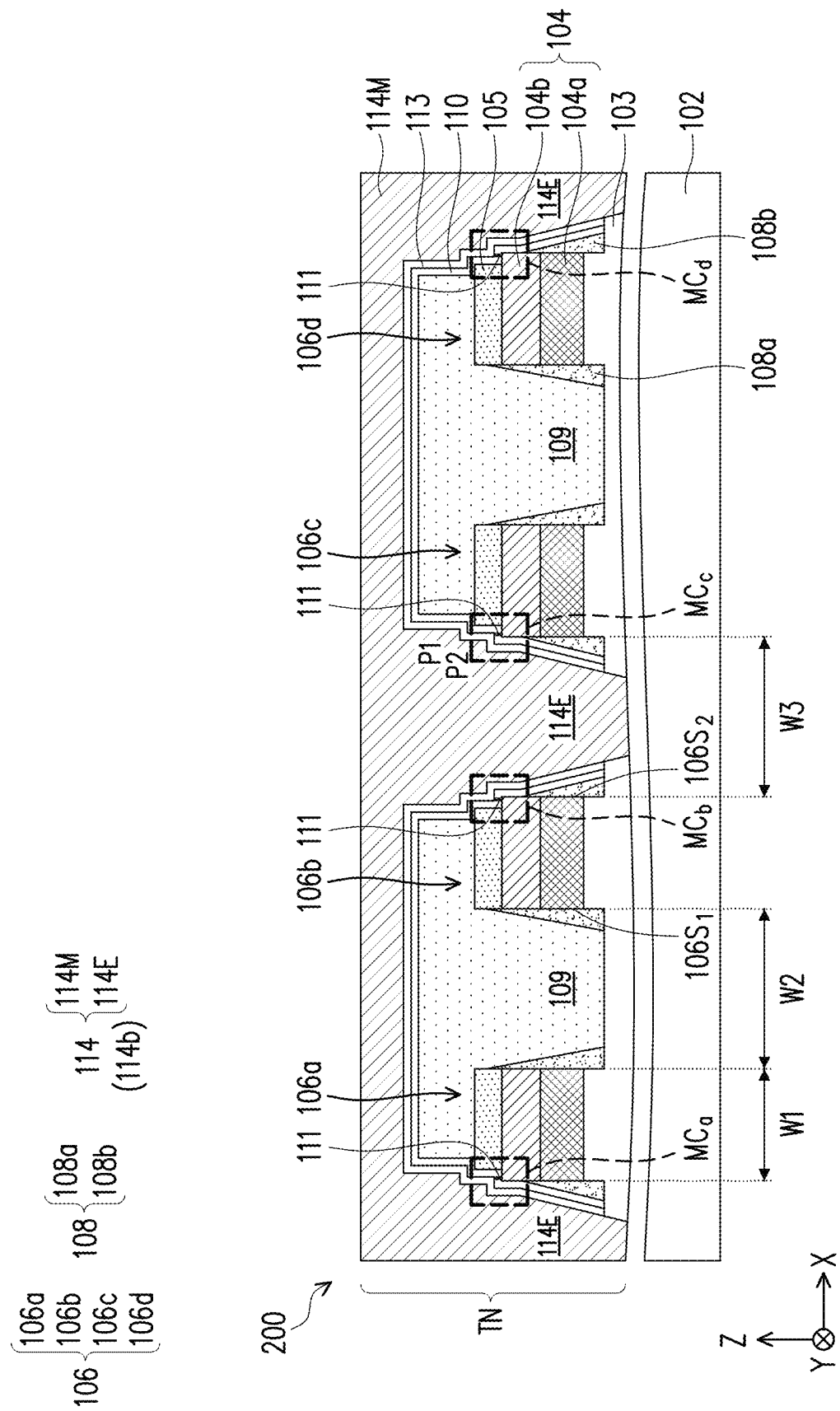
FIG. 2 to FIG. 7B show various views of integrated circuits having memory arrays in according to some additional embodiments.

Referring to FIG. 2, in an integrated circuit 200, bit lines 104 of a plurality of bit-line stacks 106 include conductive layers 104a and 104b. The conductive layer 104a is disposed on the dielectric layer 103. The conductive layer 104b is disposed between the conductive layer 104a and the hard mask layer 105, and a top corner α of conductive layer 104b is in contact with the data storage structure 110. The resistance of the conductive layer 104a is lower than the resistance of the conductive layer 104b, so as to reduce the resistance of the bit line 104. The conductive layer 104b is suitable as a material of the electrode. The material of the conductive layer 104a comprises aluminum, copper, doped polysilicon or the like. The material of the conductive layer 104b comprises ruthenium, titanium nitride or the like. The thickness of the conductive layer 104a may be less than, equal to, or greater than the thickness of the conductive layer 104b. The thickness of the conductive layer 104a may be greater than the thickness of the conductive layer 104b (as shown in FIG. 6) to reduce the resistance of the current path.

Figure 3:
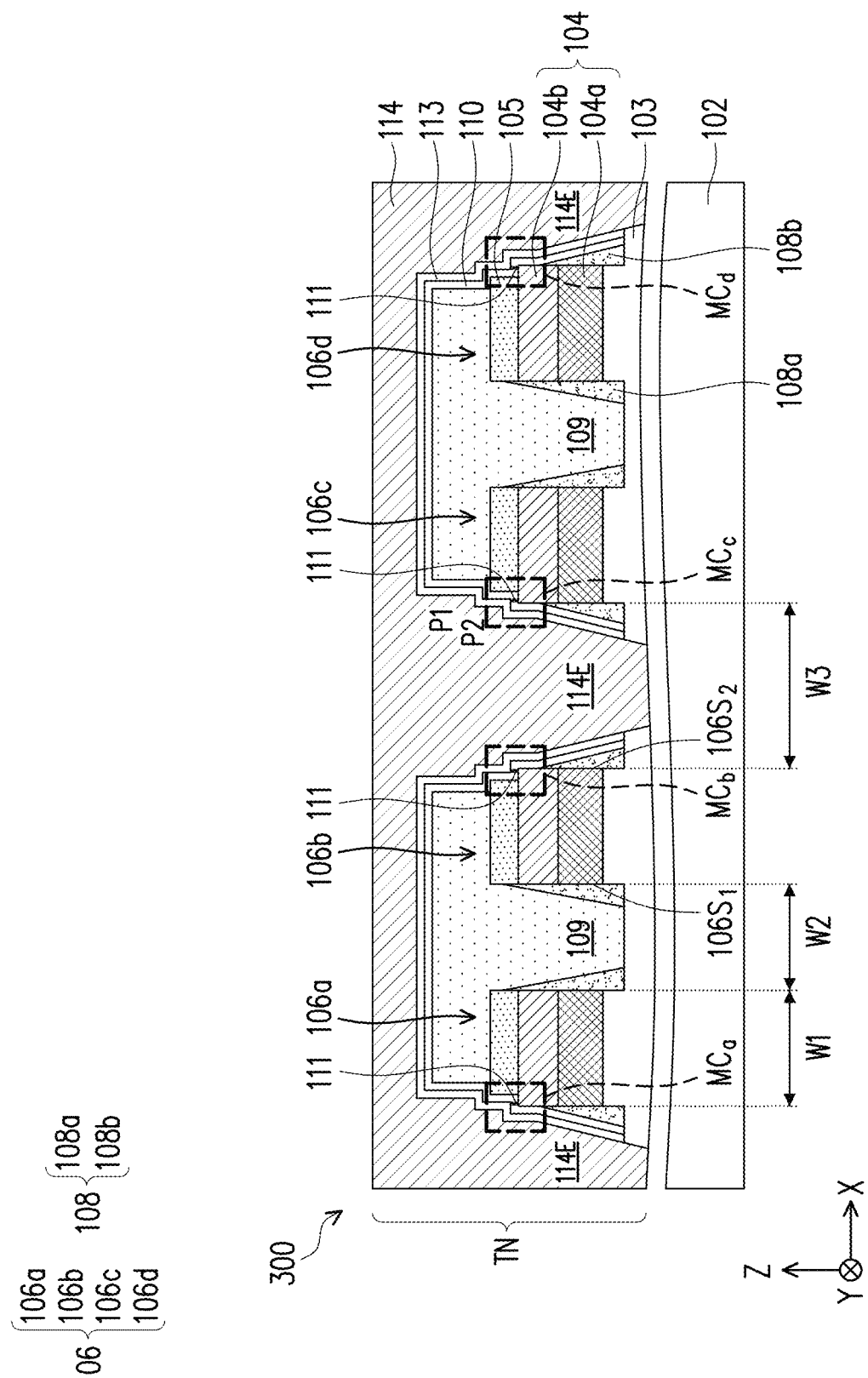

In some embodiments, the plurality of bit-line stacks 106a-106d may each have a width W1. In some embodiments, the width W1 may be in a range of between approximately 5 nm and approximately 25 nm. In other embodiments, the asymmetric architecture of plurality of bit-line stacks 106a-106d (to be described in detail later) allows plurality of bit-line stacks 106a-106d to be formed a high density (e.g., a density that is higher than that achievable by constant pitch bit-line stacks) as shown in FIG. 3. In other embodiments, the width W1 may be in a range between approximately 10 nm and approximately 30 nm. In some such embodiments, the asymmetric architecture of multiple bit-line stacks 106a-106d may form multiple bit-line stacks 106a-106d with a larger width, so that the plurality of bit-line stacks 106a-106d to be formed at a greater width, so that the parasitic resistance of the plurality of bit-line stacks 106a-106d may be relatively low (e.g., lower than that achievable by constant pitch bit-line stacks) and a performance of an RRAM array can be improved. In yet other embodiments, the width W1 may have values that are greater than 30 nm or less than 5 nm.

Referring to FIG. 2, in some embodiments, the plurality of bit-line stacks 106a-106d may include a first bit-line stack 106a, a second bit-line stack 106b, a third bit-line stack 106c, and a fourth bit-line stack 106d. The second bit-line stack 106b has sidewalls $106S_1$ and $106S_2$. The sidewall $106S_1$ of the second bit-line stack 106b is separated from the first bit-line stack 106a by a distance W2. The sidewall $106S_2$ of the second bit-line stack 106b is separated from the third bit-line stack 106c by a distance W3. The distance W3 is equal to the distance W2, as shown in FIG. 2. In some embodiments, the distance W2 and the distance W3 may be between approximately 25 nm and approximately 50 nm, approximately 15 nm and approximately 40 nm, approximately 5 nm and approximately 25 nm. Within the range or other suitable values.

Referring to FIG. 3, in other embodiments, a memory array TN of an integrated circuit 300 comprises a plurality of bit line stacks 106a, 106b, 106c, and 106d. The sidewall $106S_1$ of the second bit-line stack 106b is separated from the first bit-line stack 106a by a distance W2. The sidewall $106S_2$ of the second bit-line stack 106b is separated from the third bit-line stack 106c by a distance W3. The distance W3 is greater than the distance W2. In some embodiments, the distance W2 is between approximately 200% and approximately 400% of the width W1. In some embodiments, the distance W3 is between approximately 150% and approximately 200% of the distance W2. In other embodiments, the distance W3 may be greater than 150% of the distance W2 or less than 200% of the distance W2. In some embodiments, the distance W2 may be in a range between approximately 20 nm and approximately 40 nm, approximately 10 nm and approximately 30 nm, approximately 5 nm and approximately 20 nm, or other suitable values. In some embodiments, the distance W3 may be in a range between approximately 40 nm and approximately 60 nm, between approximately 30 nm and approximately 50 nm, and between approximately 25 nm and approximately 40 nm, or other suitable values.

In some embodiments, the word lines 114a-114c extend from above the first bit-line stack 106a to the fourth bit-line stack 106d, and are directly located in a space between the second bit-line stack 106b and the third bit-line stack 106c, but not in a space between the first bit-line stack 106a and the second bit-line stack 106b, and not in a space between the third bit-line stack 106c and the fourth bit-line stack 106d.

In various embodiments, the plurality of word lines 114 (i.e., 114a-114c) may include doped polysilicon or metal such as tungsten (W), cobalt (Co), nickel (Ni), copper (Cu), aluminum (Al), titanium (Ti), tantalum (Ta), alloys thereof, silicides thereof, or a combination thereof. In some embodiments, the word lines 114 are a single layer, as shown in FIG. 1A to FIG. 7A. In other embodiments, the word lines 114 are multiple layers, such as double layers (not shown). For example, the word line 114 of the integrated circuit comprises a barrier layer and a conductive layer on the barrier layer (not shown). The barrier layer comprises metal, metal nitride, or a combination thereof, such as titanium, tantalum, titanium nitride, tantalum nitride, or a combination thereof. The conductive layer comprises doped polysilicon or metal (such as aluminum, titanium, tungsten, cobalt) or the like.

In some embodiments, the data storage structure 110 comprises a high-k dielectric layer. For example, the data storage structure 110 may comprise hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. In other embodiments, the data storage structure 110 may comprise a phase change memory layer comprising a chalcogenide material such as GST (e.g., $Ge_2Sb_2Te_5$), N-doped GST, Si doped GST, InGeSbTe, doped arsenic (As), doped carbon (C) or the like. In yet other embodiments, the data storage structure 110 may comprise a magnetic tunnel junction, a ferroelectric material, or the like. In various embodiments, the data storage structure 110 may have a thickness that is between approximately 5 nm and approximately 10 nm, between approximately 10 nm and approximately 20 nm, between approximately 20 nm and approximately 40 nm, or other suitable values.

In some embodiments, the selector 113 comprises one or more materials that are configured to have an electrical response that is similar to a diode (e.g., PN diode, PiN diode, Schottky diode, oxide semiconductor-oxide diode, or the like). In such embodiments, the selector 113 has a threshold voltage that, if exceeded, allows current to flow through the selector 113, while if an applied voltage is less than the threshold voltage the selectors 113 block current from flowing. Because the selector 113 is configured to selectively block current from flowing through an RRAM device, the selector 113 is configured to selectively provide access to an RRAM device, in contrast to 1T1R or 1T2R architecture that utilize a transistor to selectively provide access to an RRAM device. The selector 113 may be configured to form 1S1R or 1T1S1R architecture, and may be used to form an embedded stand-alone memory in some embodiments.

In some embodiments, the selector 113 comprises a threshold type selector (e.g., an ovonic threshold switch (OTS)). In some such embodiments, the selector 113 comprises a binary material (e.g., SiTe, GeTe, CTe, BTe, ZnTe, AlTe, or the like), a ternary material (e.g., GeSeAs, GeSeSb, GeSbTe, GeSiAs, or the like), and/or a quaternary material (e.g., GeSeAsTe, GeSeTeSi, GeSeTeAs, or the like). In other embodiments, the selector 113 comprises a voltage conductive bridge (VCB) selector. In some such embodiments, the selector 113 comprises a layer of Ag and $HfO_2$, layers of Cu and $HfO_2$, layers of Al and $SiO_2$, layers of Ag and $TaO_2$, or the like. In other embodiments, the selector 113 comprises an exponential type selector comprising $TiO_2$, $Ta_2O_5$, NiO layers of TiN and Si, or the like. In some embodiments, the selector 113 comprises a threshold type selector and an overlying exponential type selector stacked onto one another. In yet other embodiments, the selector 113 comprises a filament based selector, rectifier, varistor-type selector, doped-chalcogenide-based selector, Mott effect based selector, mixed-ionic-electronic-conductive (MIEC)-based selector, field-assisted-superliner-threshold (FAST) selector, a voltage conductive bridge (VCB) selector, an exponential type selector, or the like. In various embodiments, the selector 113 has a thickness that is between approximately 10 nm and approximately 20 nm, between approximately 20 nm and approximately 40 nm, or other suitable values.

Figure 4:
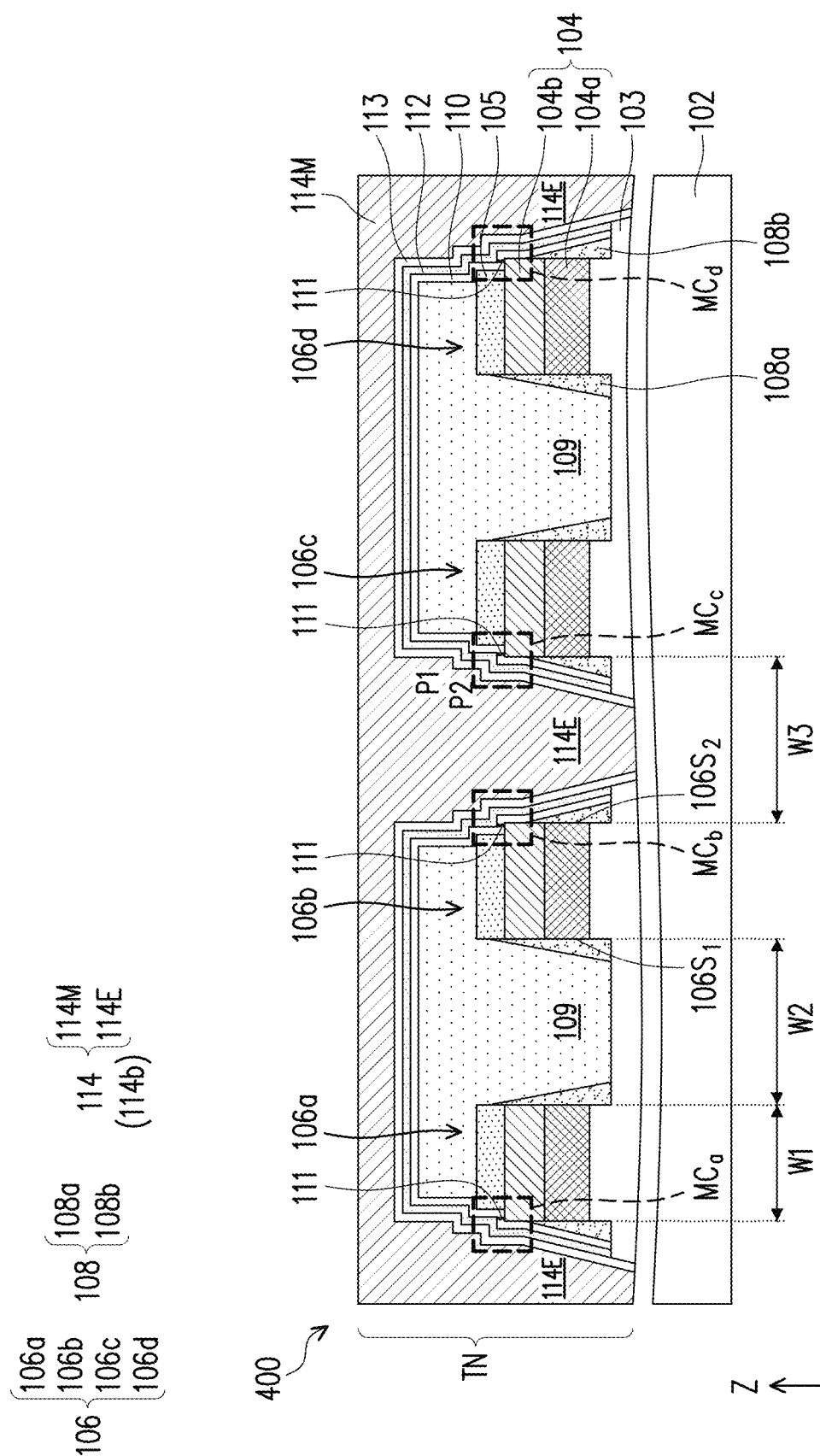

Referring to FIG. 4, in some embodiments, a memory array TN of an integrated circuit 400 further include an interlayer 112. The interlayer 112 may be disposed between a selector 113 and a data storage structure 110 to increase the adhesion therebetween. In some embodiments, the interlayer 112 is, for example, a metal material. The metal material of the interlayer 112 may include a metal material of the same one or more metal atoms as the selector 113.

For example, the selector 113 includes a binary material (for example, SiTe, GeTe, CTe, BTe, ZnTe, AlTe or the like), and the interlayer 112 may include Te. For example, the selector 113 includes a ternary material (for example, GeSeAs, GeSeSb, GeSbTe, GeSiAs, or the like), and the interlayer 112 may include Ge. For example, the selector 113 includes a quaternary material (for example, GeSeAsTe, GeSeTeSi, GeSeTeAs or the like), and the interlayer 112 may include Ge, Se, or Ge and Se.

Referring to FIG. 5, in other embodiments, an integrated circuit 500 does not include a selector between a word line 114 and a data storage structure 110. The data storage structure 110 is sandwiched between and is in physical contact with the bit-line stack 106 and word line 114. During operation, voltage may be applied to the bit line 104 when the bit-line stack 106 and/or to the word line 114. The voltage forms a potential difference across the data storage structure 110. If the potential difference between the word line 114 and the bit line 104 is sufficiently large, current can be allowed to flow across the data storage structure 110 at the location between the word line 114 and the bit line 104. The current can be used to read data from the data storage structure 110 or write data to the data storage structure 110.

FIG. 6, in some embodiments, a dielectric layer 103 of an integrated circuit 600 includes a dielectric layer 103a and an etch stop layer 103b on the dielectric layer 103a. In some embodiments, the material of the dielectric layer 103a includes silicon oxide, and the etch stop layer 103b may include nitride (for example, silicon nitride), carbide (for example, silicon carbide), or the like. During a patterning process for forming the bit line stacks 106, an etching process may be conducted until the etch stop layer 103b is exposed. In alternative some embodiments in which the etch stop layer 103b is not included, during a patterning process for forming the bit line stacks 106, the dielectric layer 103 will be over etched as shown in FIG. 1A to FIG. 5.

FIG. 7A and FIG. 7B, in other embodiments, a top surface of the bit line 104 in an area 107C of an integrated circuit 700 is covered by the hard mask layer 105, and sidewalls of the bit line 104 are covered by spacers 108b. The top surface of the bit line 104 and the sidewalls of the bit line 104 are not exposed, or hardly exposed. A top corner α of the bit line 104 is not covered by the hard mask layer 105 and not covered by the spacer 108b, and is exposed.

A data storage structure 110 is arranged on top surfaces and sidewalls of the dielectric layer 109 and the hard mask layer 105 of the plurality of bit-line stacks 106, and continuously extends to a sidewall of the spacer 108b. In some embodiments, the data storage structure 110 is a conformal layer and has a staircase structure $SC_{d1}$. For example, the staircase structure $SC_{d1}$ has a step S and a turning part TP. The step S is located on a portion of the top surface of the hard mask layer 105. The turning part TP is located on the sidewall of the hard mask layer 105 and the sidewall of the spacer 108b and connected to the step S. The extension 114E of the word line 114 has a corner γ. In some embodiments, the corner γ has a angle range greater than 90 degrees and less than 180 degrees.

Because the corner γ of the word line 114 is opposite to the top corner α of the bit line 104 and a distance d2 between the corner γ and the top corner α is small, when voltage is applied to bit line 104 and word line 114, the top corner α of the bit line 104 and the corner γ of the word line of 114 each has a strong electric field, so a conductive filament 111 may be formed in the data storage structure 110 sandwiched between the bit line 104 and the word line 114 in the area 107C. The conductive filament 111 will not be formed in the data storage structure 110 between the bit line 104 and the word line 114 other than the area 107C. In some embodiments, the conductive filament 111 is formed in the turning part TP of the data storage structure 110, but is not limited thereto.

Figure 8A:
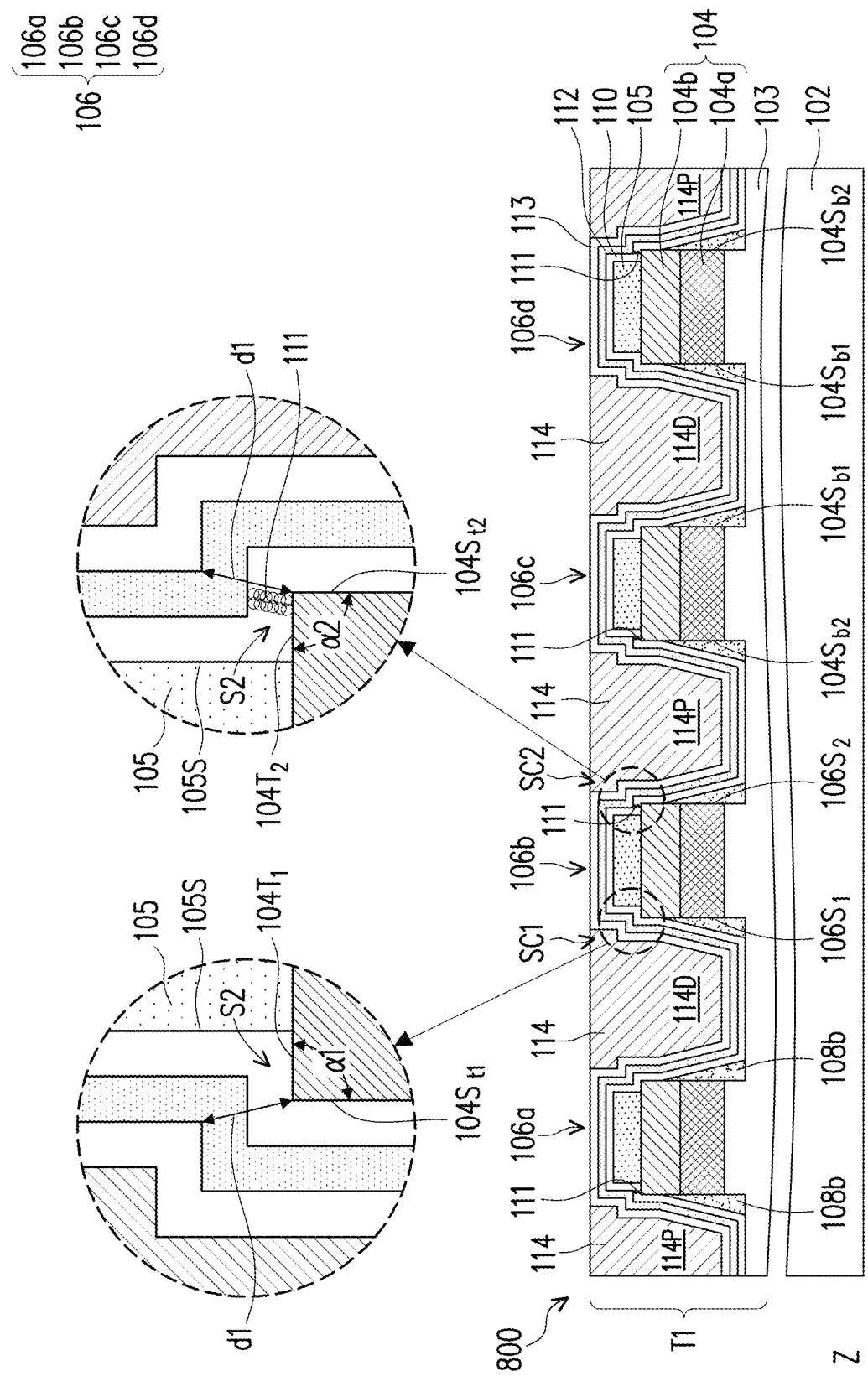
FIG. 8A and FIG. 8B are schematic cross-sectional views of portions of memory array and stacked memory array of some integrated circuits in according to some embodiments of the disclosure.
Figure 8B:
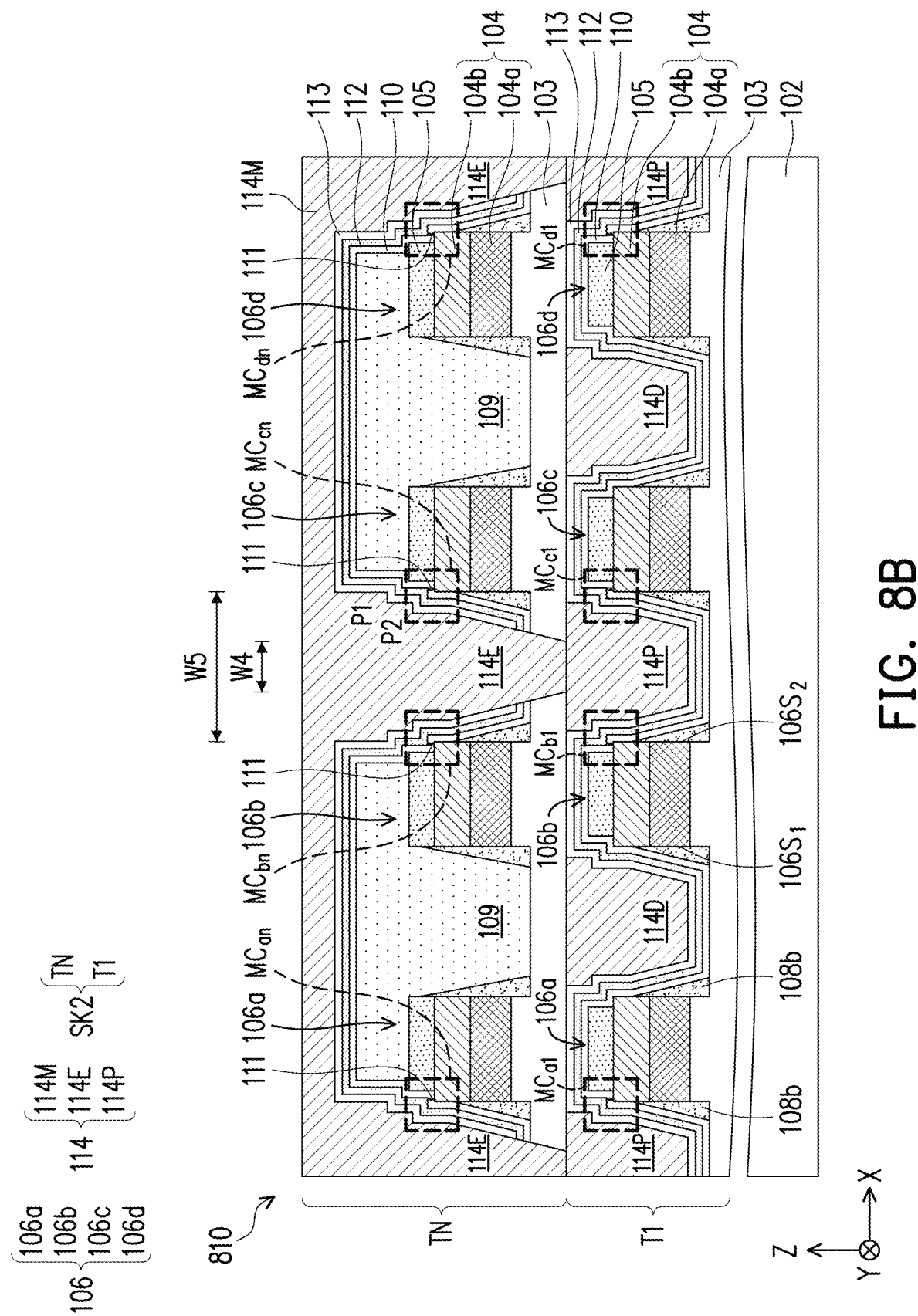

FIG. 8A and FIG. 8B are schematic cross-sectional views of portions of memory array and stacked memory array of some integrated circuits in according to some embodiments of the disclosure. The memory array or the stacked memory array includes a plurality of bit-line stacks, and each bit-line stacks having two staircase structures. Each structure of FIG. 8A to FIG. 8B is taken in an XZ plane. In the description below of FIG. 8A to FIG. 8B, identical reference numerals between different embodiments indicate that the descriptions provided above for the corresponding elements equally apply to the embodiments being described.

Referring to FIG. 8A, an integrated circuit 800 includes a memory array T1. The memory array T1 is similar to any one of the memory array TN referred to FIG. 1A to FIG. 7A. The memory array T1 includes a plurality of bit-line stacks 106 arranged above a substrate 102.

A difference between the memory array T1 and memory array TN lies in that the bit-line stacks 106 of the memory array T1 has staircase structures SC1 and SC2. The hard mask layer 105 and bit line 104 of the sidewall $106S_1$ and $106S_2$ of the bit-line stack 106 form the staircase structure SC1 and SC2 respectively. The hard mask layer 105 expose top surfaces $104T_1$ and $104T_2$, and top corners α1 and α1 of the bit line 104. The spacers 108b are disposed on lower sidewall $104Sb_1$ and $104Sb_2$ of the bit line 104, and exposes upper sidewalls $104St_1$ and $104St_2$ of the bit line 104.

The other difference between the memory array T1 and memory array TN lies in that a conductive layer is disposed between two adjacent bit-line stacks 106. The conductive layer disposed between a bit-line stack 106b and a bit-line stack 106c is used as a conductive portion 114P of the word line 114. The conductive layer disposed between the bit-line stack 106a and the bit-line stack 106b, and the conductive layer disposed between the bit-line stack 106c and bit-line stack 106d are used as dummy word lines 114D. The conductive portion 114P may be connected to an upper conductive layer or element, and the dummy word lines 114D are isolated any conductive layer or element, or floating.

Another difference between the memory array T1 and memory array TN lies in that top surfaces of the conductive portion 114P, the dummy word lines 114D, and the selector 113 are exposed, and bottom surfaces of the conductive portion 114P and the dummy word lines 114D are covered by a data storage structure 110, an interlayer 112, and a selector 113 in some embodiments.

Referring to FIG. 8B, a memory array T1 may be stacked with a memory array TN to form a stacked memory array SK2 of an integrated circuit 810. The stacked memory array SK2 includes the memory array TN stacked on the memory array T1. The memory array T1 is used as a bottom tier of the stacked memory array SK2, and the memory array TN is used as a top tier of the stacked memory array SK2. The memory array TN of the stacked memory array SK2 may be any one of the memory array TN referred to FIG. 1A to FIG. 7A, and the memory array T1 of the stacked memory array SK2 may be the memory array T1 referred to FIG. 8A.

A dummy word line 114D of the memory array T1 is covered by the dielectric layer 109 and the dielectric layer 103 of the memory array TN, and is electrically isolated from the word line 114 of the memory array TN. The conductive portion 114P of the word line 114 of the memory array T1 may be directly electrically connected to the extension 114E of the word line 114 of the memory array TN, thereby reducing the complexity of word line routing. A width W4 of a top surface of the conductive portion 114P is different from a width W5 of a bottom surface of the extension 114E. For example, the width W4 of the top surface of the conductive portion 114P is greater than the width W5 of the bottom surface of the extension 114E. A portion of the top surface of the conductive portion 114P is covered by and in contact with the dielectric layer 103 of the memory array TN. A combination of the extension 114E and the conductive portion 114P has a concave-convex contour. In some embodiments, the combination of the extension 114E and the conductive portion 114P has a bamboo joint shape.

Since the extension 114E of the memory array TN is electrically connected to the conductive portion 114P of the memory array T1, and is electrically insulated from the dummy word line 114D by the dielectric layers 103 and 109 of the memory array TN, conductive filaments 111 may be consistently formed along both sides of the conductive portion 114P and the extension 114E without forming a conductive filament along both sides of dummy word line 114D of the memory array T1 or over the dielectric layer 109 of the memory array TN.

The stacked memory array SK2 may include a plurality of memory cells, for example RRAM cells, $MC_{a1}$-$MC_{d1}$ and $MC_{an}$-$MC_{dn}$, which are configured to respectively store a data state along a single side of the bit-line 104 of the memory arrays T1 and TN that is closest to a corresponding conductive portion 114P or a corresponding extension 114E of the word line 114.

Figure 9A:
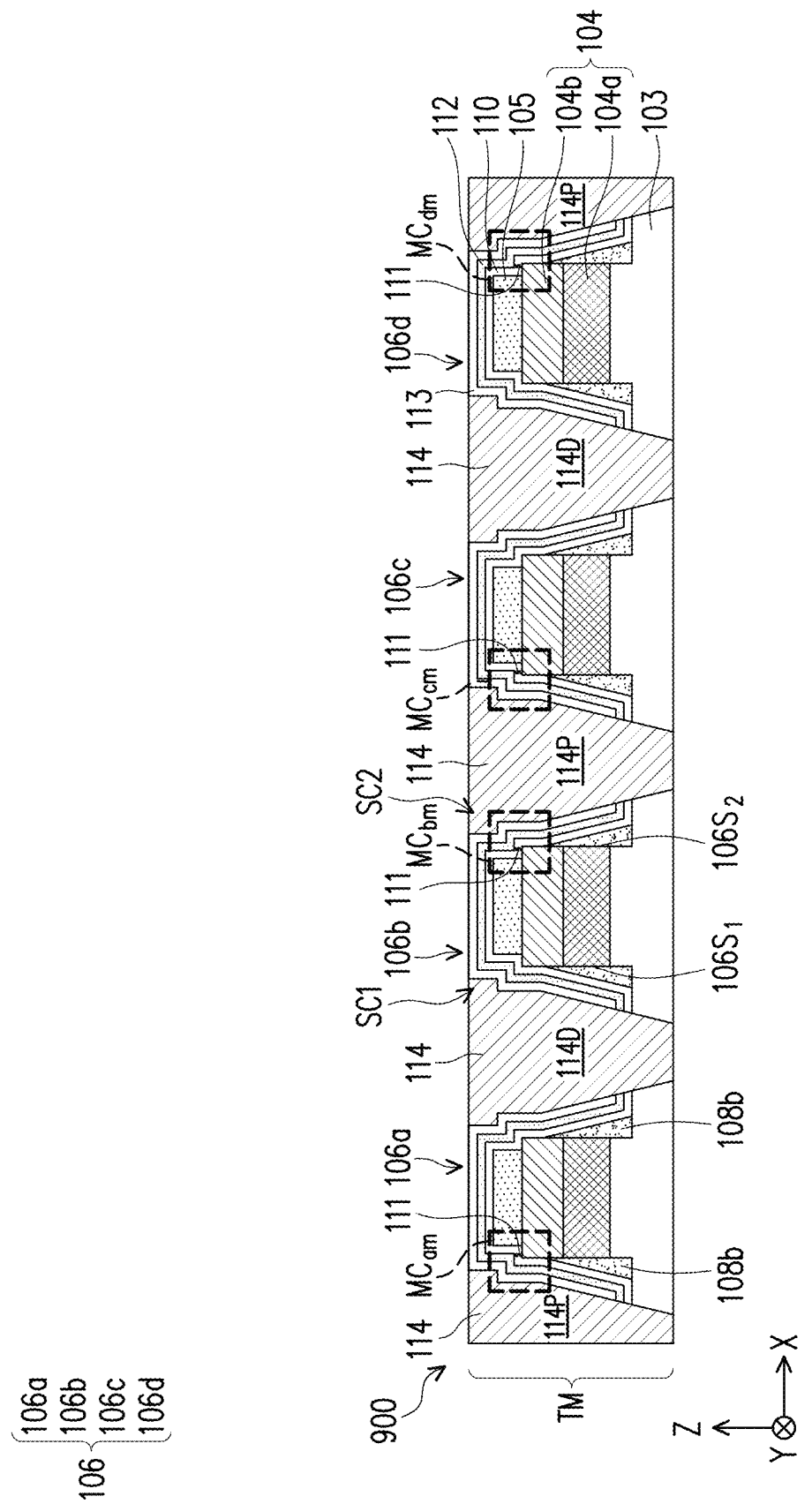
FIG. 9A to FIG. 9C are schematic cross-sectional views of portions of memory array and stacked memory array of some integrated circuits according to some embodiments of the disclosure.
Figure 9B:
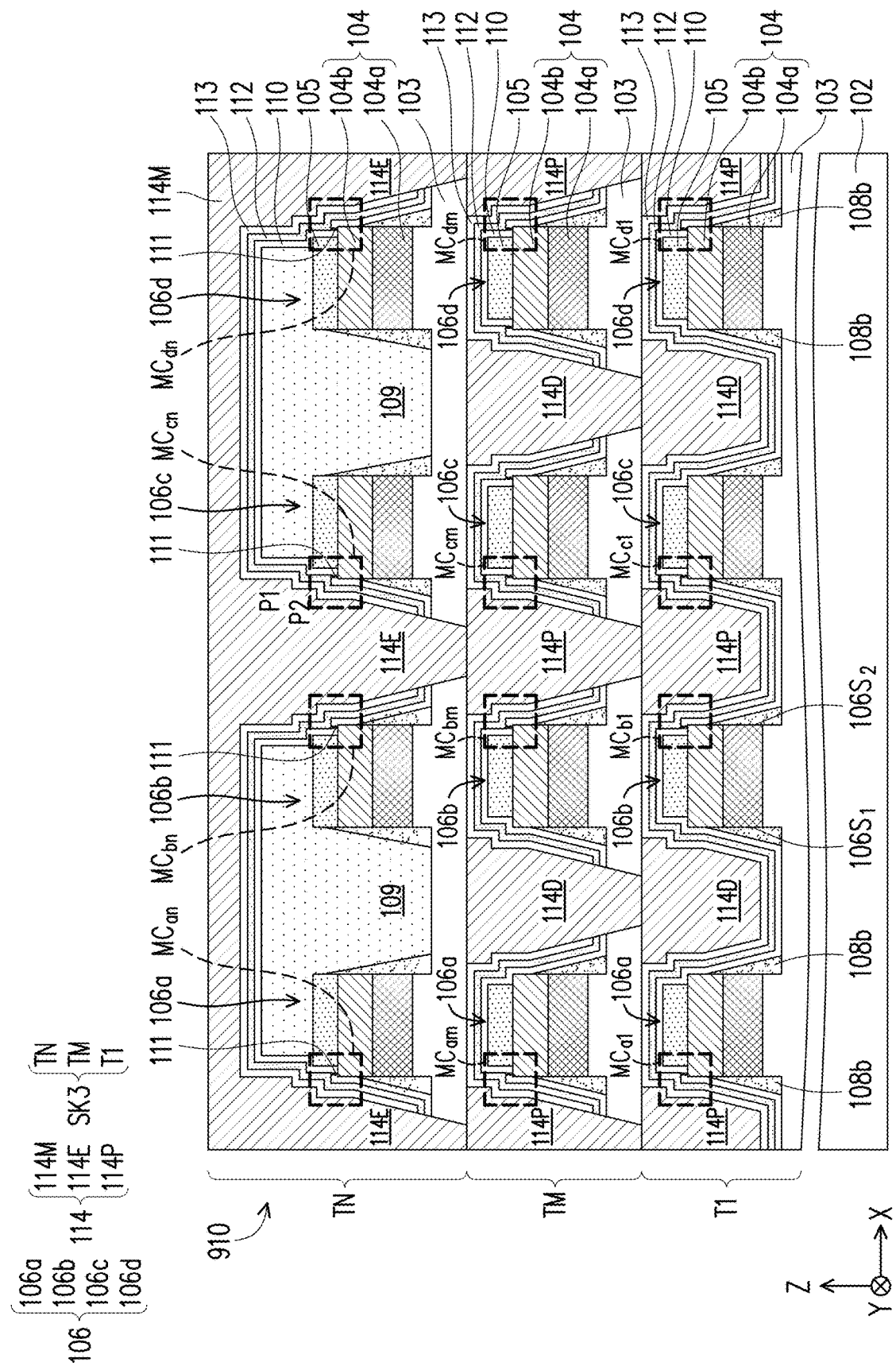
Figure 9C:
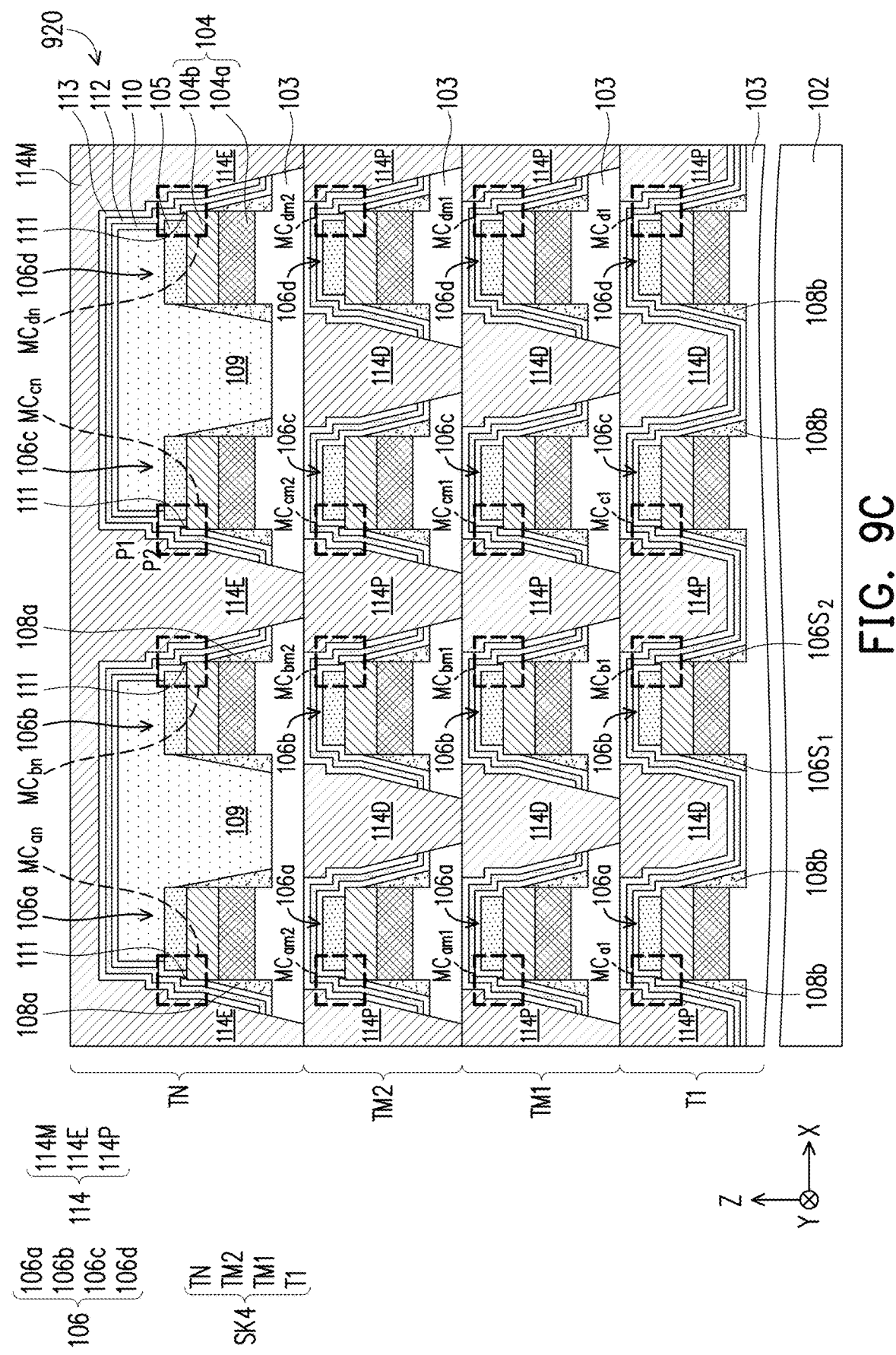

FIG. 9A to FIG. 9C are schematic cross-sectional views of portions of memory array and stacked memory array of some integrated circuits according to some embodiments of the disclosure. The memory array or the stacked memory array includes a plurality of bit-line stacks, and each bit-line stacks having two staircase structures. Each structure of FIG. 9A to FIG. 9C is taken in an XZ plane. In the description below of FIG. 9A to FIG. 9C, identical reference numerals between different embodiments indicate that the descriptions provided above for the corresponding elements equally apply to the embodiments being described.

Referring to FIG. 9A, an integrated circuit 900 includes a memory array TM. The memory array TM is similar to the memory array T1 referred to FIG. 8A.

The memory array TM includes a plurality of bit-line stacks 106 arranged above the substrate 102. Each bit-line stack 106 of the memory array TM is similar to the bit-line stacks 106 of the memory array T1, and has two staircase structure SC1 and SC2.

A difference between the memory array TM and memory array T1 lies in that conductive portions 114P and dummy word lines 114D penetrate the dielectric layer 103 of the memory array TM. Bit-line stacks 106b and 106c are separated by the conductive portion 114P of a word line 114. The bit-line stack 106a and the bit-line stack 106b, and the bit-line stack 106c and the bit-line stack 106d are separated by the dummy word lines 114D. The conductive portion 114P of the word line 114 may be connected to an upper conductive layer or element, and may be connected to a lower conductive layer or element. The dummy word line 114D is isolated from any conductive layer, or floating.

Referring to FIG. 9B, a memory array TM may be sandwiched between a memory array TN and a memory array T1 to form a stacked memory array SK3 of an integrated circuit 910.

The memory array T1 is used as a bottom tier of the stacked memory array SK3, and the memory array TN is used as a top tier of the stacked memory array SK3, and the memory array TM is used as a middle tier of the stacked memory array SK3. The memory array TN of the stacked memory array SK3 may be any one of the memory array TN referred to FIG. 1A to FIG. 7A, the memory array T1 of the stacked memory array SK3 may be the memory array T1 referred to FIG. 8A, and the memory array TM of the stacked memory array SK3 may be the memory array TM referred to FIG. 9A.

The conductive portion 114P of the word line 114 of the memory array TM may be electrically connected to the extension 114E of the memory array TN and the conductive portion 114P of the memory array T1. The dielectric layer 109 and the dielectric layer 103 of the memory array TN are covered on the dummy word line 114D of the memory array TM. A combination of the extension 114E and the conductive portion 114P has a concave-convex contour. In some embodiments, the combination of the extension 114E and the conductive portion 114P has a bamboo joint shape.

Since the extension 114E of the memory array TN is electrically connected to the conductive portions 114P of the memory arrays TM and T1, and is electrically insulated from the dummy word line 114D by the dielectric layers 103 of the memory arrays TN, TM and T1, conductive filaments 111 may be consistently formed along both sides of conductive portion 114P and the extension 114E without forming a conductive filament along both sides of the dummy word line 114D of the memory array T1, both sides of the dummy word line 114D of the memory array TM, or on the dielectric layer 109 of the memory array TN.

The stacked memory array SK3 may include a plurality of memory cells, for example RRAM cells, $MC_{a1}$-$MC_{d1}$, $MC_{am}$-$MC_{am}$, and $MC_{an}$-$MC_{dn}$, which are configured to respectively store a data state along a single side of the bit-line 104 of the memory arrays T1, TM, and TN that is closest to a corresponding conductive portion 114P or a corresponding extension 114E of word line 114.

Referring to FIG. 9C, an integrated circuit 920 may include a stacked memory array SK4. The stacked memory array SK4 includes a memory arrays T1, TM1, TM2, and TN stacked from bottom to top. The memory array TN of the stacked memory array SK4 may be any one of the memory array TN referred to FIG. 1A to FIG. 7B, the memory array T1 of the stacked memory array SK4 may be the memory array T1 referred to FIG. 8A, and the memory arrays TM1 and TM2 of the stacked memory array SK4 may be the memory array TM referred to FIG. 9A.

A combination of the extension 114E and the conductive portion 114P has a concave-convex contour. In some embodiments, the combination of the extension 114E and the conductive portion 114P has a bamboo joint shape.

Since the extension 114E of the memory array TN is electrically connected to the conductive portion 114P of the memory arrays TM2, TM1, and T1, and is electrically insulated from the dummy word line 114D by the dielectric layers 103 of the memory arrays TN, TM2, TM1, and T1, conductive filaments III may be consistently formed along both sides of conductive portion 114P and the extension 114E without forming a conductive filament along both sides of dummy word line 114D of the memory array T1, of the memory array TM1, both sides of the dummy word line 114D of the memory array TM2, or on the dielectric layer 109 of the memory array TN.

The stacked memory array SK4 may include a plurality of memory cells, for example RRAM cells, $MC_{a1}$-$MC_{d1}$, $MC_{am1}$-$MC_{dm1}$, $MC_{am2}$-$MC_{dm2}$, and $MC_{an}$-$MC_{dn}$, which are configured to respectively store a data state along a single side of the bit-line 104 of the memory arrays T1, TM, and TN that is closest to a corresponding conductive portion 114P or a corresponding extension 114E of the word line 114.

Referring to FIG. 8B, FIG. 9B, and FIG. 9C, by consistently forming conductive filaments 111 along a single side of a plurality of bit-lines stacks 106a-106d of the stacked memory arrays SK2, SK3 or SK4, variations in a number, size, and/or location of conductive filaments between different bit-lines can be reduced, thereby reducing the forming voltage, the set voltage, and the reset voltages and improving performance of RRAM devices within the memory array.

Figure 10:
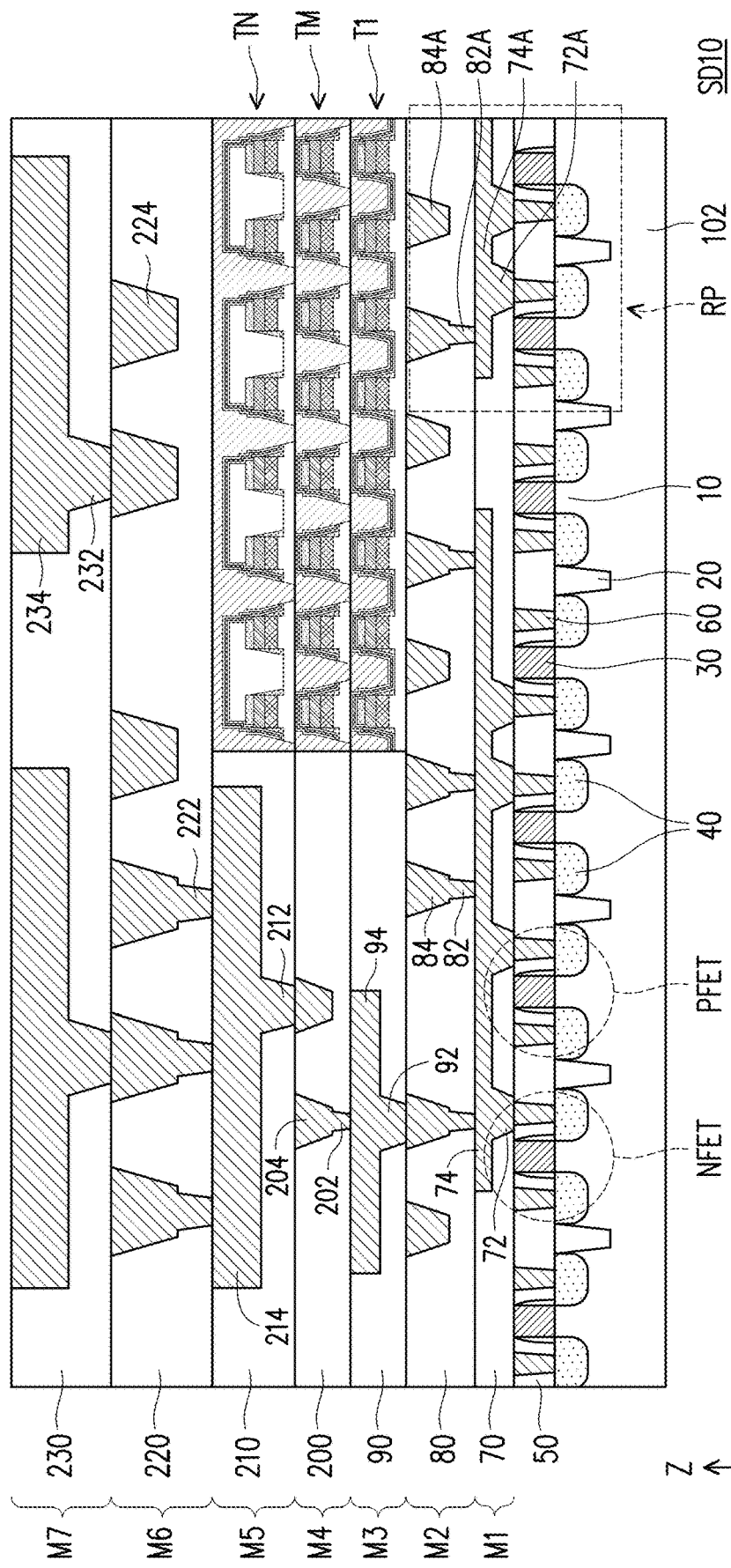
FIG. 10 shows a cross-sectional view of a semiconductor device SD10 according to some embodiments of the disclosure.

FIG. 10 shows a cross-sectional view of a semiconductor device SD10 according to some embodiments of the disclosure. The structure of FIG. 10 is taken in an XZ plane. In some embodiments, the semiconductor device SD10 includes a substrate 102. In some embodiments, the substrate 102 includes one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, or a II-VI semiconductor. In some embodiments, the substrate 102 may be a semiconductor-on-insulator, including at least one layer of dielectric material (e.g., an oxide layer) disposed between a pair of semiconductor layers. The substrate 102 may include various regions that have been suitably doped with impurities of the desired conductivity (e.g., p-type or n-type dopants).

In some embodiments, devices of an integrated circuit are formed in and on the substrate 102. For example, transistors may be formed in and/or on the substrate 102. The transistors may be n-type field effect transistors NFET and/or p-type field effect transistors PFET. In some embodiments, the transistors are formed over fins 10 formed on the substrate 102. The transistors may be separated from each other by isolation structures 20 formed in the substrate 102. For example, the isolation structures 20 may be shallow trench isolation structures. The transistors may include gate structures 30 disposed over the fins 10 and source/drain regions 40 disposed in the substrate 102 besides the fins 10, at opposite sides of the gate structures 30. A dielectric layer 50 is disposed over the substrate 102, covering the transistors. Source/drain contacts 60 extend across the dielectric layer 50 to contact the source/drain regions 40. It should be noted that while the transistors in FIG. 11 have been described as FIN FET transistors, the disclosure is not limited thereto, and other types of transistor (e.g., GAA, planar, etc.) are also contemplated within the scope of the disclosure. Similarly, devices other than transistors (e.g., inductors, resistors, capacitors, diodes, and so on) may also be part of the semiconductor device SD10.

Figure 11:
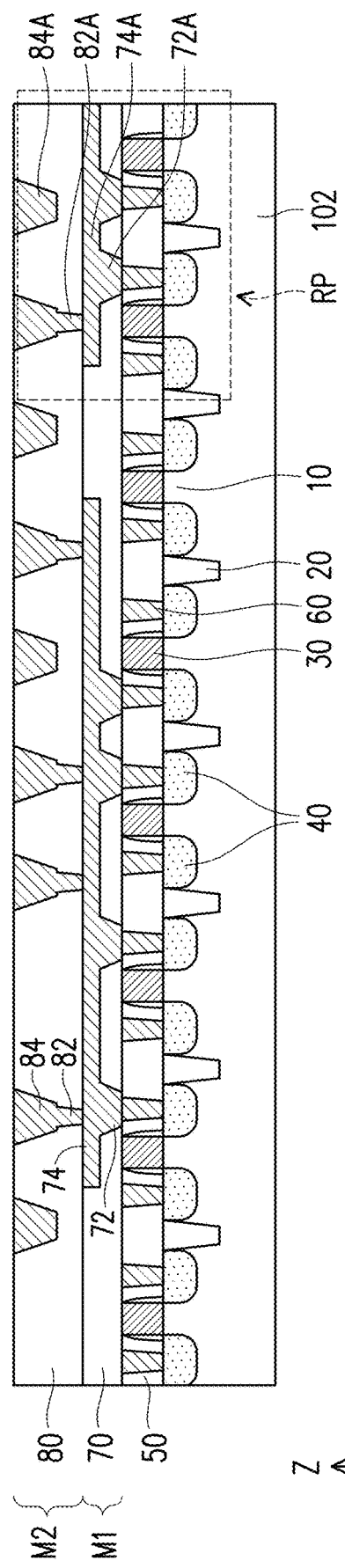

In some embodiments, the semiconductor device SD10 includes multiple metallization levels M1-M7 interconnecting the devices formed on the substrate 102 in an integrated circuit. It should be noted that while FIG. 11 illustrates seven metallization levels M1-M7, the disclosure is not limited thereto. In some alternative embodiments, more or fewer metallization levels M1-M7 may be formed depending on circuit design requirement.

In some embodiments, the metallization levels M1-M7 include one or more interlayer dielectric (ILD) layers alternately stacked with metallization patterns. The metallization patterns include conductive lines extending on the ILD layers and conductive vias interconnecting the conductive lines with underlying conductive lines and/or devices. For example, the bottommost metallization level M1 includes the ILD layer 70, the conductive vias 72, and the conductive lines 74. The conductive lines 74 extend on the ILD layer 70, and are interconnected to the devices formed on the substrate 102 by the conductive vias 72. The metallization level M2 includes the ILD layer 80, the conductive vias 82, and the conductive lines 84. The conductive lines 84 extend on the ILD layer 80, while the conductive vias 82 extend across the ILD layer 80 to interconnect the conductive lines 84 with the conductive lines 74. Similarly, the metallization level M3 includes the ILD layer 90, the conductive vias 92, and the conductive lines 94; the metallization level M4 includes the ILD layer 200, the conductive vias 202, and the conductive lines 204; the metallization level M5 includes the ILD layer 210, the conductive vias 212, and the conductive lines 214; the metallization level M6 includes the ILD layer 220, the conductive vias 222, and the conductive lines 224; and the metallization level M7 includes the ILD layer 230, the conductive vias 232, and the conductive lines 234.

In some embodiments, at least some of the conductive lines located in different metallization levels may extend perpendicular to each other. For example, the conductive lines 74 of the bottommost metallization level M1 may extend along the X direction, while the conductive lines 84 of the metallization level M2 may extend along the Y direction.

In some embodiments, one or more memory arrays (e.g., T1, TM, and TN) are disposed in some of the metallization levels, for example in the metallization levels M3, M4, and M5. In some embodiments, each of the memory arrays T1, TM and TN may include a plurality of memory cells formed along a single side of each bit-line. In some alternative embodiments, the memory arrays T1, TM, and TN may be formed in different metallization levels (e.g., M4 to M6, M5 to M7, and so on) than the ones illustrated in FIG. 10.

In some embodiments, some of the underlying or overlying metallization levels with respect to the memory arrays T1, TM, and TN (e.g., the metallization levels M1 and M2), are used for peripheral circuits RP of the memory arrays T1, TM, and TN, including row and column decoders, for example. In some embodiments, at least part of the conductive vias 72 and 82 (e.g., conductive vias 72A and 82A) and of the conductive lines 74 and 84 (e.g., conductive lines 74A and 84A) are part of the peripheral circuit RP of the memory arrays T1, TM, and TN, while the remaining conductive vias 72, 82 and conductive lines 74, 84 may be integrated with other devices to perform different logic functions.

FIG. 11 to FIG. 36D are schematic views of structures formed during a manufacturing method of the semiconductor device SD10 according to some embodiments. FIGS. 11, 16 to 19, 23, 24, 34, and 35 are schematic cross-sectional views taken in the same XZ plane as FIG. 10. FIG. 12A to 15A, 20A to 22A, 25A to 33A, 36A and 36C are schematic cross-sectional views of a region of the semiconductor device SD10 in which the memory array T1 is being manufactured, while FIG. 12B to 13B, 15B, 20B to 22B, 25B to 33B, 36B and 36D are schematic top views of the corresponding structures of FIG. 12A to 13A, 15A, 20A to 22A, 25A to 33A, 36A and 36C. The structure of FIGS. 12A to 15A, 20A to 22A, 25A to 33A, 36A and 36C are taken in an XZ plane, and the structure of FIG. 12B to 13B, 15B, 20B to 22B, 25B to 33B, 36B and 36D are taken in an XY plane. FIG. 14B is a schematic perspective view of a portion of the corresponding structure of FIG. 14A.

In FIG. 11, transistors (e.g., FIN FETs) are formed on the substrate 102. The fins 10 are patterned according to any suitable method, for example by using one or more photolithographic processes, such as double-patterning or multi-patterning. Sacrificial layers (not shown) may be optionally formed over the substrate 102 during patterning of the fins 10, for example to obtain fins 10 of finer pitch. Such sacrificial layers may be removed once the fins 10 are patterned.

The isolation structures 20 are formed, for example, by depositing one or more layers of insulating materials. An etch back process may be optionally performed to obtain isolation structures 20 of desired height. The isolation structures 20 may include any suitable insulating material, such as spin-on-glass, silicon oxide, silicon oxynitride, silicon nitride, silicon oxycarbonitride, fluoride-doped silicate glass, or a combination thereof.

The gate structures 30 may be formed according to any suitable process, for example by a gate replacement process. Dummy gate structures (not illustrated) may be initially formed over the intended location of the gate structures 30. Sidewall spacers are formed at opposite sides of the dummy gate structures, for example by depositing an insulating material over the dummy gate structures and then performing a back-etching process, to leave sidewall spacers at the sides of the dummy gate structures. The source/drain regions 40 may then be formed in the fins 10, for example by removing portions of the fins 10 to form recesses in which one or more source/drain epitaxial layers are grown to form the source/drain regions 40. The epitaxial layers may include dopants of suitable conductivity type according to the type (e.g., n-type or p-type) of transistor being fabricated. In some alternative embodiments, the source/drain regions 40 may be grown on the fins 10, without preliminary removing portions of the fins 10.

The dielectric layer 50 is then blanketly formed over the substrate 102, burying the source/drain regions 40 and the dummy gate structures. The dielectric layer 50 may include a silicon-based insulating material, such as silicon oxide, SiCOH, SIOC, and/or SiOCN; low-k materials, such as Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof; or any other suitable dielectric material. The dielectric layer 50 may be fabricated to a suitable thickness by chemical vapor deposition (CVD, for example flowable CVD, HDPCVD, SACVD, etc.), spin-on, sputtering, or other suitable methods. A planarization process, such as grinding, chemical-mechanical polish, or the like, may be performed so that the top portion of the dummy gate structures are exposed. The dummy gate structure may then be removed, exposing the fins 10 at the bottom of the evacuated spaces.

Thereafter, the gate structures 30 may be formed in place of the dummy gate structures. The gate structures 30 may include one or more stacked layers, such as a gate dielectric layer and one or more gate conductive layers. The gate dielectric layer may include an interfacial layer including a dielectric material such as silicon oxide or silicon oxynitride (SiON), and a high-k layer formed over the interfacial layer. The gate interfacial layer may be formed by depositing the dielectric material via suitable deposition process, such as atomic layer deposition (ALD), CVD, or the like. In some alternative embodiments, the gate interfacial layer may be formed via an oxidation process. The profile of the interfacial layer may change according to the production method followed. In some embodiments, the material of the high-k layer has a dielectric constant greater than about 4, greater than about 12, greater than about 16, or even greater than about 20. For example, a material of the high-k layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof, or other suitable materials. In some embodiments, the material of the high-k layer may optionally include a silicate such as HfSiO, HfSiON LaSiO, AlSiO, or a combination thereof. In some embodiments, the method of forming the high-k layer includes performing at least one suitable deposition technique, such as CVD, ALD (including, e.g., metal oxide chemical vapor deposition, MOCVD, remote plasma atomic layer deposition, RPALD, plasma-enhanced atomic layer deposition, PEALD, etc.), molecular beam deposition (MBD), or the like.

The gate conductive layers may include a work-function layer and a gate electrode. A material of the work function layer may be selected according to the conductivity type desired for the transistor. Exemplary p-type work function materials include TiN, TaN, Ru, Mo, Al, WN, $ZrSi_2$, $MoSi_2$, $TaSi_2$, $NiSi_2$, other suitable p-type work function materials, or combinations thereof. On the other hand, exemplary n-type work function materials include Ti, Ag, TaAl, TaAlC, TiAlN, TaC, TaCN, TaSiN, Mn, Zr, other suitable n-type work function materials, or combinations thereof. In some embodiments, the method of forming the work function layer includes performing at least one suitable deposition technique, such as CVD, ALD, MBD, or the like. In some embodiments, the work function layer serves the purpose of adjusting a threshold voltage of the transistor. In some embodiments, the gate electrode is formed over the work function layer. In some embodiments, a material of the gate electrode includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate electrode may be formed by CVD, ALD, plating, other deposition techniques, or a combination thereof. In some embodiments, the gate structures 30 may further include barrier layers, liner layers, seed layers, adhesion layers, etc.

The source/drain contacts 60 are then formed by providing a conductive material in contact holes opened through the dielectric layer 50. In some embodiments, the conductive material is disposed on portions of the source/drain regions 40 exposed by the contact holes. In some embodiments, the conductive material of the source/drain contacts 60 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by CVD, ALD, plating, other deposition techniques, or a combination thereof. In some embodiments, the conductive material may be provided on one or more seed layers, barrier layers, etc. (not shown).

In FIG. 11, the metallization levels M1 and M2 are sequentially formed on the dielectric layer 50 over the substrate 102. A material and a manufacturing method of the ILD layers 70 and 80 may be independently selected from the materials and methods listed above for the dielectric layer 50. The conductive vias 72, 82 and the conductive lines 74, 84 include cobalt (Co), tungsten (W), copper (Cu), titanium (Ti), tantalum (Ta), aluminum (Al), zirconium (Zr), hafnium (Hf), a combination thereof, or other suitable metallic materials, and may be formed through suitable processes such as, for example, single or dual damascene.

Figure 13B:
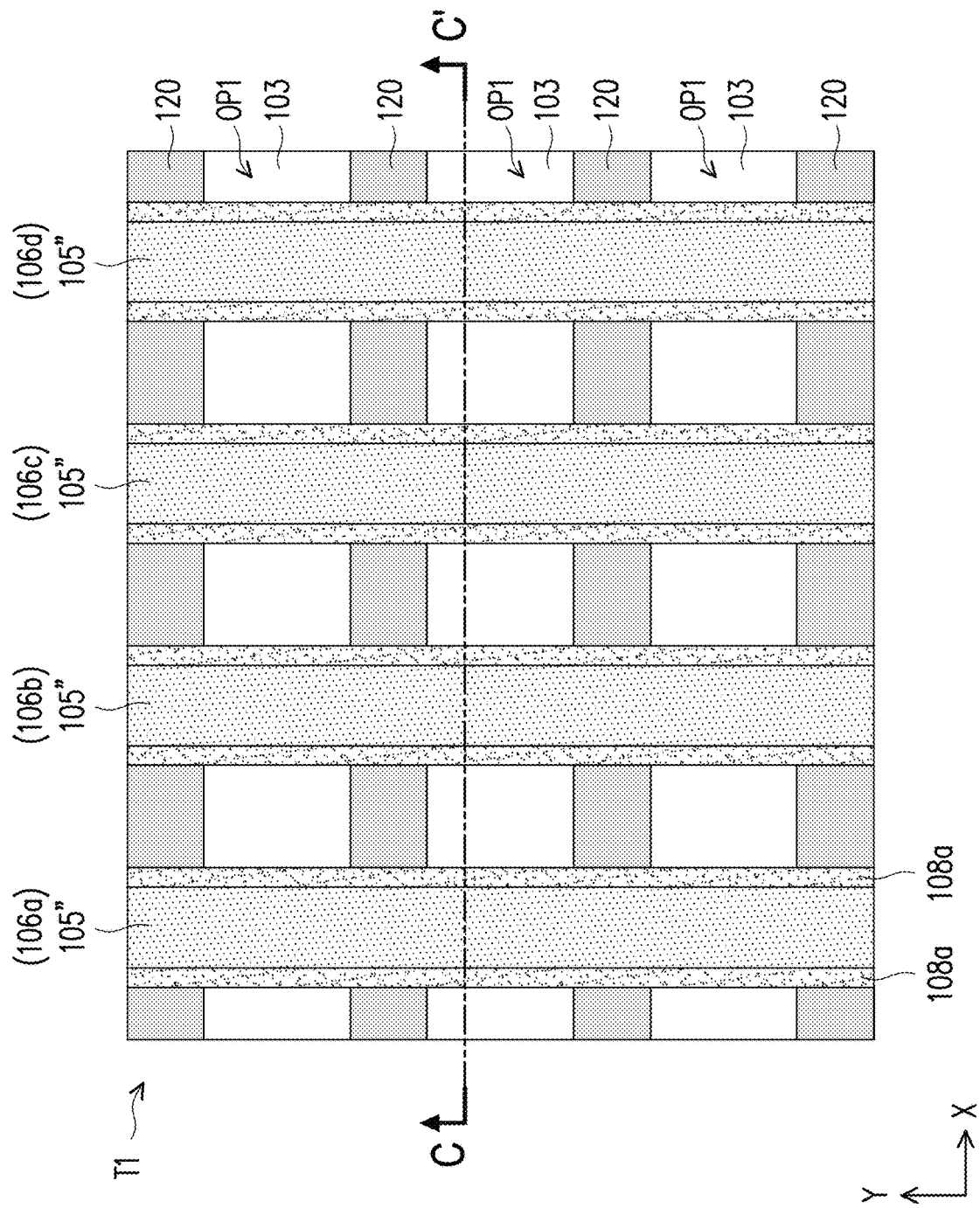
Figure 14A:
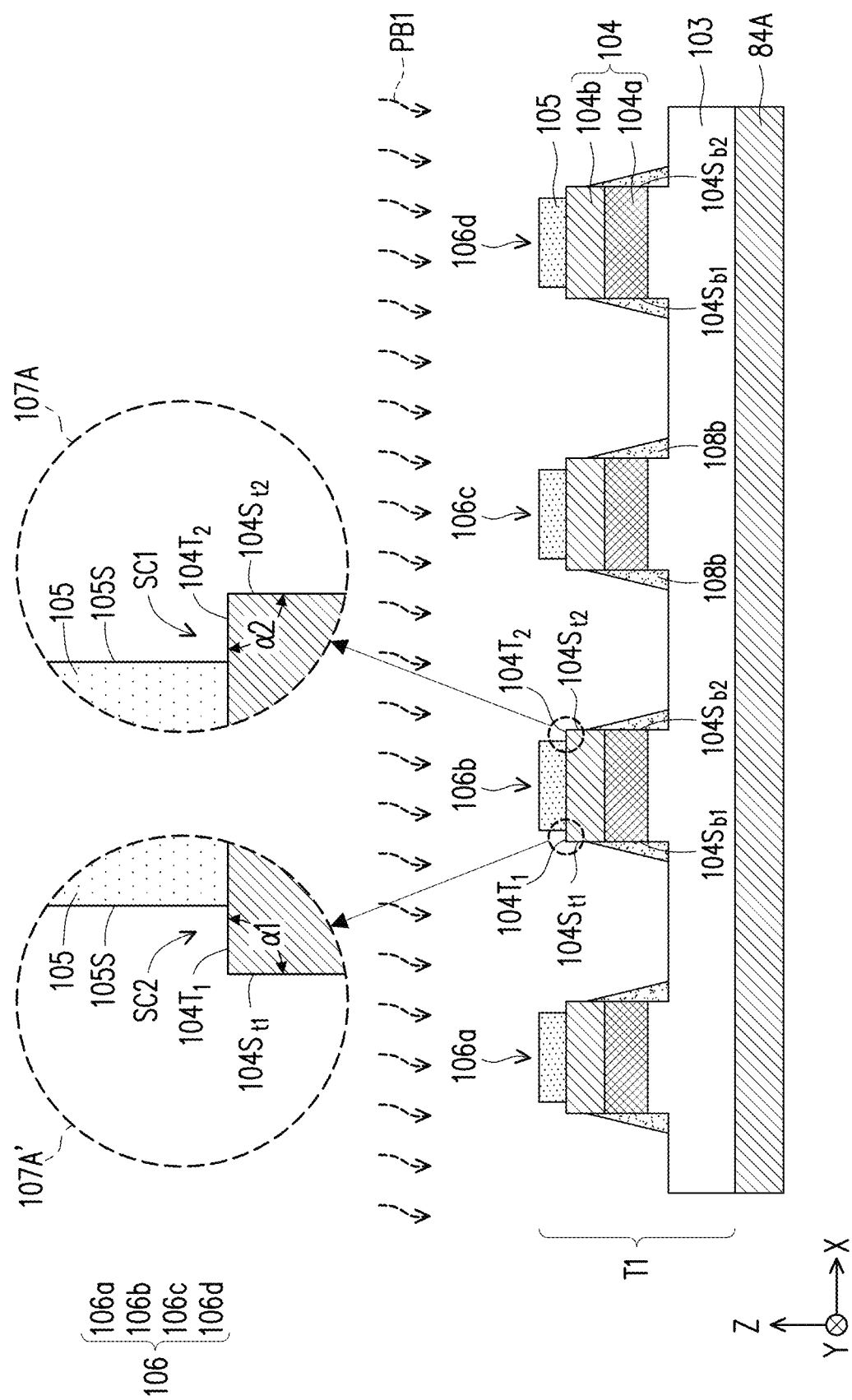
Figure 14B:
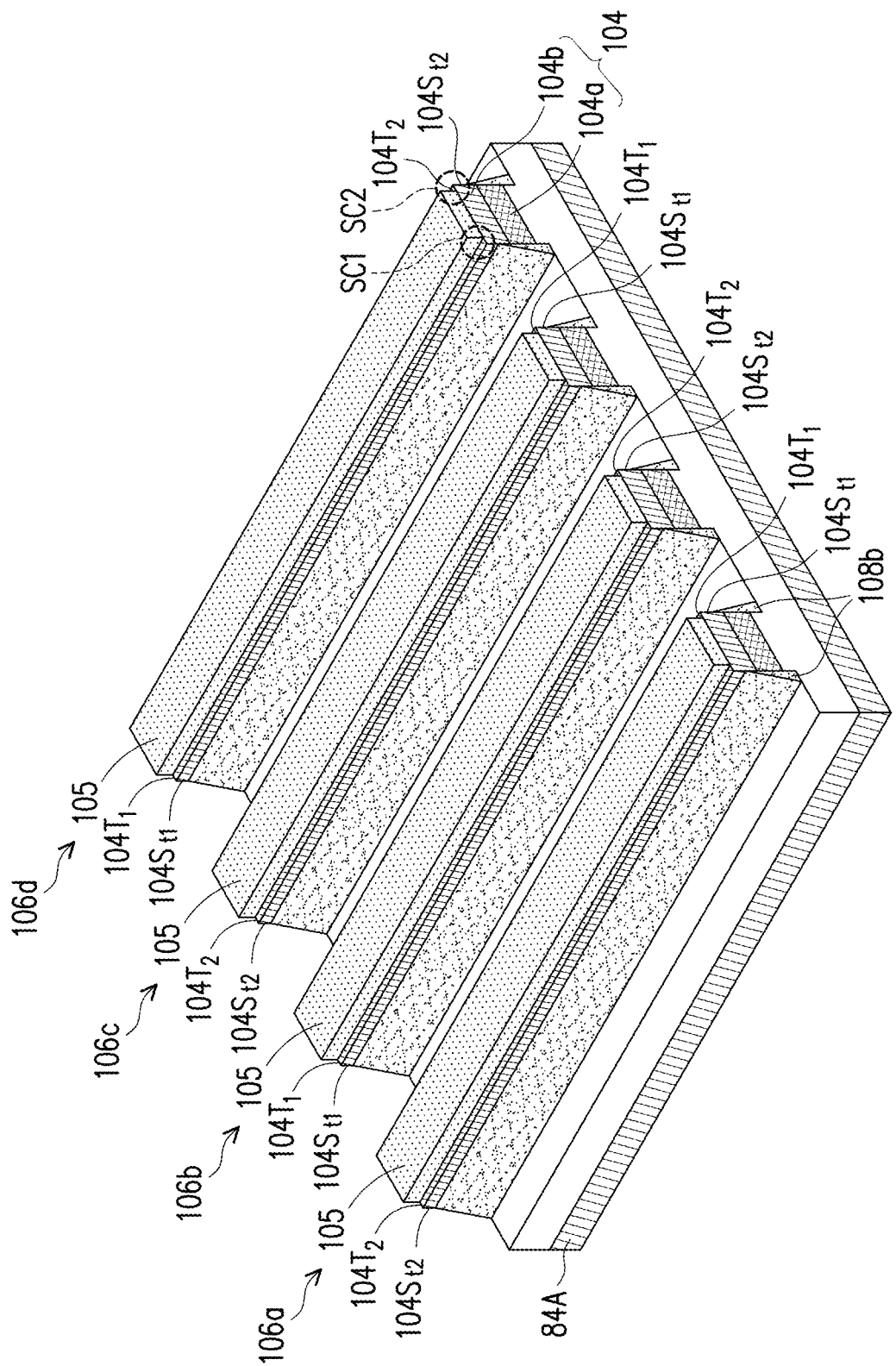
Figure 15A:
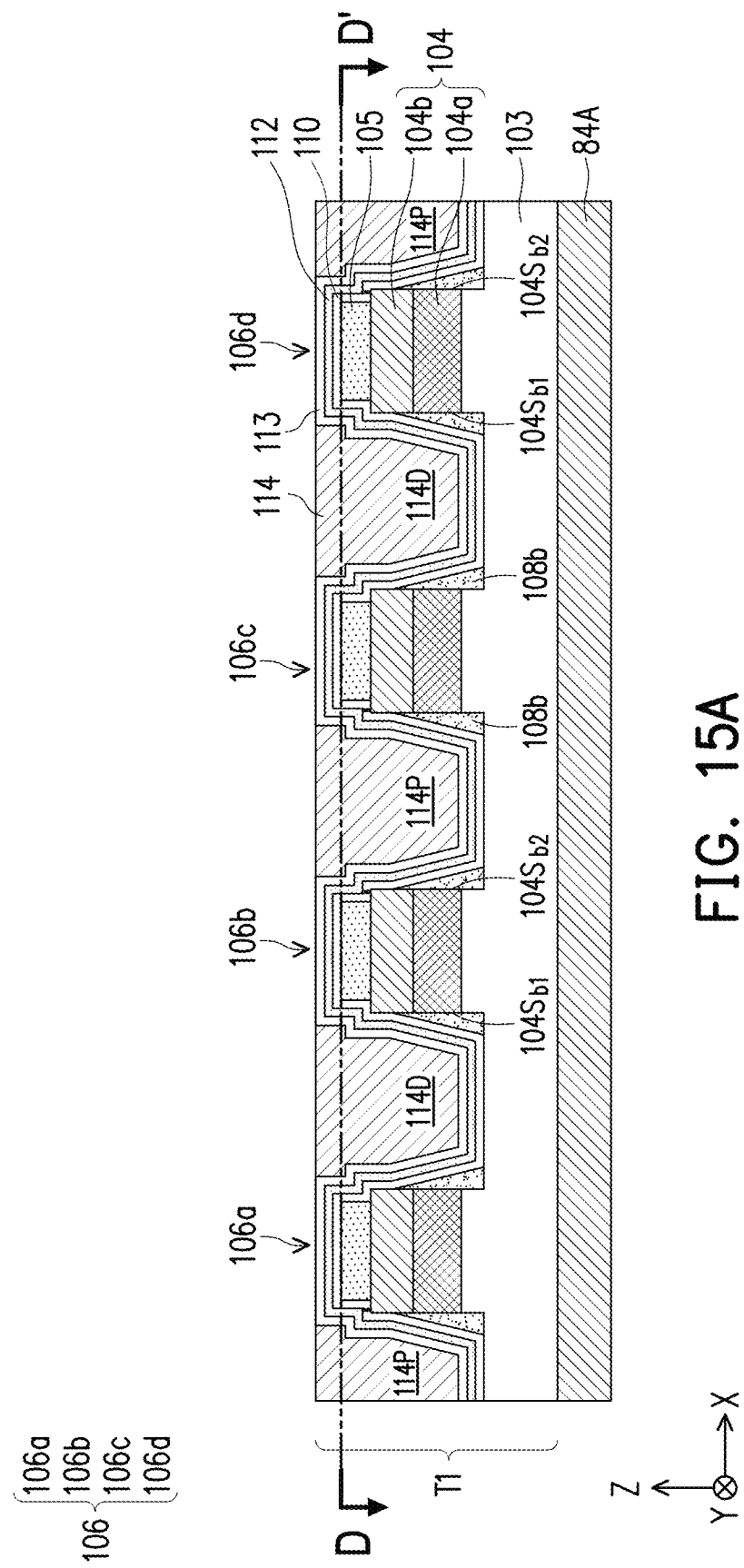
Figure 15B:
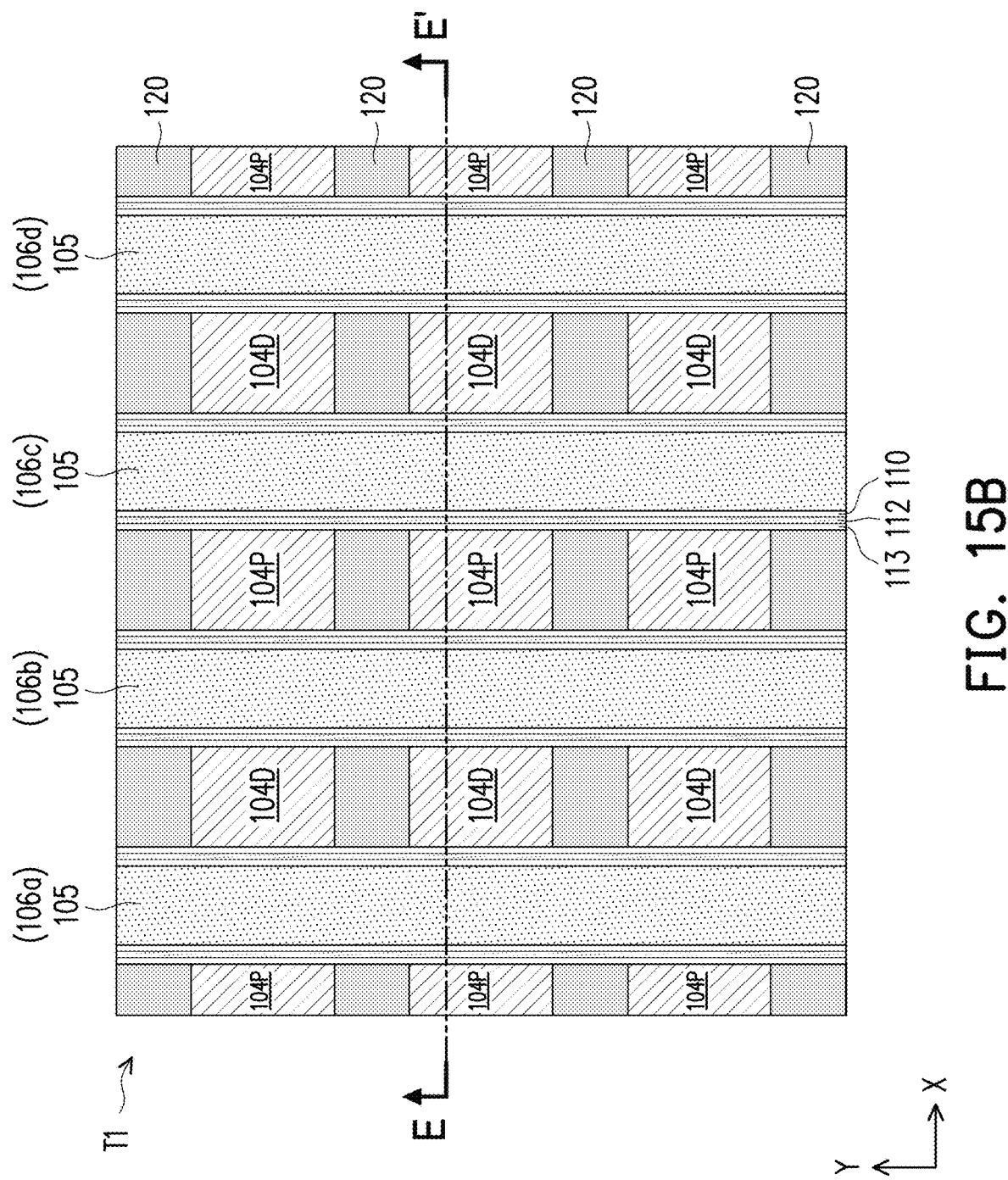

FIG. 12 to 15B are schematic views of a region of the semiconductor device SD10 in which a memory array T1 is being manufactured. FIG. 13A illustrates a cross-sectional view of the memory array T1 along line C-C' of a top-view of the memory array T1 shown in FIG. 13B. FIG. 13B illustrates the top-view of the memory array T1 shown in FIG. 13A. FIG. 14B is a schematic perspective view of a portion of the corresponding structure of FIG. 14A. FIG. 15A illustrates a cross-sectional view of the memory array T1 along line E-E' of a top-view of the memory array T1 shown in FIG. 15B. FIG. 15B illustrates the top-view of the integrated circuit along line D-D' of the cross-sectional view of the memory array T1 shown in FIG. 15A.

In FIG. 11 and FIG. 12, stacked layers are formed over the metallization level M2. For the sake of simplicity, in FIG. 12 to FIG. 15B, FIG. 20 to FIG. 22, and FIG. 25A to FIG. 33B the metallization level M2 and the underlying structure illustrated in FIG. 11 are schematically represented as the conductive lines 84A. The stacked layers may be initially blanketly formed as sheets over the metallization level M2.

The stacked layers include, from the bottom to the top, a dielectric layer 103', a conductive layer 104a', a conductive layer 104b', and a hard mask layer 105'. The dielectric layer 103' includes a material having a lower etching rate in selected conditions with respect to the material of the conductive layer 104a'. For example, the dielectric layer 103' may include silicon oxide, silicon oxynitride, silicon nitride, a combination thereof, or may be other than silicon based, such as aluminum oxide, aluminum nitride, aluminum oxynitride, or the like. The dielectric layer 103' may be formed of a desired thickness, for example in the range from about 5 nm to about 20 nm, by ALD, CVD, or other suitable processes.

The conductive layer 104a' and 104b' may include metallic material, for example tungsten, titanium, titanium nitride, ruthenium, tantalum, tantalum nitride, cobalt, nickel, copper, aluminum, alloys thereof, silicide, or other suitable conductive materials. In some embodiments, the metallic material of the conductive layer 104a' and 104b' includes at least one selected from tungsten, titanium, titanium nitride, ruthenium, tantalum, tantalum nitride, and a combination thereof.

In some embodiments, the conductive layer 104a' includes a different metallic material than the conductive layer 104b'. In some embodiments, while the material of the conductive layer 104a' may be selected from the same materials listed above for the conductive layer 104a' and 104b', the material of the conductive layers 104a' is selected so that the conductive layer 104a' has a lower (electric) resistance than the conductive layer 104b'. For example, the material of the conductive layer 104a' may have a lower resistivity than the material of the conductive layers 104b'. For example, in some cases the conductive layers 104b' may include titanium nitride, or ruthenium, and the conductive layer 104a' may include tungsten or cobalt.

The conductive layers 104a' and 104b' may be formed by suitable deposition processes, such as ALD, CVD, e-beam evaporation, or the like. In some embodiments, the conductive layer 104b' is formed so as to be thinner than the conductive layer 104a'. For example, the conductive layer 104a' may independently be up to 1 to 10 times thicker than the conductive layer 104b'. In some embodiments, the thickness of the conductive layer 104b' may be equal to or less than 10 nm, for example ranging from 1 nm to 10 nm. In some embodiments, the thickness of the conductive layer 104a' may be in the range from about 20 nm to about 40 nm.

In some embodiments, the material of the hard mask layer 105' is different from the material of the conductive layer 104b', so that selective etching between the two layers may be possible. For example, portions of the hard mask layer 105' may be selectively removed with respect to the underlying conductive layer 104b'. The hard mask layer 105' may be formed by suitable deposition processes, such as ALD, CVD, or the like. The hard mask layer 105' may be a single layer or a composite layer. In some embodiments, the hard mask layer 105' includes at least one layer of an insulating oxide, such as silicon oxide. When the hard mask layer 105' has a composite structure, layers of different materials may be stacked over each other. For example, a layer of insulating oxide may be disposed on the conductive layer 104b', a layer of an insulating nitride (e.g., silicon nitride) may be disposed on the layer of insulating oxide, and another layer of insulating oxide may be disposed on the layer of insulating nitride. The structure of the hard mask layer 105' may be adapted depending on process (e.g., patterning) requirements.

Referring to FIG. 12, FIG. 13A, and FIG. 13B, the stacked layers are patterned to form bit line structures 106 (e.g. 106a, 106b, 106c and 106d), for example via one or more photolithography and etching steps. In some embodiments, a patterned mask layer 101 may be formed on the hard mask layer 105'. The patterned mask layer 101 may have the shape of parallel strips extending along the Y direction and disposed at a distance from each other along the X direction. The patterned mask layer 101 may include a photoresist material, and may be formed by a sequence of deposition, exposure, and developing steps. The pattern of the patterned mask layer 101 is initially transferred to the hard mask layer 105' to form hard mask layers 105", through one or more etching steps. The pattern of the hard mask layer 105" is then transferred to the underlying layers, stopping at the dielectric layer 103'. As a result, bit lines 104 including conductive layers 104a and 104b are formed. Among the underlying layers, the conductive layers 104a and 104 may have substantially the same width along the X direction as the hard mask layer 105" after patterning, but is not limited thereto. As discussed above, the conductive layers 104b may be thinner than the corresponding adjacent conductive layers 104a. Taking as an example the bit line stack 106, if the conductive layers 104a and 104b are considered to have thicknesses $T_{104a}$, and $T_{104b}$, respectively, the thickness ratio of each of the conductive layer 104a to the conductive layer 104b (e.g., $T_{104a}/T_{104b}$) ranges from about 20:1 to 1:1, e.g., from 10:1 to 5:1. All the thicknesses of the disclosure are measured along the (vertical) Z direction (e.g., normal to the top surface of the ILD layer 80 or conductive line 84A).

The patterned mask layer 101 is removed, and spacers 108 are formed on sidewalls of the bit line stacks 106. The material of the spacers 108 is different from the material of the conductive layer 104b', so that selective etching between the two layers may be possible. For example, portions of the spacers 108a may be selectively removed with respect to the conductive layer 104b'. The spacers 108a may be formed by suitable deposition processes, such as ALD, CVD, or the like, and anisotropic etching process. The spacers 108a may be a single layer or a composite layer. In some embodiments, the spacers 108a includes at least one layer of an insulating oxide, such as silicon oxide. When the spacers 108a has a composite structure, layers of different materials may be stacked over each other. For example, a layer of insulating oxide may be disposed on the sidewalls of the bit line structures 106, a layer of an insulating nitride (e.g., silicon nitride) may be disposed on the layer of insulating oxide, and another layer of insulating oxide may be disposed on the layer of insulating nitride. The structure of the spacers 108a may be adapted depending on subsequent process (e.g., pull-back) requirements.

Referring to FIG. 13B, isolation walls 120 are formed over the dielectric layer 103. The isolation walls 120 extend along the X direction perpendicular to the bit line stacks 106, and are disposed between the bit line stacks 106 for word line isolation. In some embodiments, the formation method of the isolation walls 120 includes the following steps. An insulating material layer is formed over and between the bit line stacks 106 by suitable deposition processes, such as ALD, CVD, or the like. The insulating material layer may be a single layer or a composite layer. In some embodiments, the insulating material layer includes at least one layer of an insulating oxide, such as silicon oxide. A planarization process such as etching back, grinding or chemical-mechanical polishing is performed to remove portions of the insulating material layer until the hard mask layers 105" are exposed. Following the planarization of insulating material layer, the insulating material layer is patterned to form the isolation walls 120. The isolation walls 120, the spacer 108a, and the bit line stacks 106 define word line openings OP1.

In FIG. 14A and FIG. 14B, a pull-back process PB1 is performed on the hard mask layer 105" and the spacers 108a to form hard mask layers 105 and spacers 108b. As a result, the bit lines 104 in regions 107A' and 107A are exposed by the hard mask layer 105 and the spacers 108b. The bit lines 104 in regions 107A' and 107A include portions of top surfaces $104T_1$ and $104T_2$ of the bit lines 104, corners α1 and α2, and top sidewalls $104St_1$ and $104St_2$ of the bit lines 104 respectively. The pull-back process PB1 may be an anisotropic etching process. For the sake of clarity, some layers such as the isolation walls 120 are not shown in FIG. 14B. Following the pull-back process PB1, the sidewalls of the bit line stacks 106 of the memory array TN have staircase structures SC1 and SC2.

Referring to 15A and 15B, a data storage structure 110, an interlayer 112, a selector 113, and conductive portions 114P and 114D are formed over the dielectric layer 103 and fill the word line openings OP1 between bit line stacks 106 and the isolation walls 120. In some embodiments, the data storage structure 110 is formed along horizontally extending surfaces and vertically extending surfaces of the plurality of bit-line stacks 106a-106d and the spacers 108b. In some embodiments, the data storage structure 110 may also be formed along horizontally extending surfaces of the dielectric layer 103. In some such embodiments, the data storage structure 110 may be formed to continuously extend over the plurality of bit-line stacks 106a-106d. In various embodiments, the data storage structure 110 may comprise a high-k dielectric layer. For example, the data storage structure 110 may comprise hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. In other embodiments, the data storage structure 110 may comprise a phase change memory layer comprising a chalcogenide material such as GST (e.g., $Ge_2Sb_2Te_5$), N-doped GST, Si doped GST, InGeSbTe, doped arsenic (As), doped carbon (C) or the like. In yet other embodiments, the data storage structure 110 may comprise a magnetic tunnel junction, a ferroelectric material, or the like. In some embodiments, the data storage structure 110 may be formed by way of one or more deposition processes (e.g., PVD, CVD, PE-CVD, ALD, etc.).

The selector 113 is formed over the data storage structure 110. In some embodiments, the selector 113 comprises a threshold type selector (e.g., an ovonic threshold switch (OTS)). In some such embodiments, the selector 113 comprises a binary material (e.g., SiTe, GeTe, CTe, BTe, ZnTe, AlTe, or the like), a ternary material (e.g., GeSeAs, GeSeSb, GeSbTe, GeSiAs, or the like), and/or a quaternary material (e.g., GeSeAsTe, GeSeTeSi, GeSeTeAs, or the like). In other embodiments, the selector 113 comprises a voltage conductive bridge (VCB) selector. In some such embodiments, the selector 113 comprises a layer of Ag and $HfO_2$, layers of Cu and $HfO_2$, layers of Al and $SiO_2$, layers of Ag and $TaO_2$, or the like. In other embodiments, the selector 113 comprises an exponential type selector comprising $TiO_2$, $Ta_2O_5$, NiO layers of TiN and Si, or the like. In some embodiments, the selector 113 comprises a threshold type selector and an overlying exponential type selector stacked onto one another. In yet other embodiments, the selector 113 comprises a filament based selector, rectifier, varistor-type selector, doped-chalcogenide-based selector, Mott effect based selector, mixed-ionic-electronic-conductive (MIEC)-based selector, field-assisted-superliner-threshold (FAST) selector, a voltage conductive bridge (VCB) selector, an exponential type selector, or the like. In various embodiments, the selector 113 have a thickness that is between approximately 10 nm and approximately 20 nm, between approximately 20 nm and approximately 40 nm, or other suitable values.

In some embodiments, the interlayer 112 is formed on the data storage structure 110 before the selector 113 is formed. In various embodiments, the interlayer 112 comprises a metal layer, and the metal layer of the interlayer 112 and the selector 113 have a same one or more metals. For example, the selector 113 includes a binary material (for example, SiTe, GeTe, CTe, BTe, ZnTe, AlTe, or the like), and the interlayer 112 may include Te. For example, the selector 113 includes a ternary material (for example, GeSeAs, GeSeSb, GeSbTe, GeSiAs, or the like), and the interlayer 112 may include Ge. For example, the selector 113 includes a quaternary material (for example, GeSeAsTe, GeSeTeSi, GeSeTeAs or the like), and the interlayer 112 may include Ge, Se, or Ge and Se. In other some embodiments, the interlayer 112 comprises a metal layer, and the metal layer of the interlayer 112 and the selector 113 have different metals. For example, the selector 113 includes a binary material (for example, SiTe, GeTe, CTe, BTe, ZnTe, AlTe, or the like), a ternary material (for example, GeSeAs, GeSeSb, GeSbTe, GeSiAs, or the like) or a quaternary material (for example, GeSeAsTe, GeSeTeSi, GeSeTeAs or the like), and the interlayer 112 may include tungsten (W), titanium (Ti), tantalum (Ta), titanium nitride (TiN), tantalum nitride (TaN), or the like, or a combination thereof.

Referring to FIGS. 15A and 15B, conductive portions 114P and 114D are formed on the selector 113 to fill the word line openings OP1 between bit line stacks 106 and the isolation walls 120. In some embodiments, the formation method of the conductive portions 114P and 114D includes the following steps. A conductive material layer is formed over the dielectric layer 103, so as to bury the structure of FIG. 14A and FIG. 14B, filling the word line openings OP1 between bit line stacks 106 and the isolation walls 120. The conductive material layer may include any suitable conductive material, such as, for example, tungsten (W), cobalt (Co), nickel (Ni), copper (Cu), aluminum (Al), titanium (Ti), tantalum (Ta), alloys thereof, silicides thereof, or a combination thereof. In some embodiments, the conductive material layer includes tungsten. The conductive material layer may be formed by any suitable process, such as ALD, CVD, electroplating, or the like. A planarization process such as grinding or chemical-mechanical polishing is performed to remove portions of the conductive material layer until top surfaces of the isolation walls 120 and the hard mask layer 105 are exposed. For example, following the planarization of the conductive material layer, the isolation layers 120 and the hard mask layers 105 may be once again exposed, and the conductive portions 114P and 114D may be formed in between adjacent isolation walls 120. The conductive portions 114P and 114D are alternately arranged and extend along the X direction perpendicular to the bit line stacks 106, so that each conductive portions 114P and 114D contacts bit line stacks 10. The data storage structure 110, the interlayer 112, and the selector 113 remain between the conductive portions 114P and the isolation walls 120, between the conductive layers 114D and the isolation walls 120, between the conductive portions 114P and the bit line stacks 106, as well as the conductive layers 114D and the bit line stacks 106. The conductive portions 114P may be used as parts of word line 114, while the conductive layers 114D may be used dummy word lines.

Figure 16:
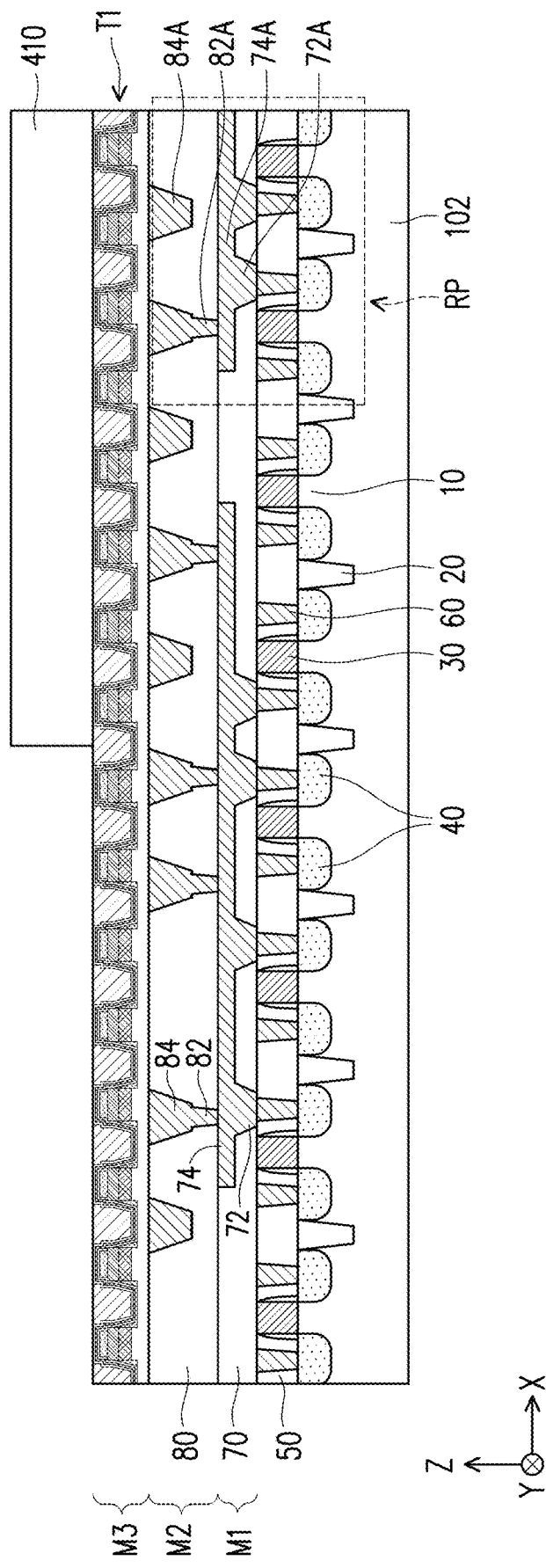
Figure 17:
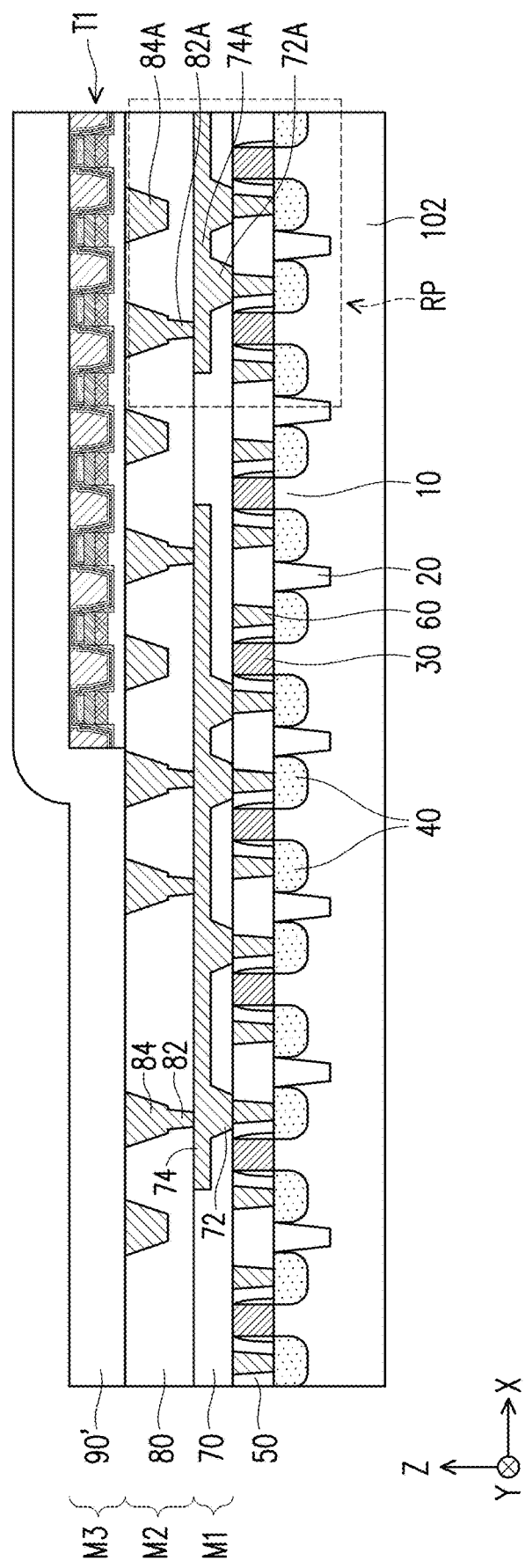

FIG. 16 to FIG. 19 are schematic cross-sectional views taken in the same plane as FIG. 10 to FIG. 11. In FIG. 16 and FIG. 17, it is shown that the memory array T1 may be disposed on the metallization level M2, and may initially cover most if not all of the metallization level M2. Referring to FIG. 16 and FIG. 17, in some embodiments a mask layer 410 is formed on part of the memory array T1, and the part of the memory array T1 left exposed by the mask layer 410 is removed, for example by suitable etching processes, to expose once again the metallization level M2. After etching, the memory array T1 remains in the region covered by the mask layer 410, which mask layer 410 is subsequently removed. In some embodiments, the mask layer 410 may include a photoresist material, and be formed through a sequence of deposition, exposure, and developing steps.

Figure 18:
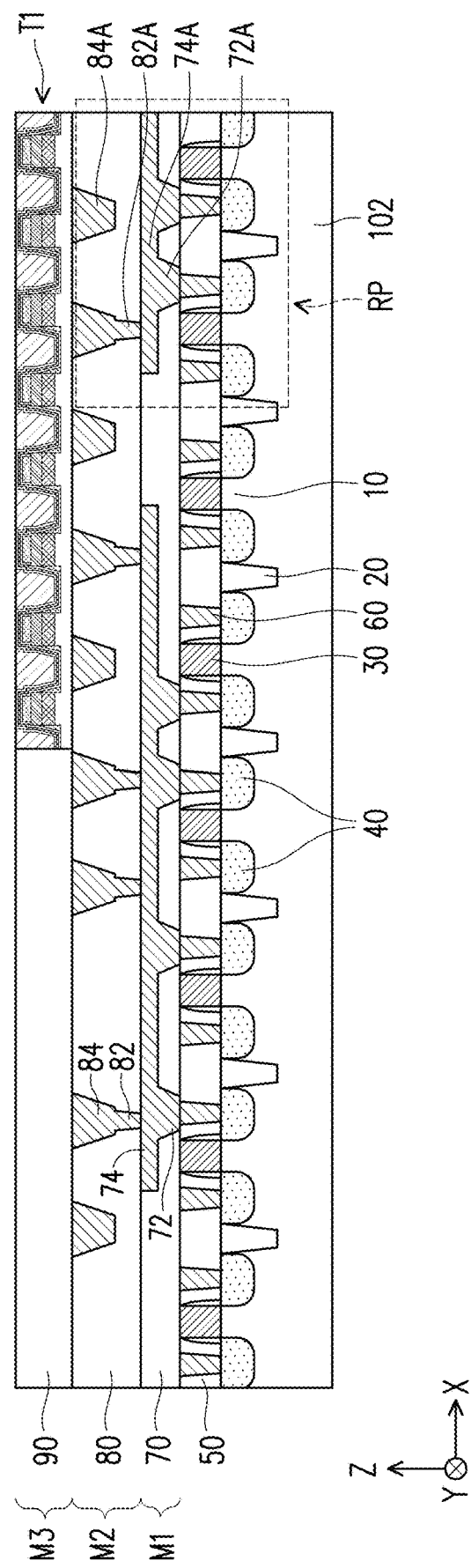
Figure 19:
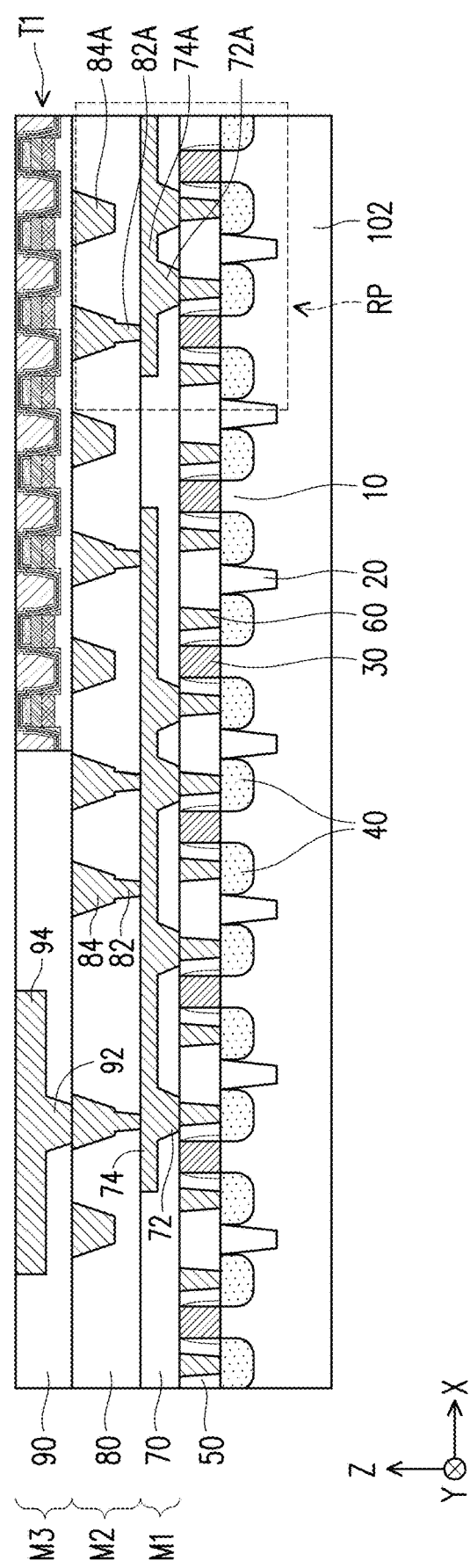
Figure 20:
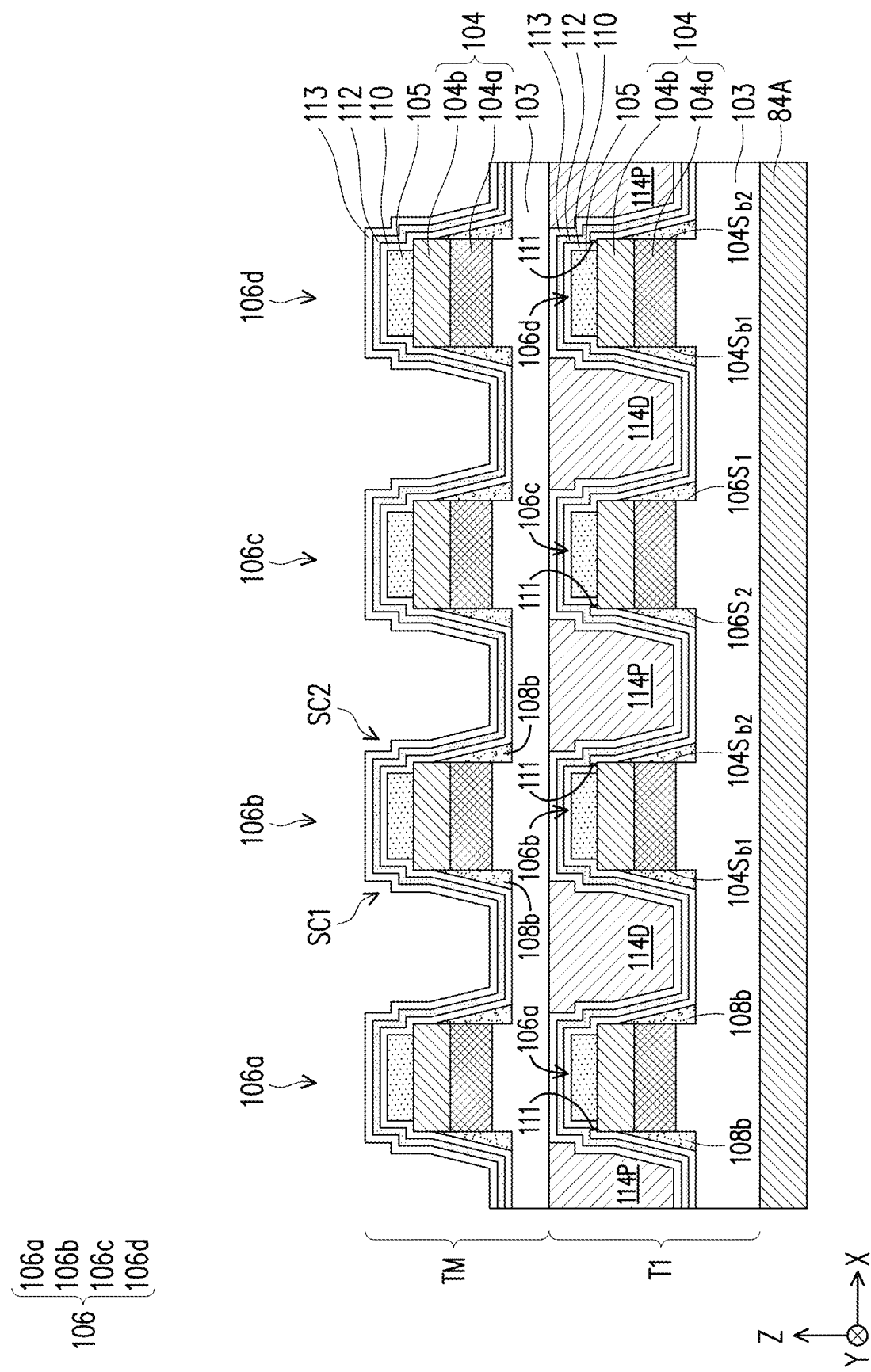

In FIG. 17, the ILD layer 90' is blanketly formed on the exposed portion of the metallization level M2 and on the memory array T1. Materials and processes to form the ILD layer 90' may be selected from the same options previously described for the dielectric layer 50. Referring to FIG. 17 and FIG. 18, the ILD layer 90 has been obtained by planarizing the ILD layer 90' until the memory array T1 is once again exposed. Planarization of the ILD layer 90' may be performed through any suitable process, such as grinding, chemical mechanical polish, or the like. In FIG. 19, the conductive vias 92 and the conductive lines 94 are formed in the ILD layer 90, for example via single or dual damascene process.

Figure 21:
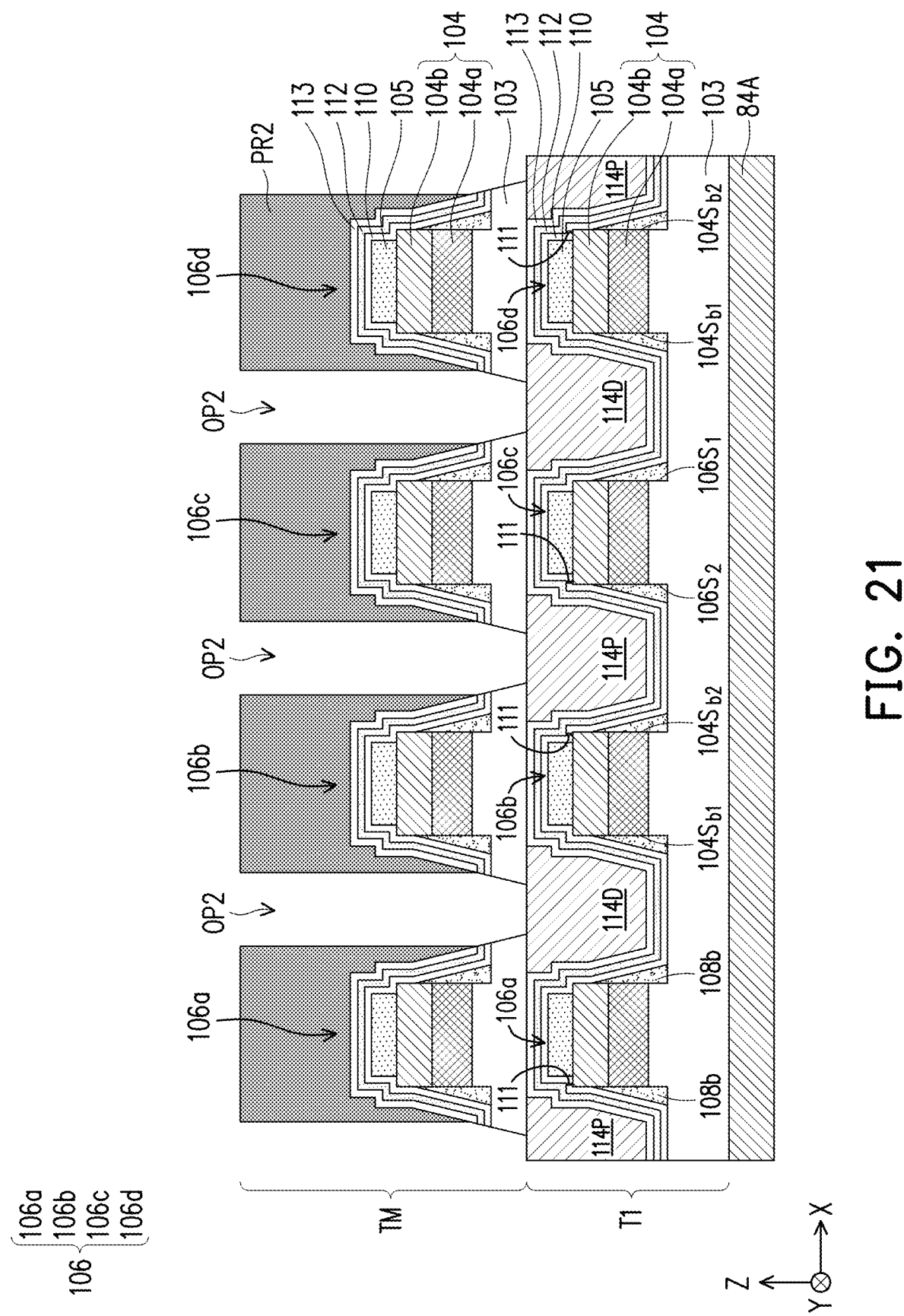
Figure 22A:
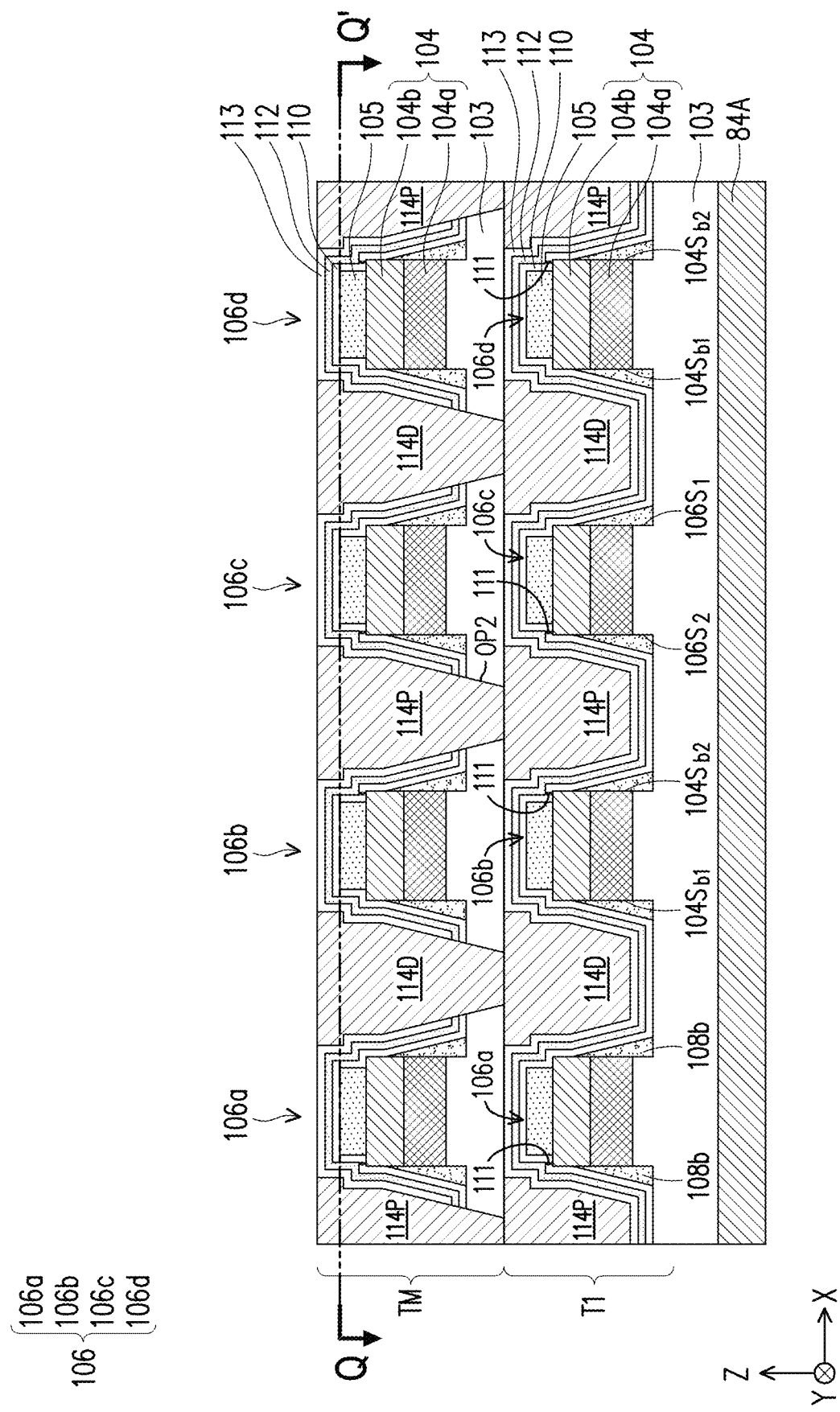
Figure 22B:
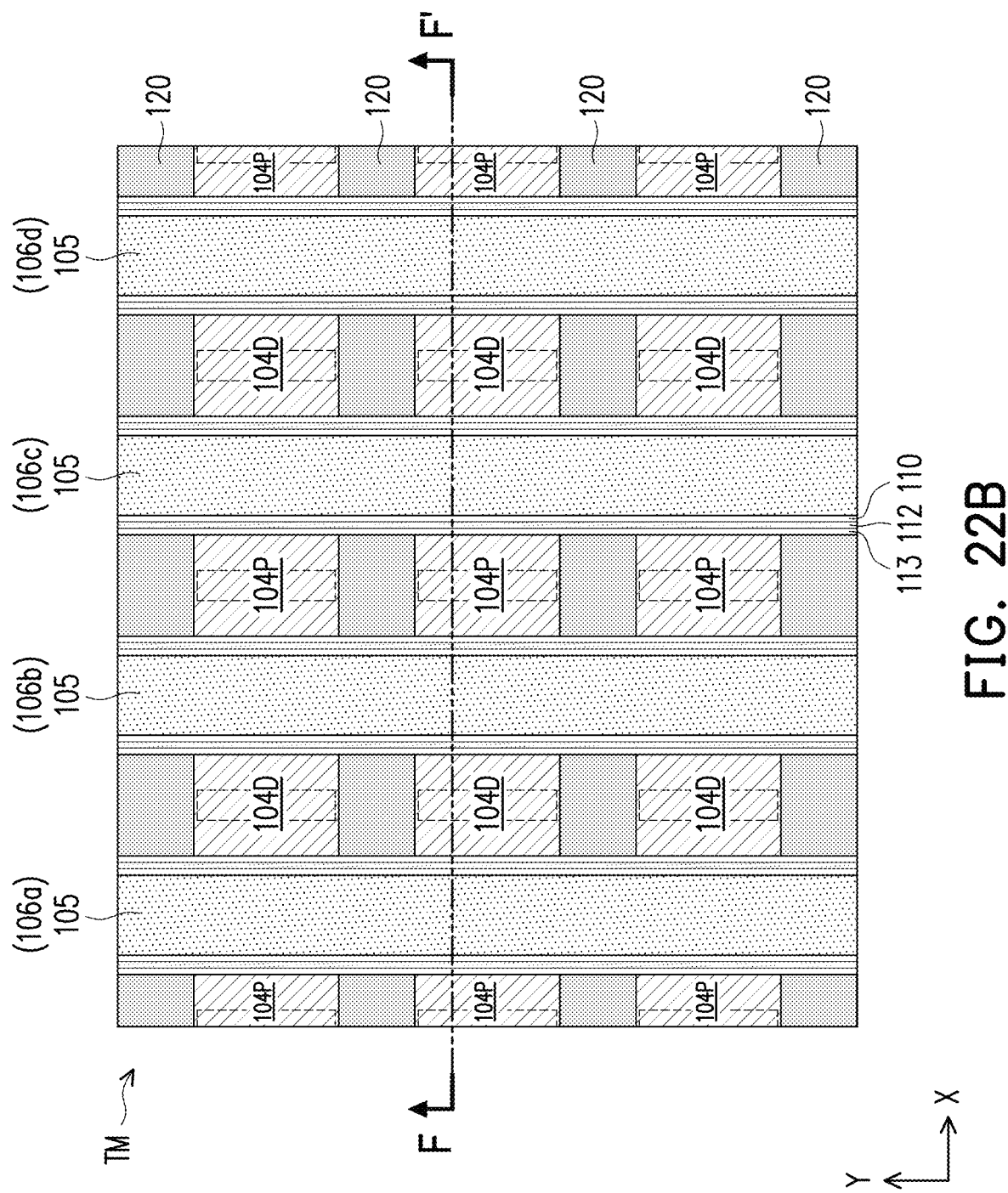

FIG. 20 to FIG. 22B are schematic views of a region of the semiconductor device SD10 in which a memory array TM is being manufactured. FIG. 22A illustrates a cross-sectional view of the memory array TM along line F-F' of a top-view of the memory array TM shown in FIG. 22B. FIG. 22B illustrates the top-view of the memory array TM along line Q-Q' of the cross-sectional view of the memory array TM shown in FIG. 22A.

In FIG. 20 to FIG. 22B, a dielectric layer 103, bit line stacks 106 having staircase structures SC1 and SC2, spacers 108b, isolation walls 120, a data storage structure 110, an interlayer 112, a selector 113, and conductive portion 114P and 114D of the memory array TM are formed over the memory array T1, and may have similar structures to those of the memory array T1. The operations described with reference from FIG. 12 to FIG. 15B may be repeated to form the memory array TM. A difference between the memory array T1 and the memory array TM of FIGS. 22A and 22B lies in that the conductive portion 114P and 114D of the memory array TM penetrate the selector 113, the interlayer 112, the data storage structure 110 and the dielectric layer 103 of the memory array TM to connect to the conductive portion 114P and 114D of the memory array T1 respectively. The conductive portion 114P and 114D of the memory array TM may include the following steps.

Referring to FIG. 21, a mask layer PR2 is formed on parts of the selector 113 of the memory array TM. The mask layer PR2 may include a photoresist material, and be formed through a sequence of deposition, exposure, and developing steps. The part of the selector 113 exposed by the mask layer PR2, and the underlying layers (i.e., the interlayer 112, the data storage structure 110 and the dielectric layer 103 of the memory array TM) are removed, for example by suitable etching processes, to form opening OP2 exposing the conductive portion 114P and 114D of the memory array T1. In FIGS. 22A and 22B, after the mask layer PR2 is removed, the conductive portion 114P and 114D of the memory array TM are formed in spaces between the bit line stacks 106 and fill in the openings OP2 to be electrically connected to the conductive portion 114P and 114D of the memory array T1 respectively.

Figure 23:
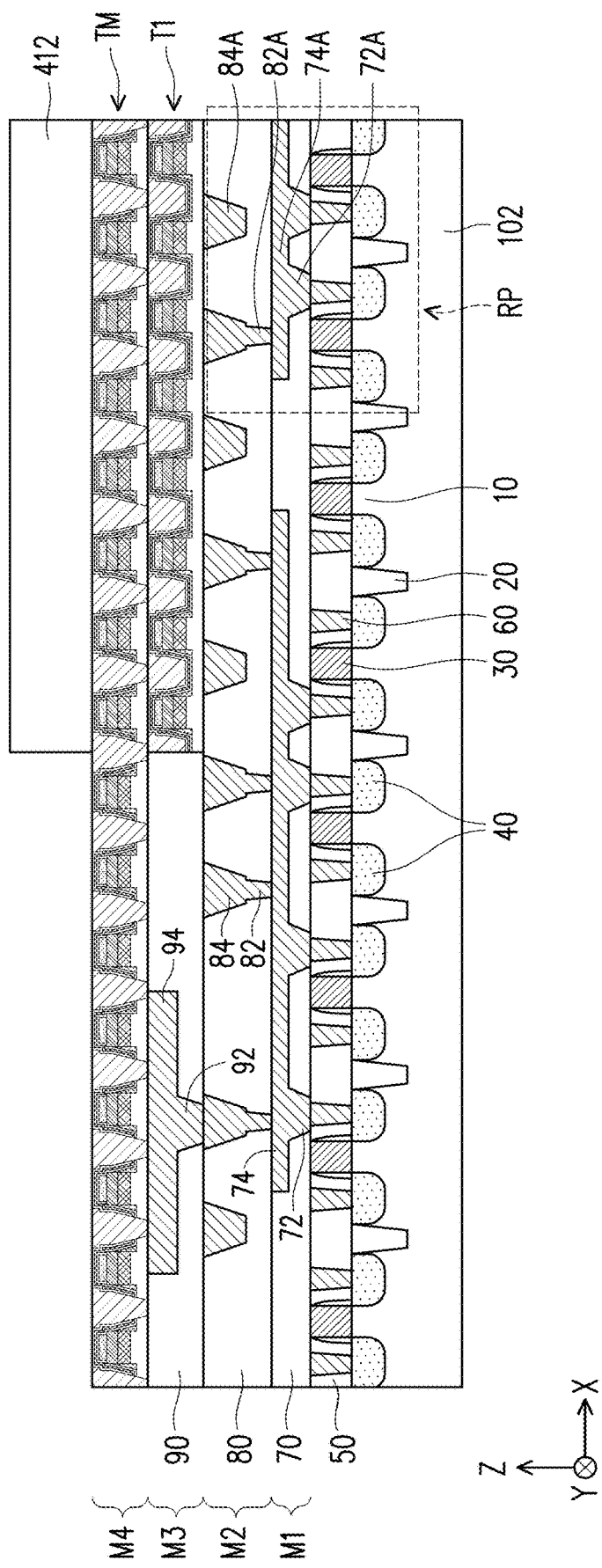
Figure 24:
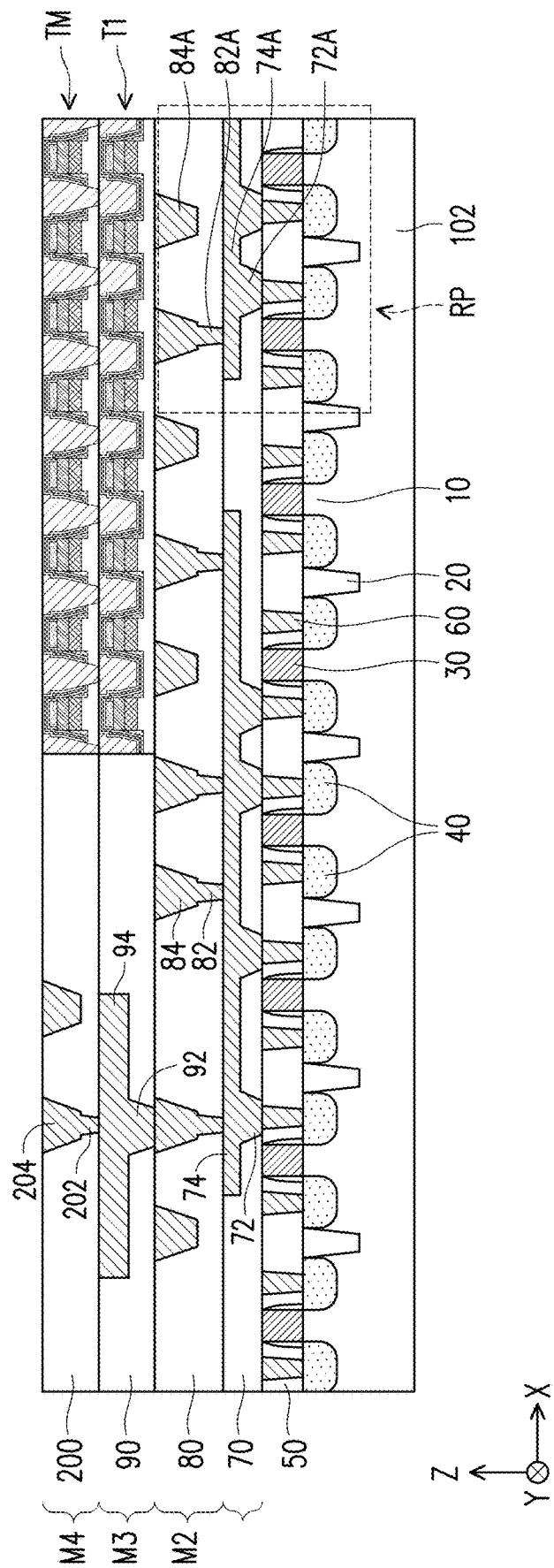

FIG. 23 to FIG. 24 are schematic cross-sectional views taken in the same plane as FIG. 10 to FIG. 11, and FIG. 16 to FIG. 19. In FIG. 23, it is shown that the memory array TM may be formed in the metallization level M4. Referring to FIG. 23 and FIG. 24, in some embodiments a mask layer 412 is formed on part of the memory array TM, and the part of the memory array TM left exposed by the mask layer 412 is removed, for example by suitable etching processes, to expose once again the metallization level M3. The operations described with reference from FIG. 17 to FIG. 19 may be repeated to form the ILD layer 200, the conductive vias 202, and the conductive lines 204 are formed beside the memory array TM.

FIG. 25A to FIG. 33B are schematic views of a region of the semiconductor device SD10 in which a memory array TN is being manufactured. FIG. 25A to FIG. 33A illustrate cross-sectional views of the memory arrays TN along lines G-G' to N-N' of top-views of the memory arrays TN shown in FIG. 25B to FIG. 33B. FIG. 25B to FIG. 33B illustrates the top-views of the memory arrays TN shown in FIG. 25A to FIG. 33A.

Figure 25A:
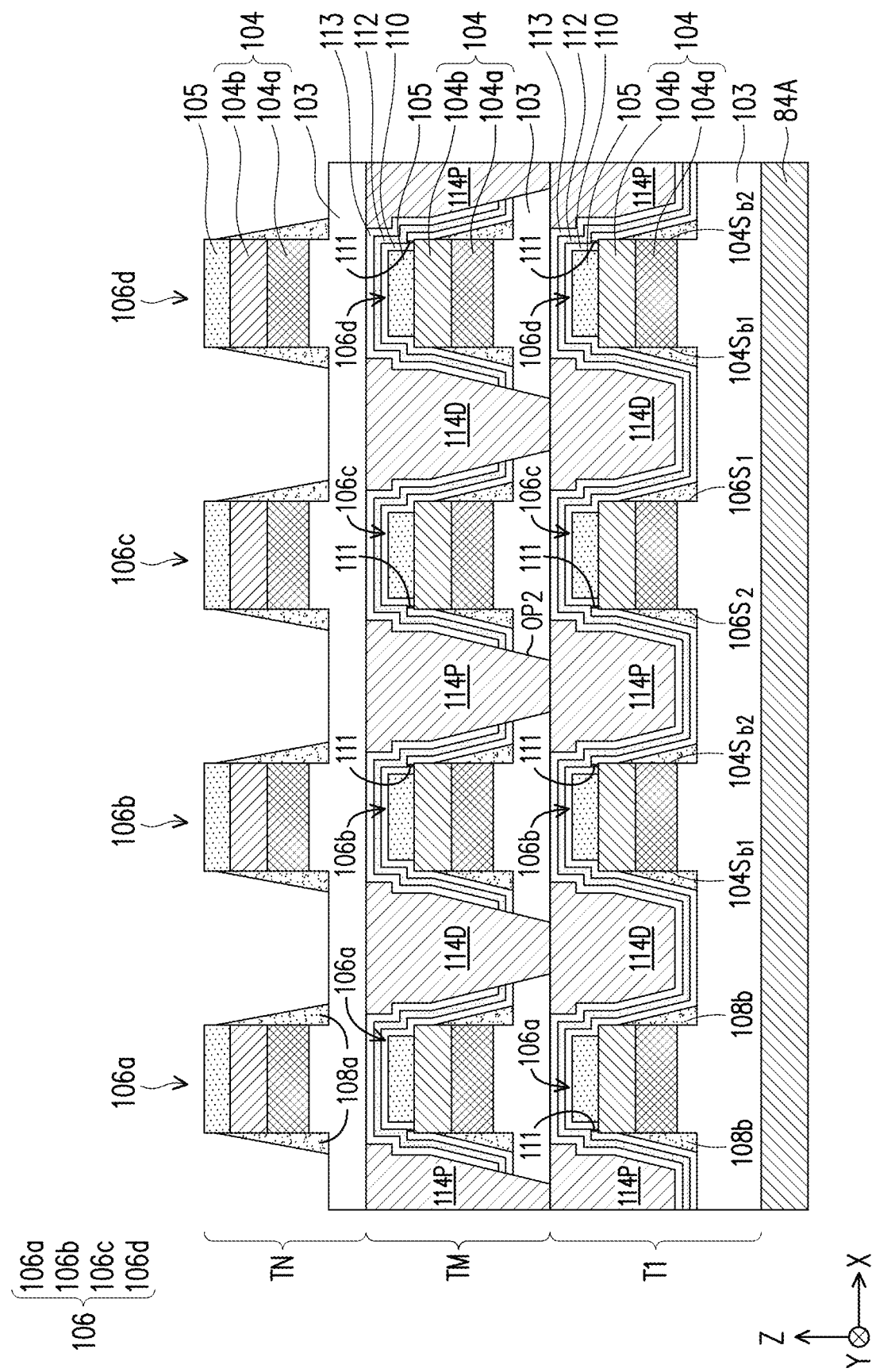
Figure 25B:
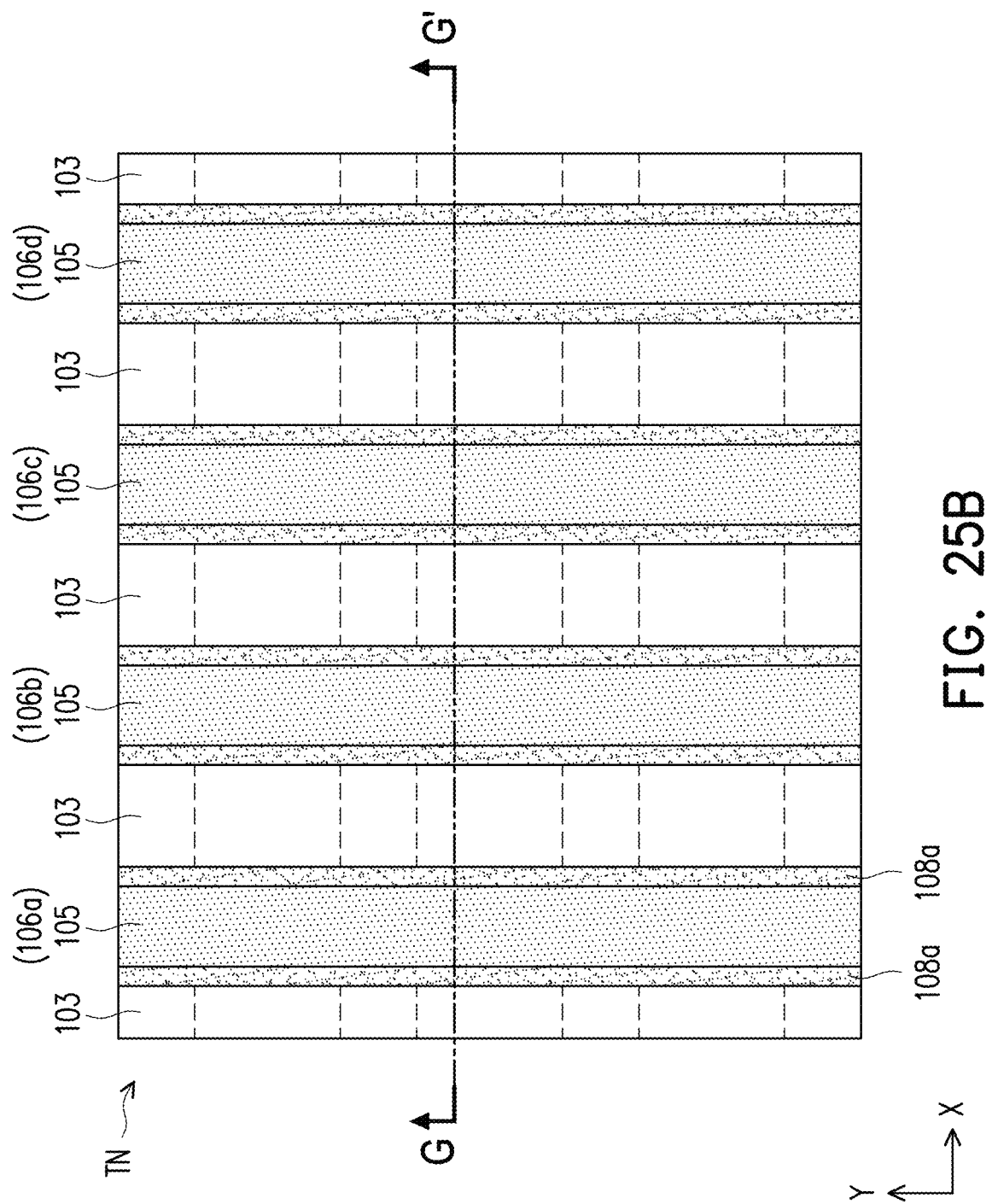

Referring to FIGS. 25A and 25B, a dielectric layer 103, bit line stacks 106, and spacers 108a of the memory array TN may be formed over the memory array TM, and may have similar structures to those of the memory array T1. The operations described with reference from FIG. 12 to FIG.

13B may be repeated to form the dielectric layer 103, the bit line stacks 106, and the spacers 108a of the memory array TN.

Figure 26A:
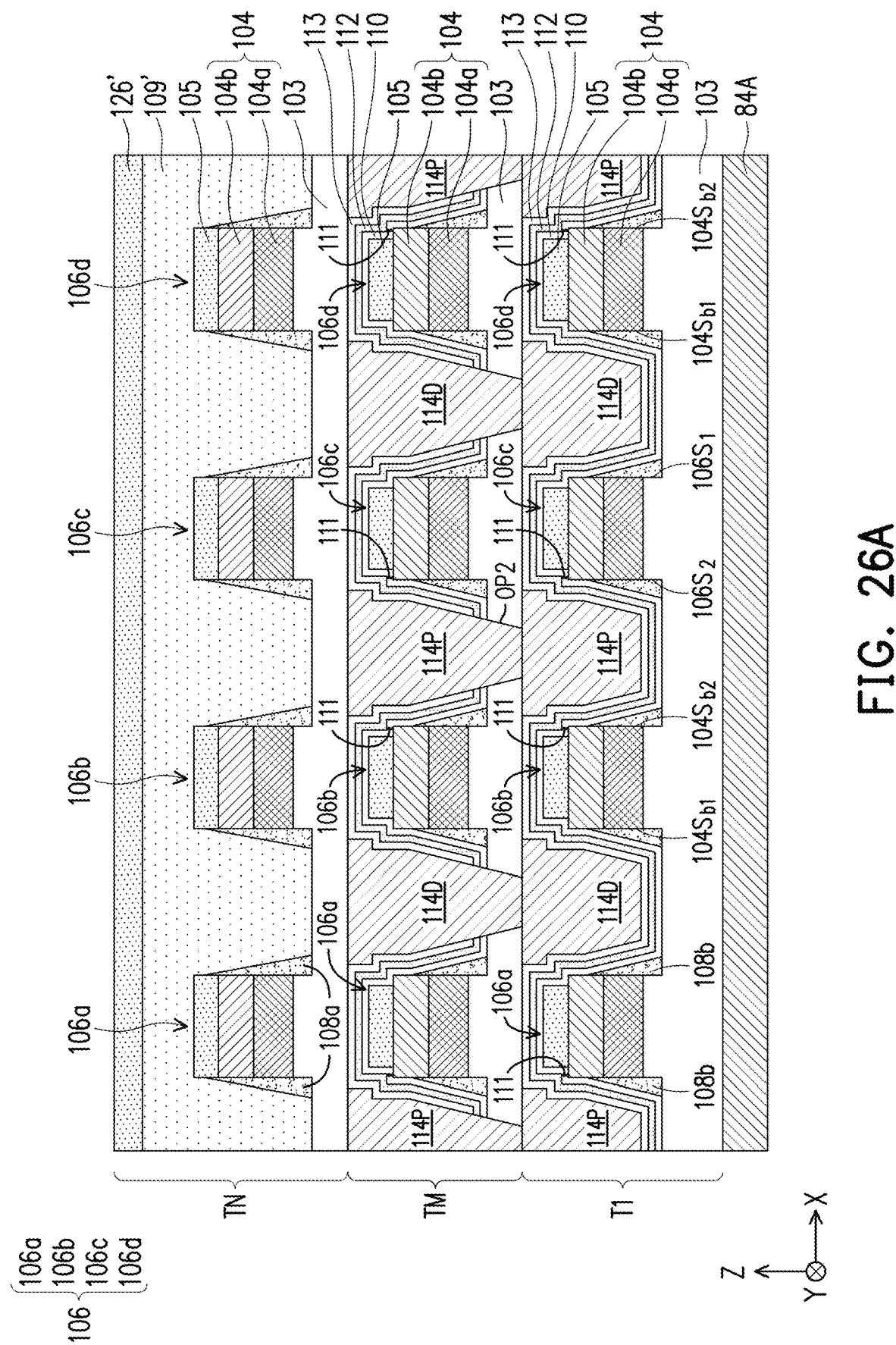
Figure 26B:
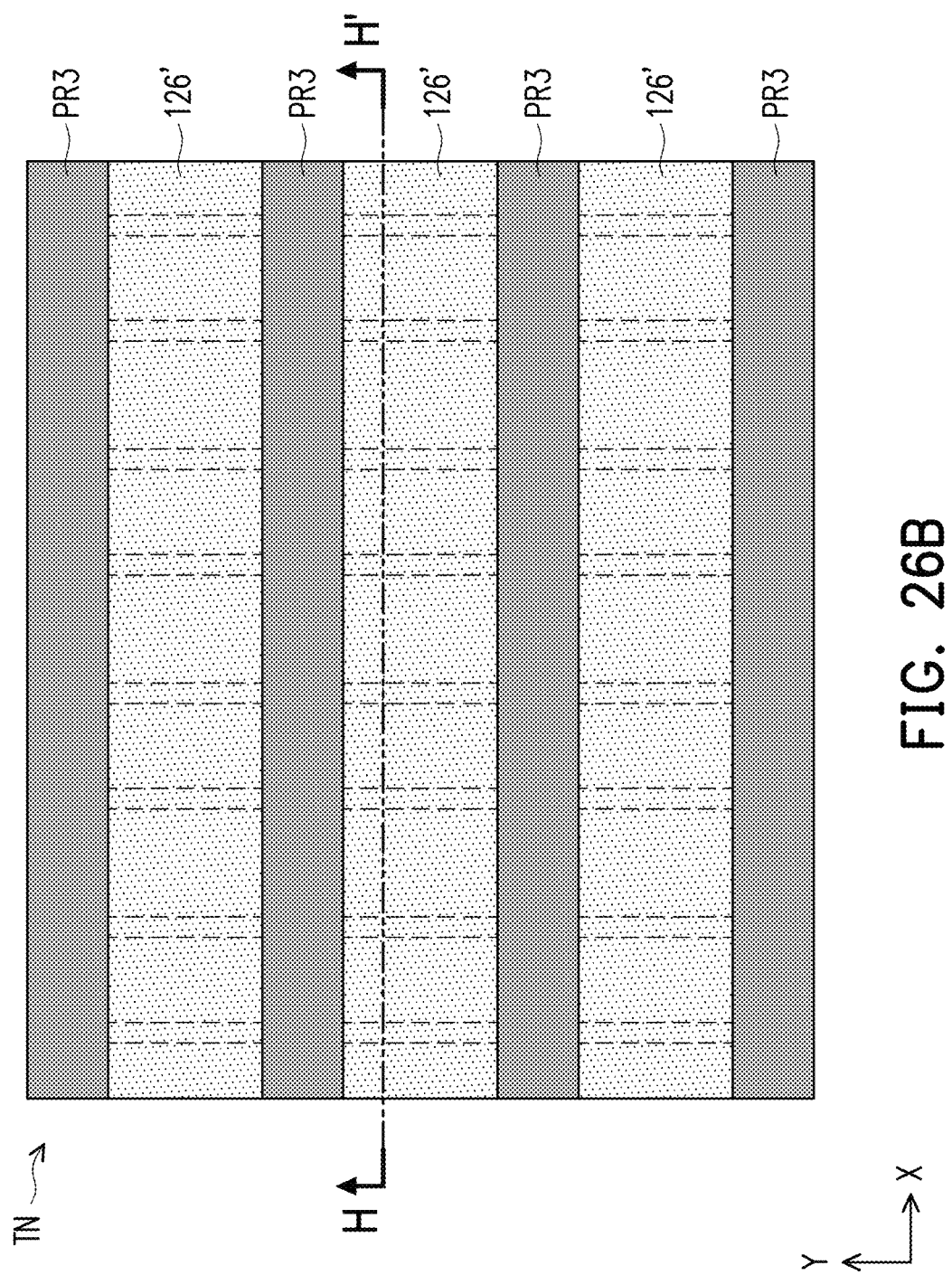

In FIGS. 26A and 26B, a dielectric layer 109' is formed over the bit line stacks 106, spacers 108a, and the dielectric layer 103 of the memory array TN. The dielectric layer 109' includes at least one layer of an insulating oxide, such as silicon oxide. A hard mask layer 126' is formed on the dielectric layer 109'. The hard mask layer 126' includes a material having a lower etching rate in selected conditions with respect to the material of the dielectric layer 109'. For example, the hard mask layer 126' may include silicon oxide, silicon oxynitride, silicon nitride, a combination thereof, or may be other than silicon based, such as aluminum oxide, aluminum nitride, aluminum oxynitride, or the like. The hard mask layer 126' may be formed of a desired thickness, for example in the range from about 5 nm to about 20 nm, by ALD, CVD, or other suitable processes.

Referring to FIG. 26B, in some embodiments a mask layer PR3 extending along the X direction is formed on part of the hard mask layer 126'. The mask layer PR3 exposes portions of the hard mask layer 126' to be removed to form word lines 114a, 114b and 114d shown in FIG. 33B. The mask layer PR3 may include a photoresist material, and be formed through a sequence of deposition, exposure, and developing steps.

Figure 27A:
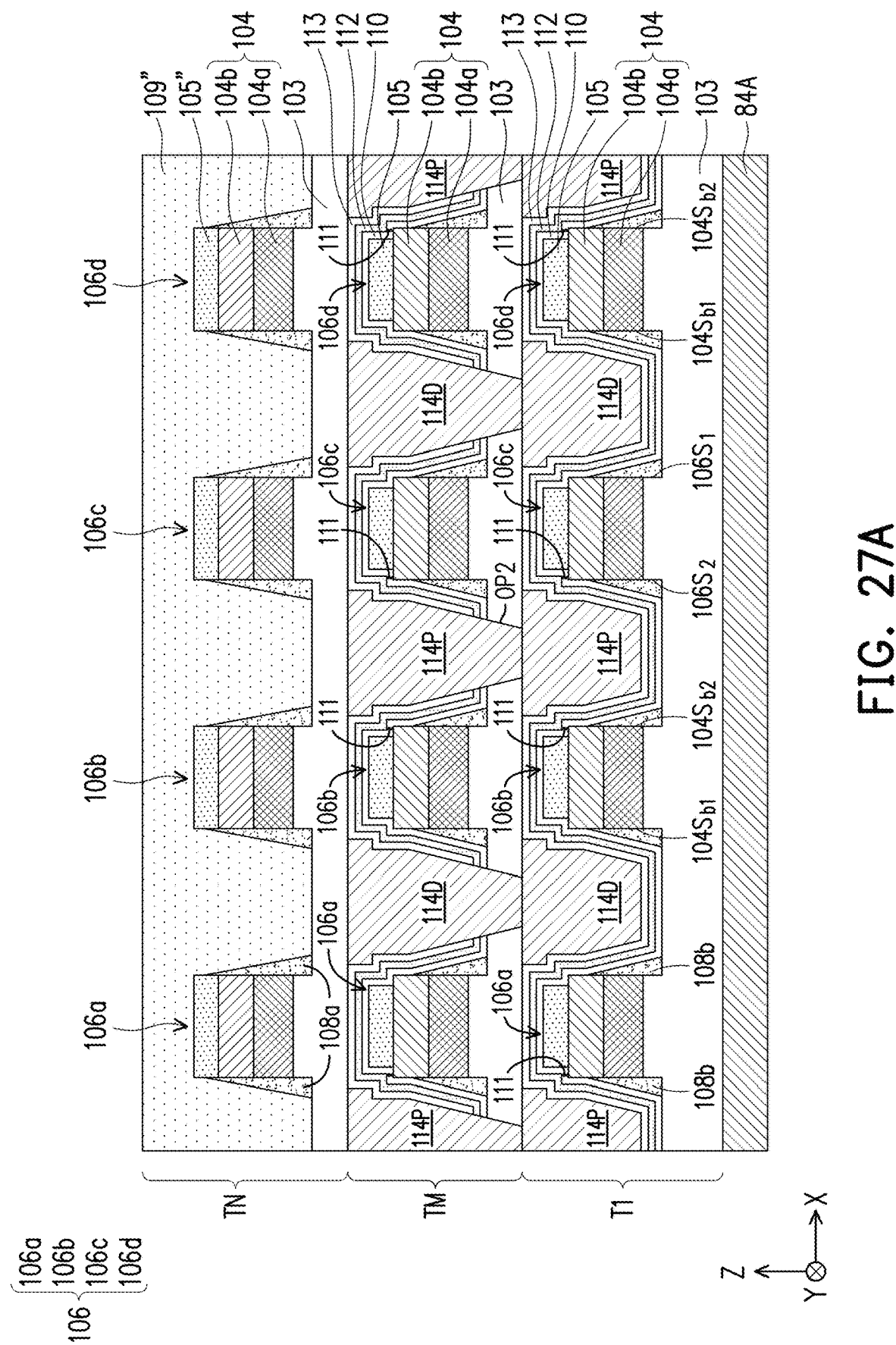
Figure 27B:
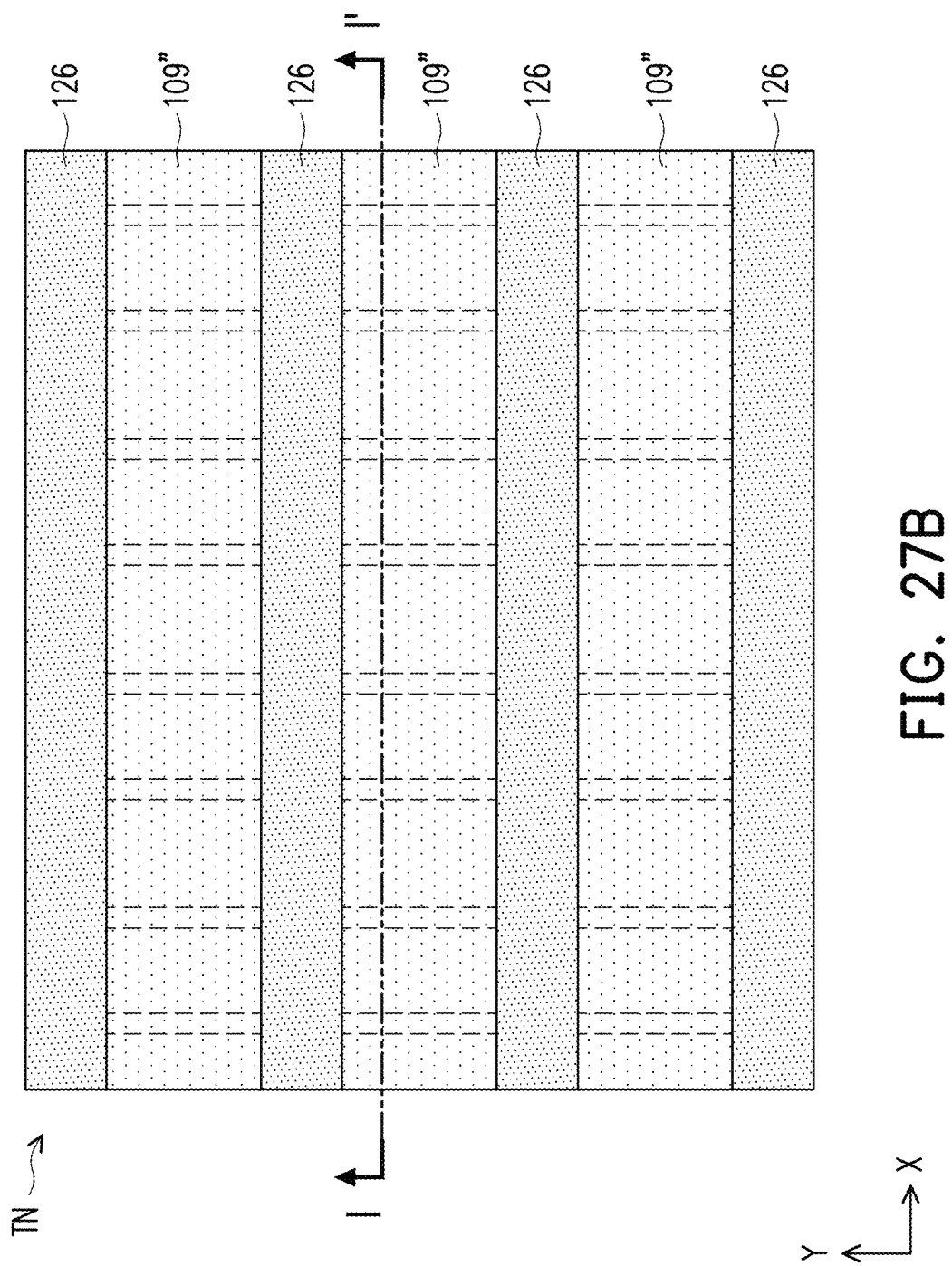

In FIGS. 27A and 27B, the exposed hard mask layer 126' by the mask layer PR3 are removed, for example by suitable etching processes, to expose the dielectric layer 109". After etching, hard mask layer 126 remains in the region covered by the mask layer PR3, which mask layer PR3 is subsequently removed. The hard mask layer 126 and the dielectric layer 109" extend along the X direction respectively, and are alternately arranged along the Y direction.

Figure 28A:
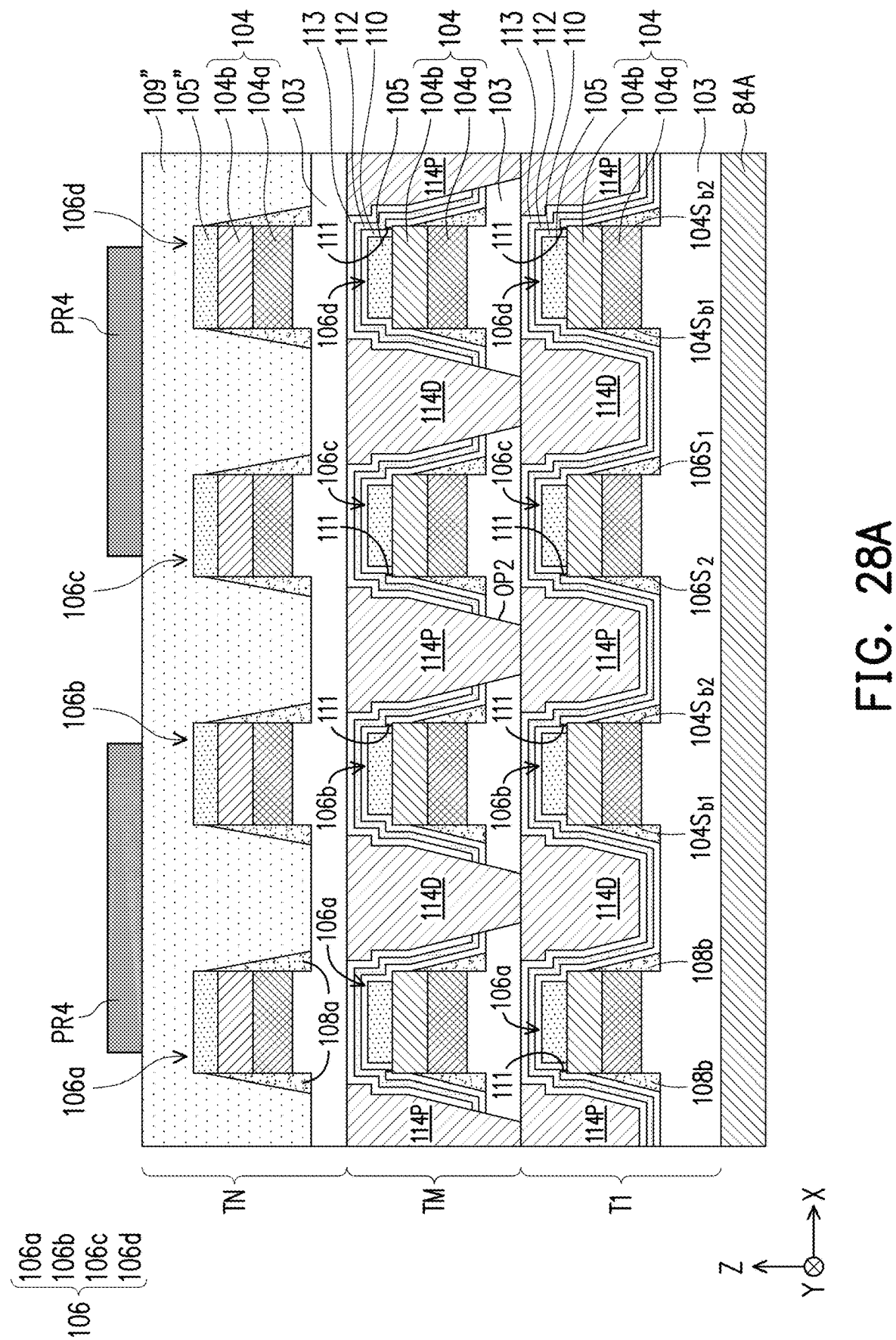
Figure 28B:
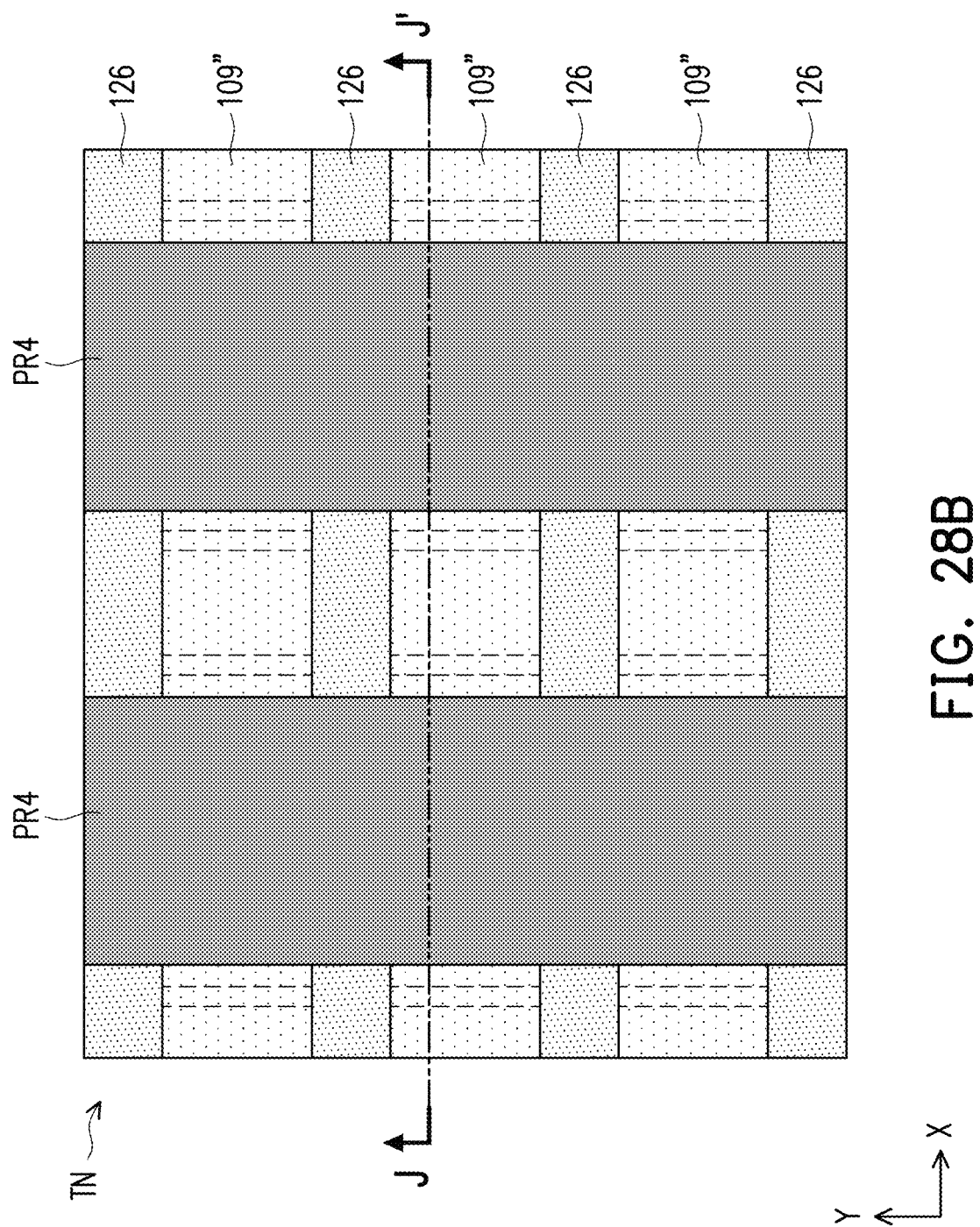

Referring to FIG. 28A and FIG. 28, in some embodiments, a mask layer PR4 extending along the Y direction is formed to cover parts of the hard mask layer 126 and the dielectric layer 109' over the bit line stacks 106a and 106b, and over the bit line stacks 106c and 106d. The mask layer PR4 may include a photoresist material, and be formed through a sequence of deposition, exposure, and developing steps.

Figure 29A:
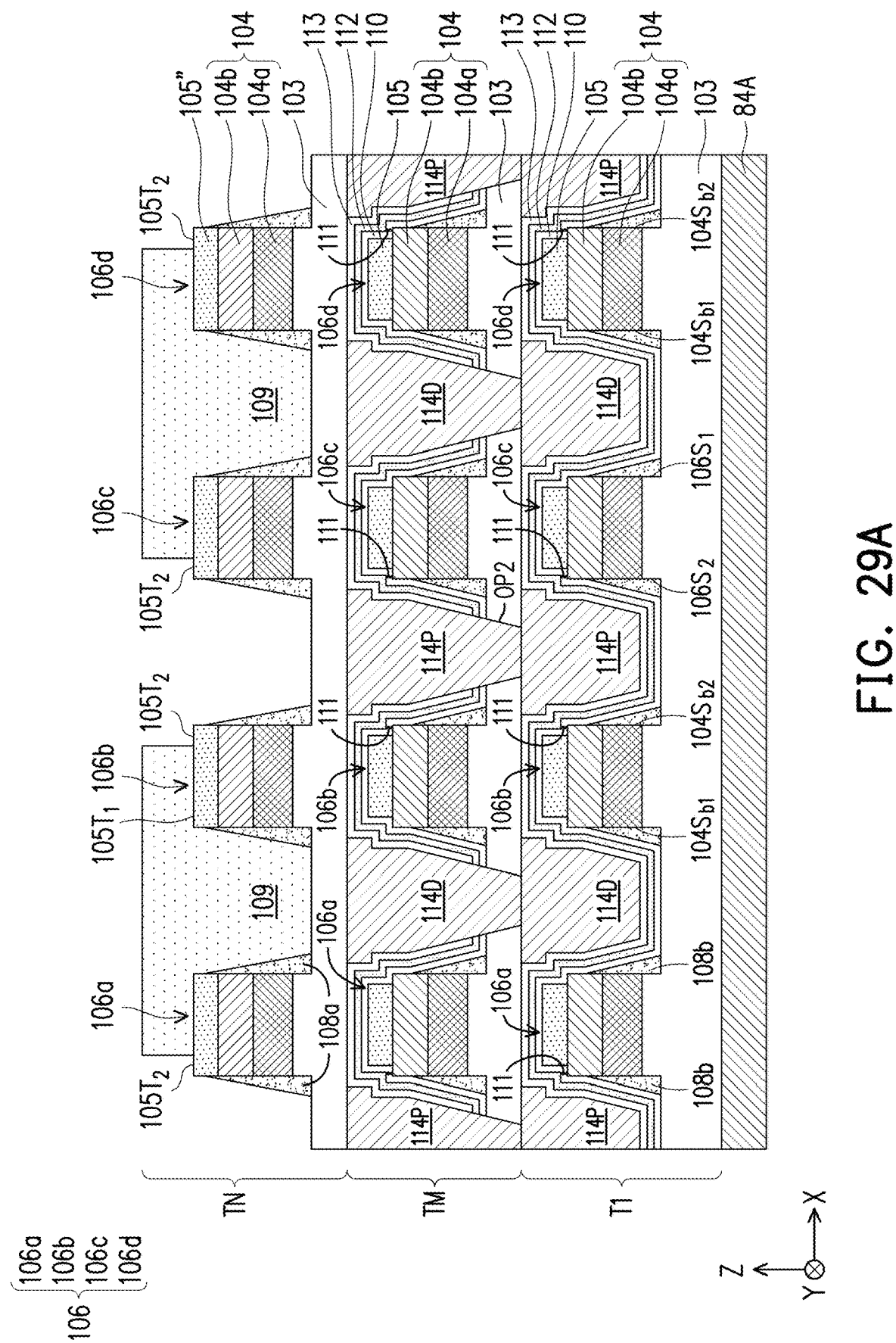
Figure 29B:
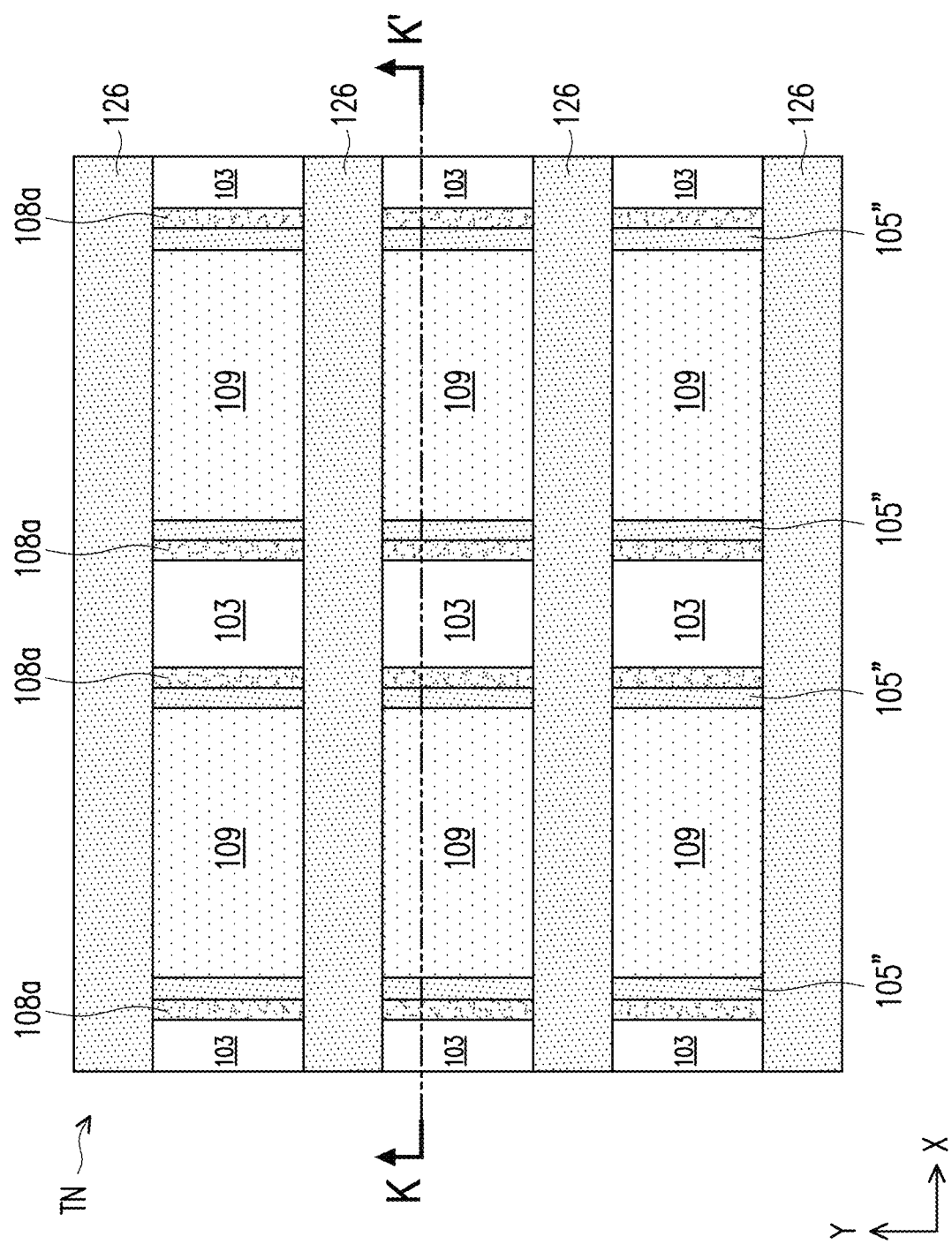
Figure 30:
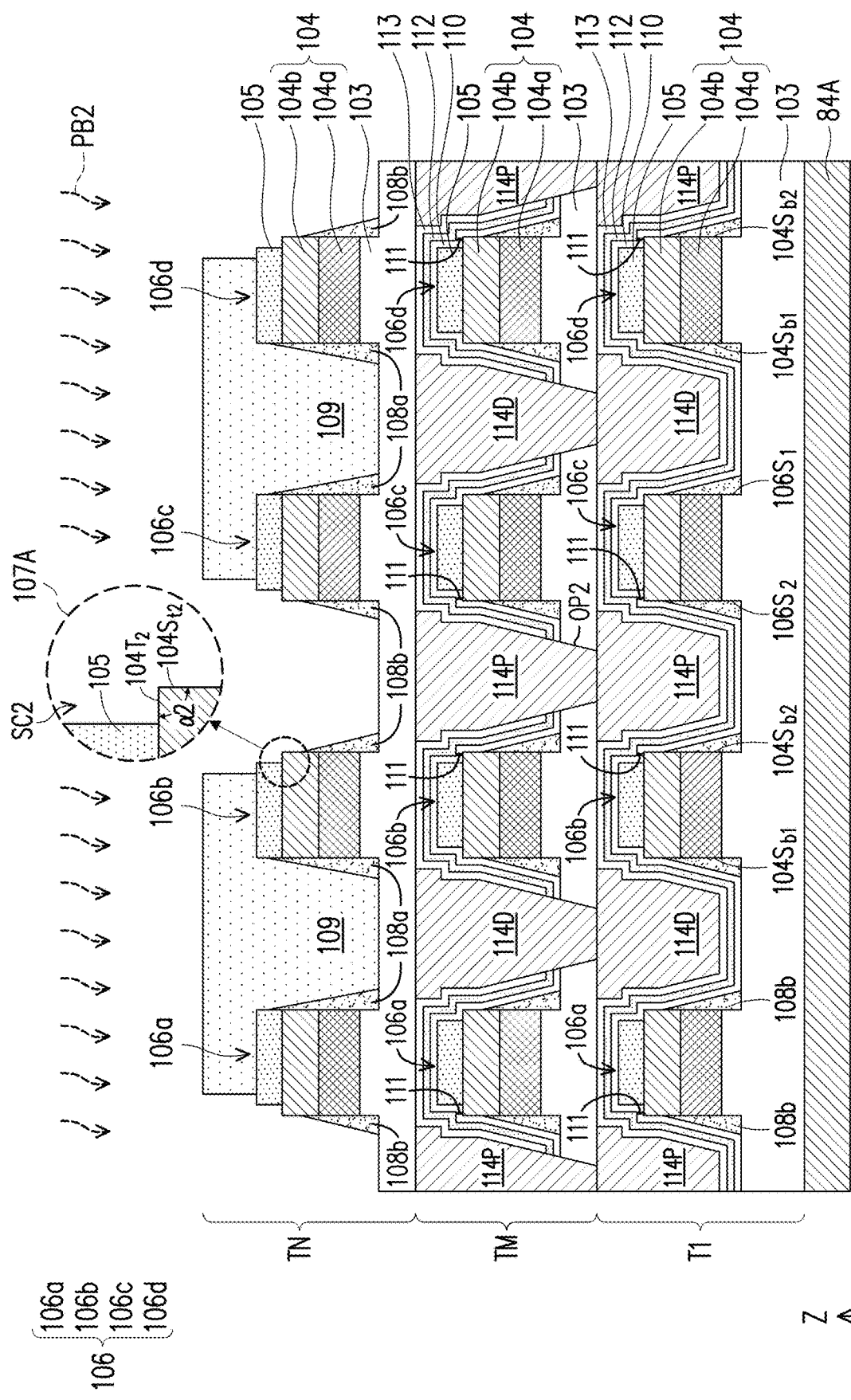

In FIGS. 29A and 29B, using the mask layer PR4 and the hard mask layer 126 as a mask, the parts of the dielectric layer 109" left exposed by the mask layer PR4 are removed, for example by suitable etching processes, to expose portions of top surfaces 105T$_2$ of the hard mask layers 105 and a sidewall of one of the spacers 108a. After etching, the dielectric layers 109 remains in the region covered by the mask layer PR4, which mask layer PR4 is subsequently removed. Portions of top surface 105T$_1$ of the hard mask layers 105, and sidewalls of the spacers 108a between the bit line stacks 106a and 106b, and sidewalls of the spacers 108a between the bit line stacks 106c and 106d are covered by the dielectric layers 109.

A pull-back process PB2 is performed on the hard mask layer 105" and the spacers 108a of the memory array TN to form hard mask layers 105 and spacers 108b. As a result, the bit lines 104 in the regions 107A are exposed by the hard mask layer 105 and the spacers 108b. In the regions 107A, portions of top surface 104T$_2$ of the bit lines 104, corners α2, and top sidewalls 104St$_2$ of the bit lines 104 are exposed by the bit lines 104 and the spacers 108b. The pull-back process PB2 may be an anisotropic etching process. Following the pull-back process PB2, one of the sidewalls of each bit line stack 106 has a staircase structure SC2.

Figure 31A:
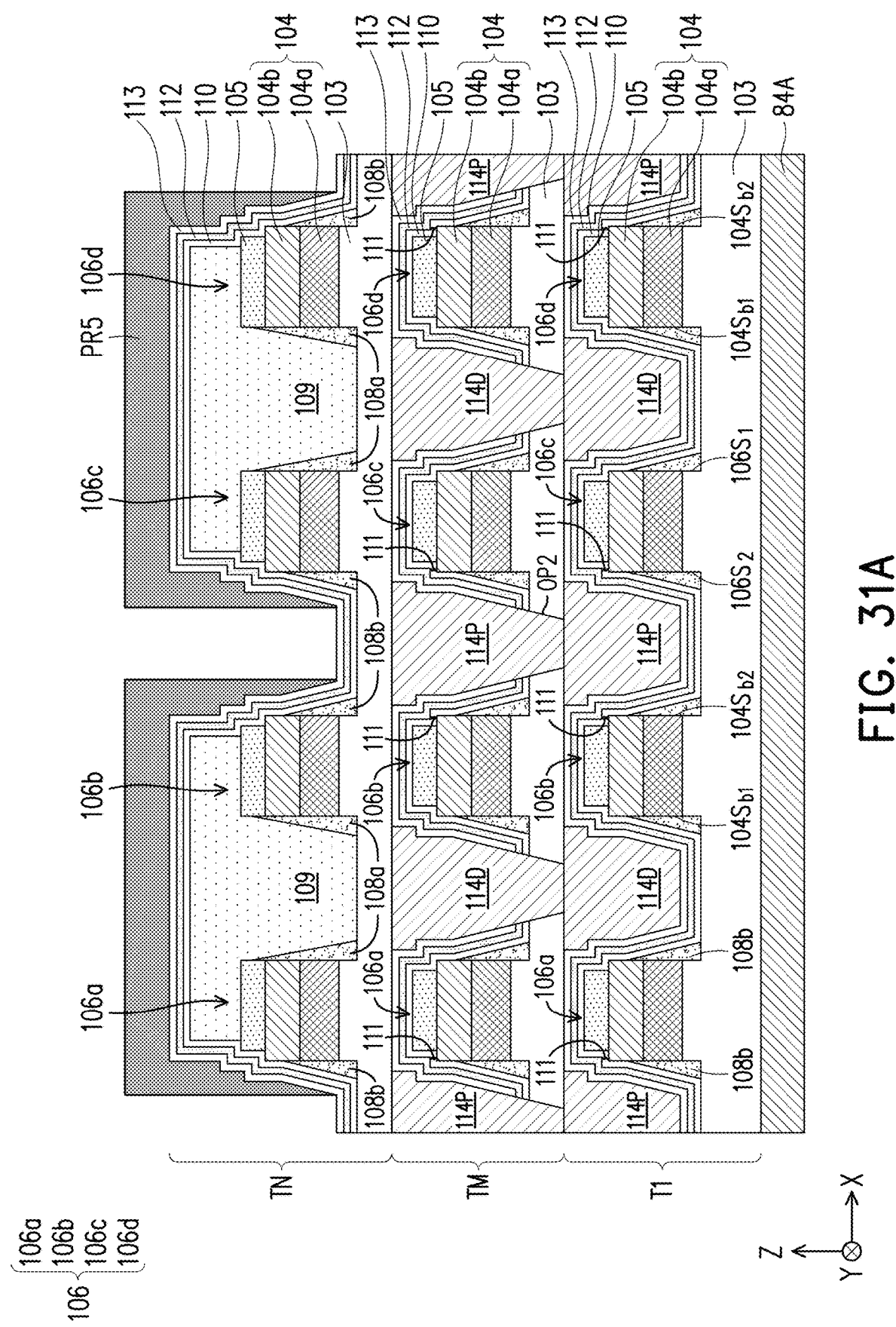
Figure 31B:
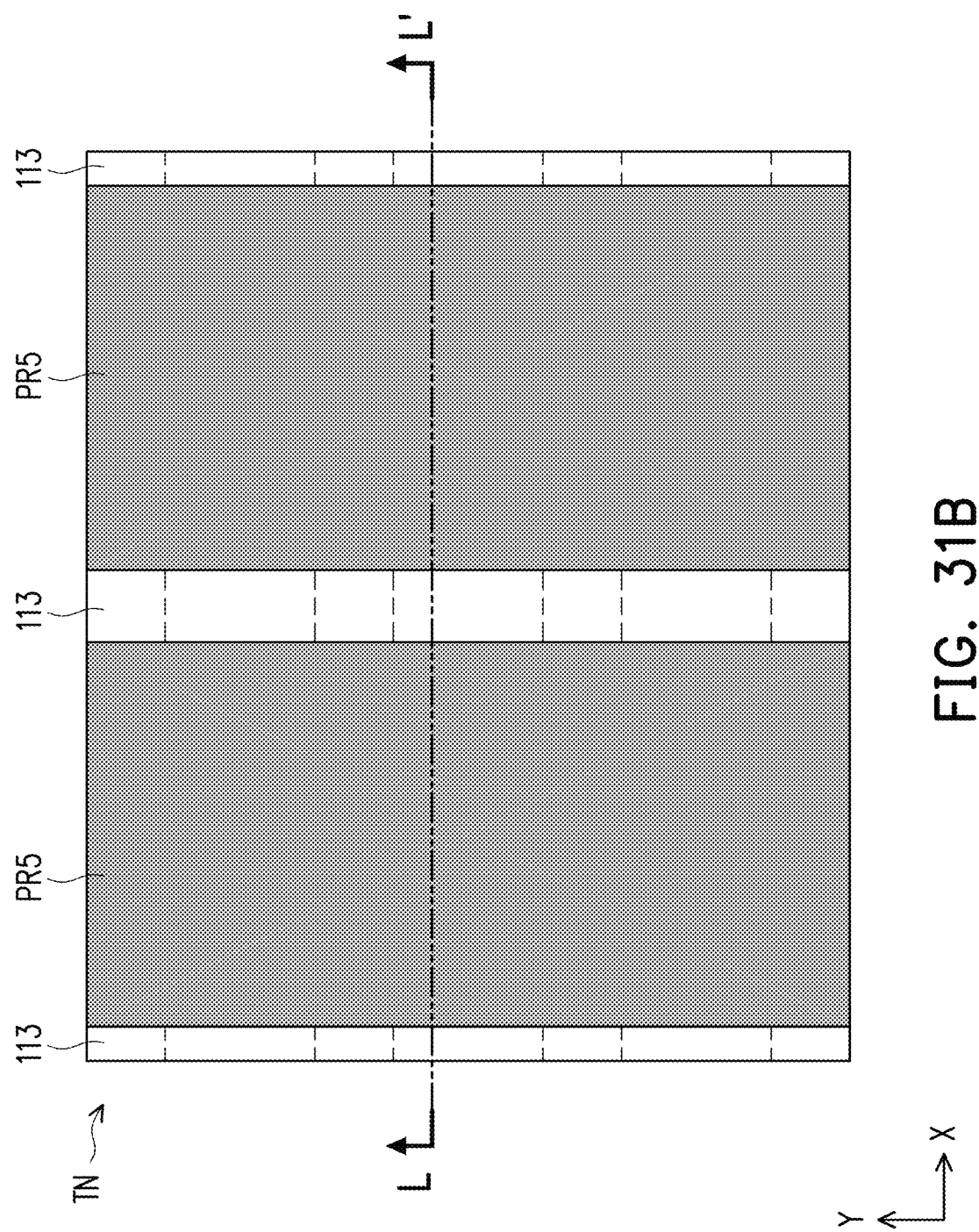

Referring to FIG. 31A and FIG. 31B, a data storage structure 110, an interlayer 112, and a selector 113 of the memory array TN may be formed over the dielectric layer 109 and the bit line stacks 106, and may have similar structures to those of the memory array T1. The operations described with reference FIGS. 15A and 15B may be repeated to form the data storage structure 110, the interlayer 112, and the selector 113 of the memory array TN.

Figure 32A:
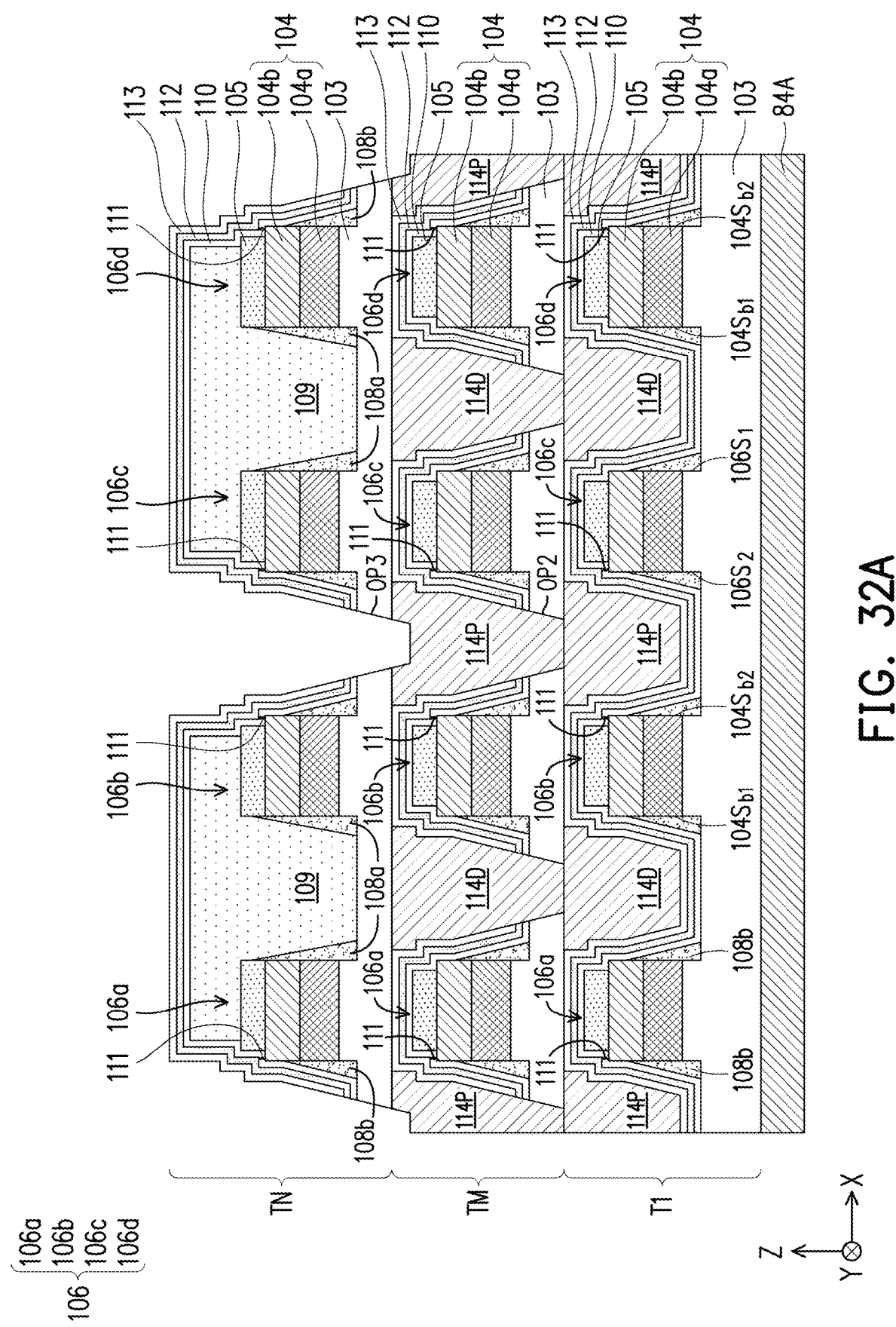
Figure 32B:
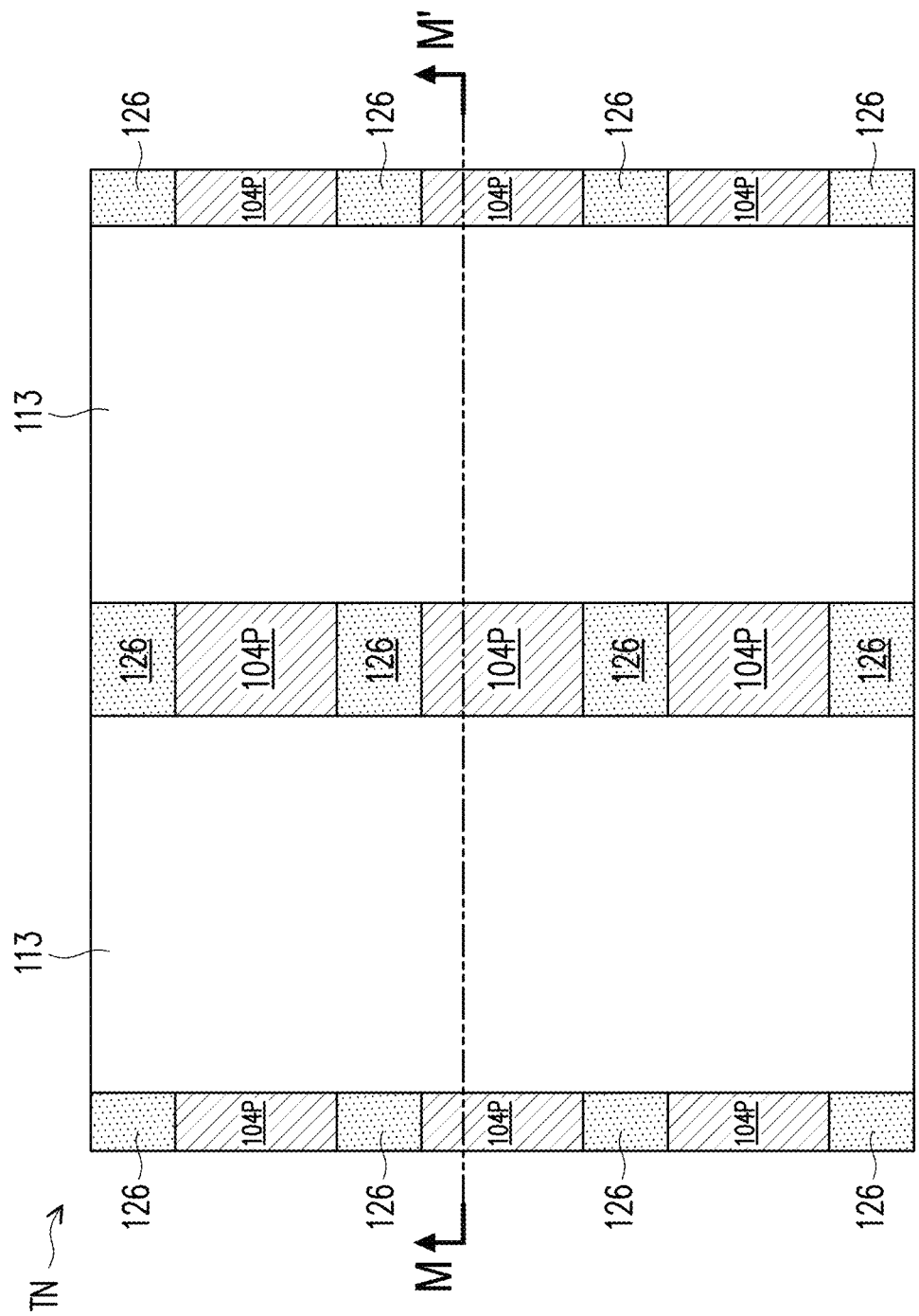
Figure 33A:
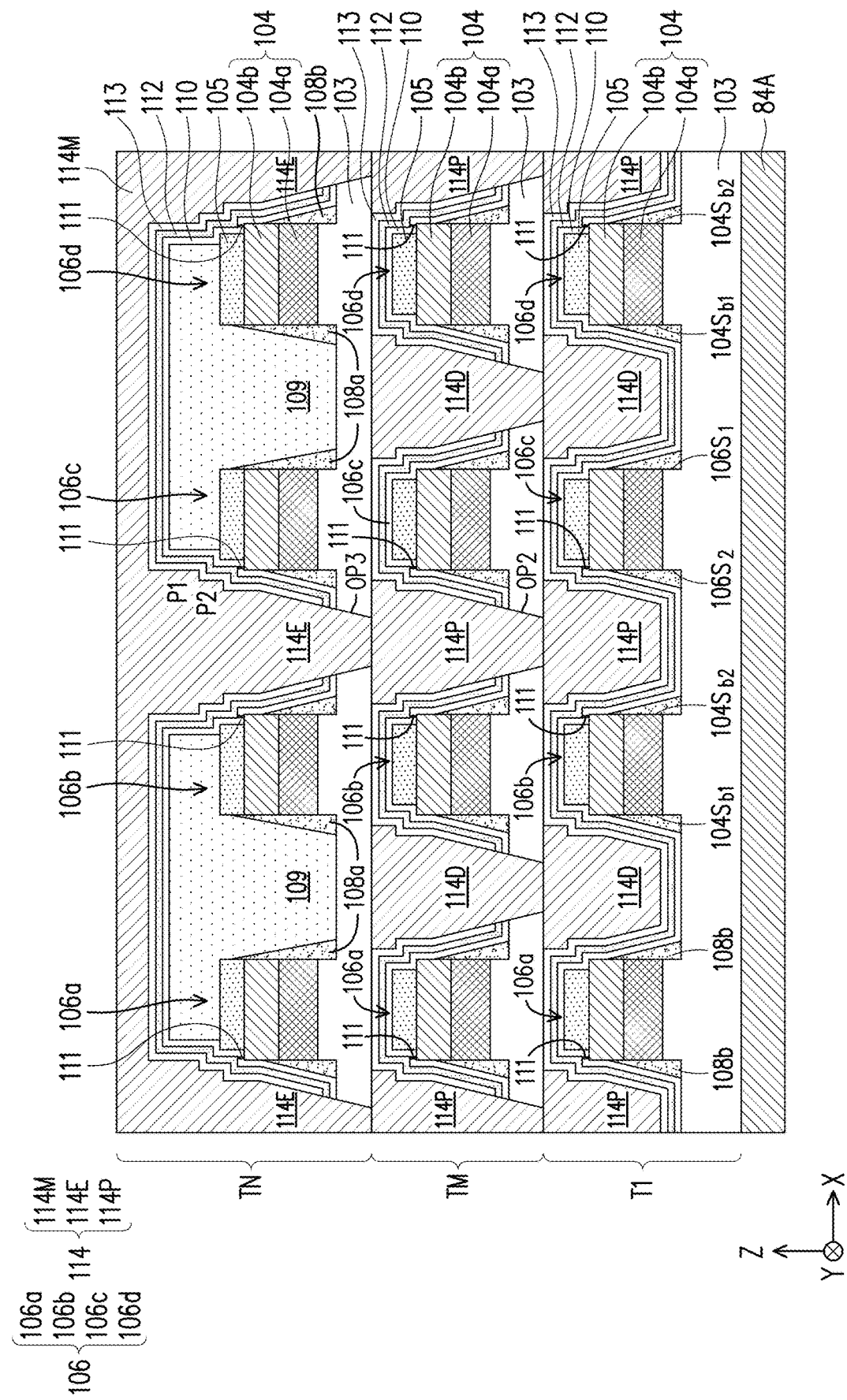
Figure 33B:
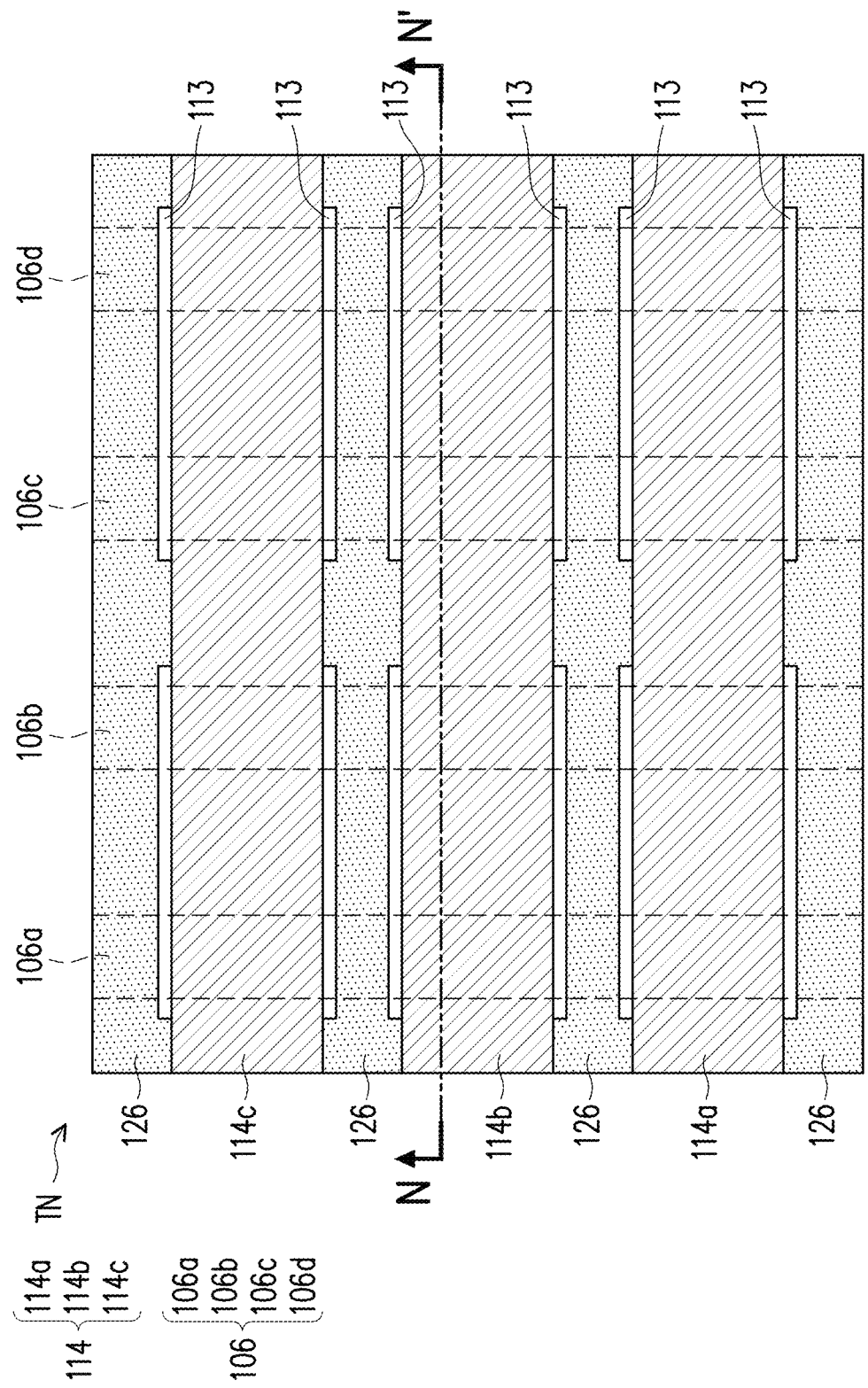

A mask layer PR5 is formed on parts of the selector 113 of the memory array TN. The mask layer PR5 may include a photoresist material, and be formed through a sequence of deposition, exposure, and developing steps. The part of the selector 113 exposed by the mask layer PR5, and the underlying layers (i.e., the interlayer 112, the data storage structure 110 and the dielectric layer 103 of the memory array TN) are removed, for example by suitable etching processes, to form opening OP3, thereby exposing the conductive portion 114P of the memory array TM as shown in FIGS. 32A and 32B.

Referring to FIG. 32A, FIG. 32B, FIG. 33A and FIG. 33B, after the mask layer PR5 is removed, conductive layers 114 of the memory array TN are formed. Each of the conductive layers 114 incudes a body part 114M formed on the selector 113 over the dielectric layer 109. Each of the conductive layers 114 further includes extension parts 104E. The extension parts 104E are disposed in a space between the bit line stacks 106 not covered by the dielectric layer 109 and fill in the openings OP3 to be electrically connected to the conductive portion 114P of the memory array TN. The body parts 114M and the extension parts 104E of the memory array TN, the conductive portions 114P of the memory array TN and the memory array T1 are electrically connected each other and form the word lines 114a, 114b, and 114c.

Figure 34:
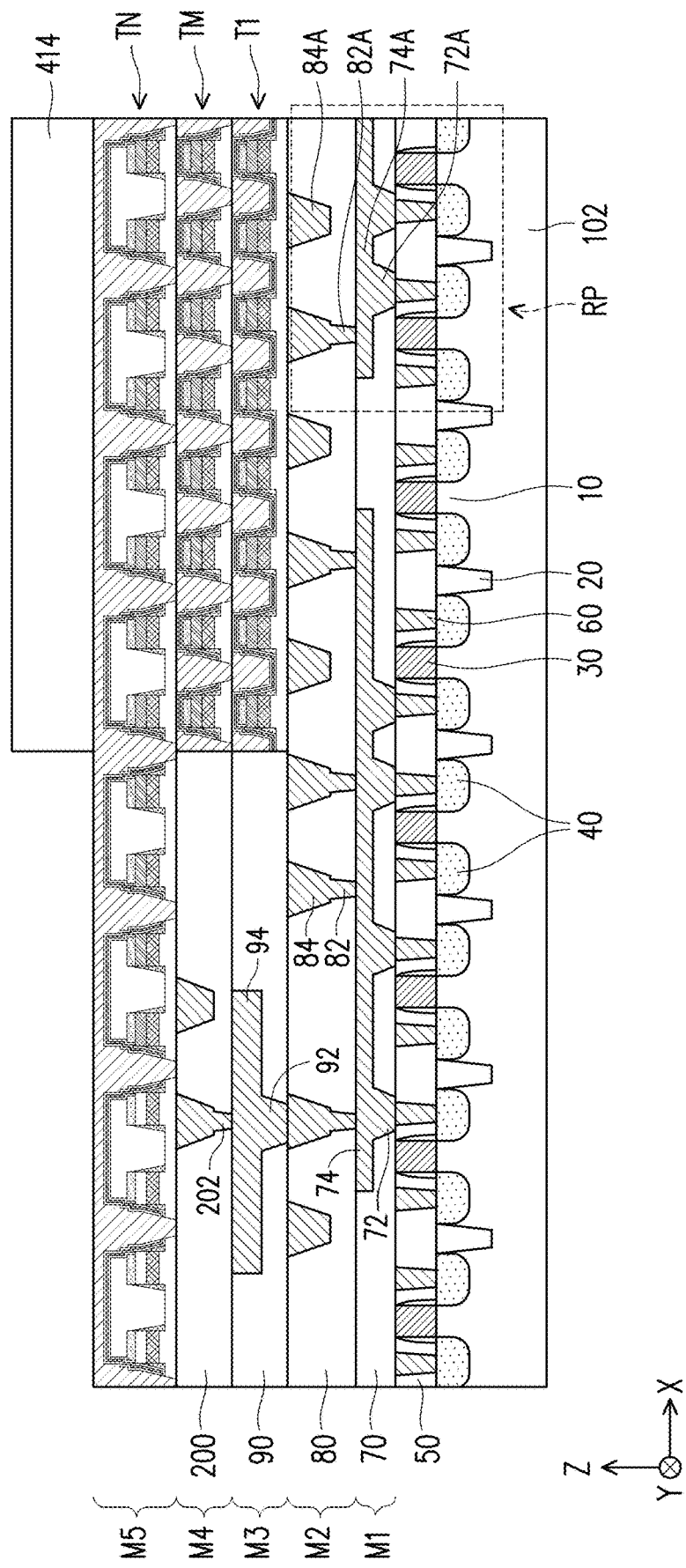
Figure 35:
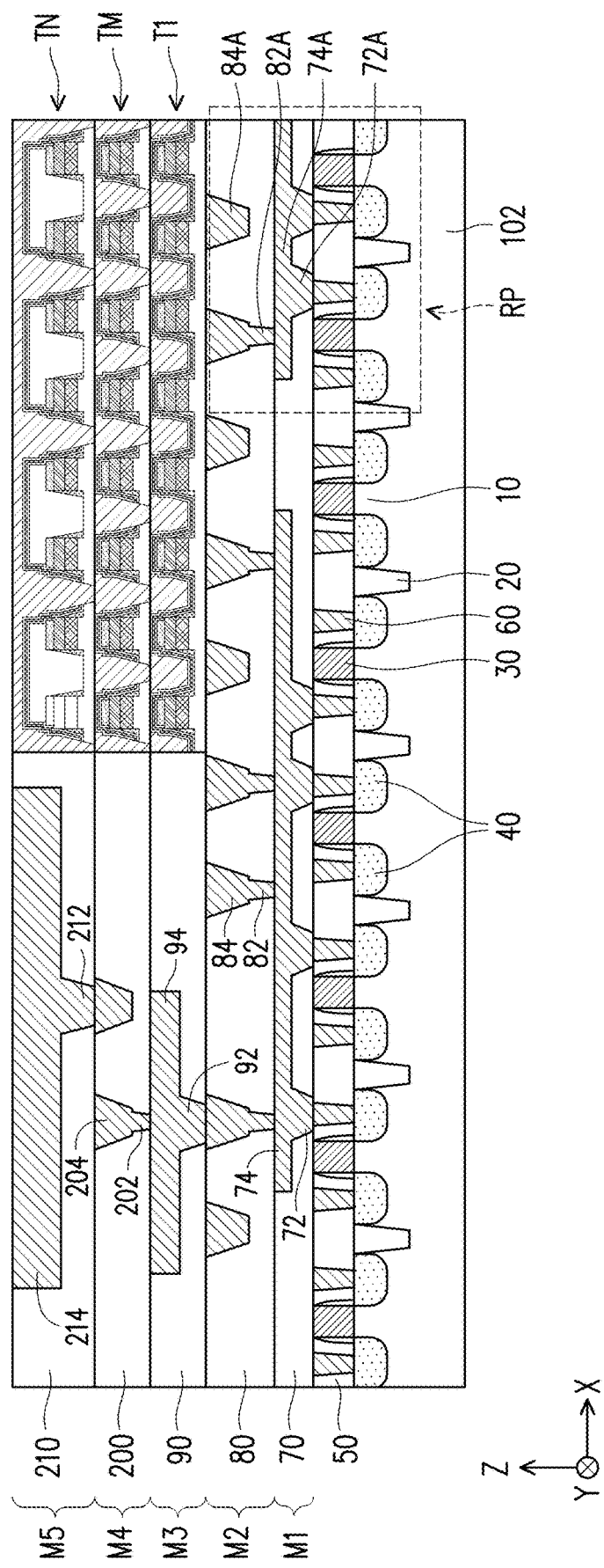

FIG. 34 to FIG. 35 are schematic cross-sectional views taken in the same plane as FIG. 10 to FIG. 11, FIG. 16 to FIG. 19, and FIG. 23 to FIG. 24. In FIG. 34, it is shown that the memory array TN may be formed in the metallization level M5, and a mask layer 420 is formed on part of the memory array TN. Referring to FIG. 34 and FIG. 35, in some embodiments, and the part of the memory array TN left exposed by the mask layer 414 is removed, for example by suitable etching processes, to expose once again the metallization level M4.

In FIG. 35, the operations described with reference from FIG. 17 to FIG. 19 may be repeated to form the ILD layer 210, the conductive vias 212, and the conductive lines 214 are formed beside the memory array TM. Before the memory array TN is formed, the operations described with reference from FIG. 20 to FIG. 22B may be repeated for a desired number of times to form additional middle memory arrays. The semiconductor device SD10 of FIG. 10 may be obtained from the structure illustrated in FIG. 35 by forming the desired number of upper metallization levels (e.g., the metallization levels M6-M7 illustrated in FIG. 10), following similar processes as previously described with respect to the metallization levels M1 and M2, for example.

Figure 36A:
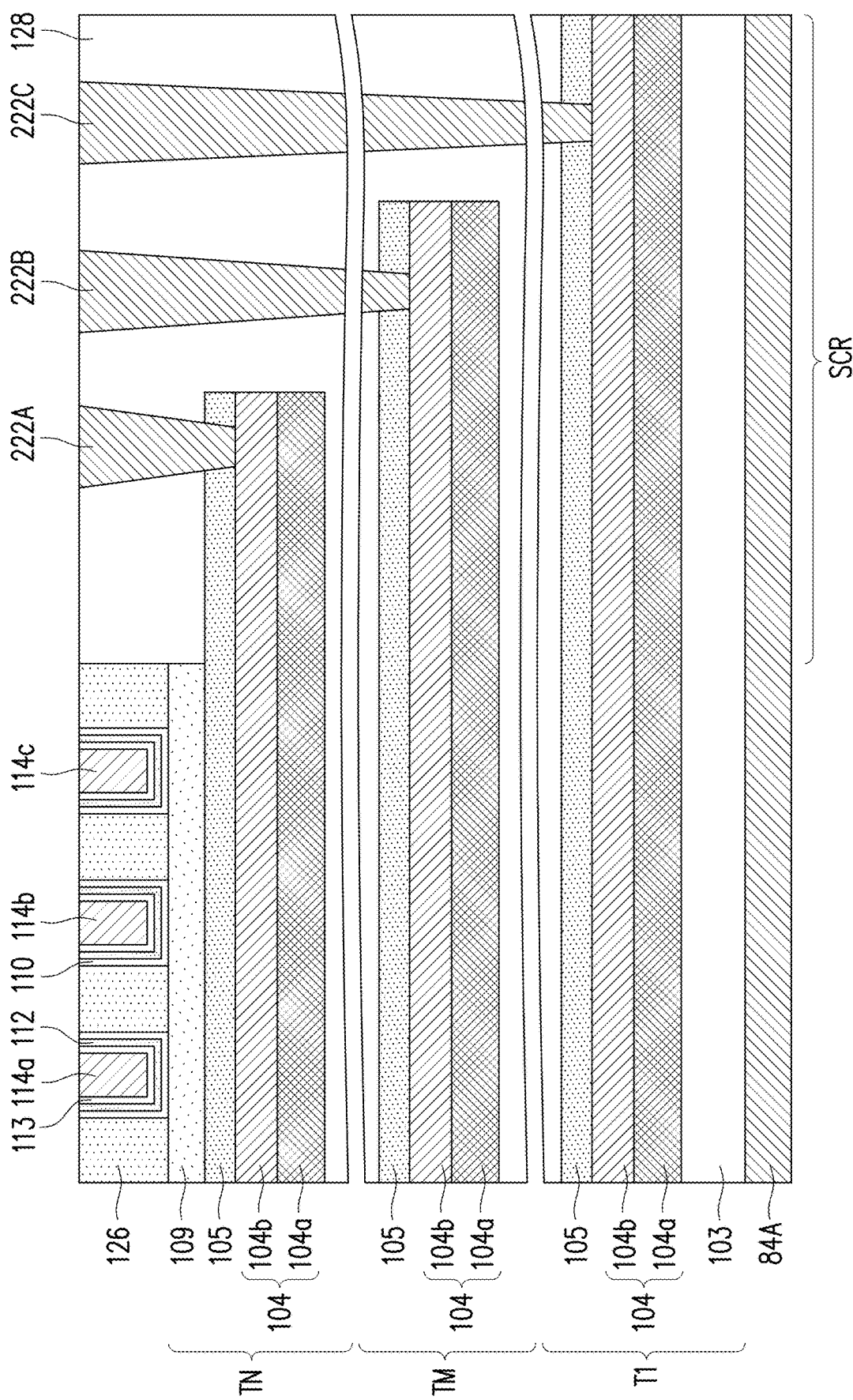
Figure 36B:
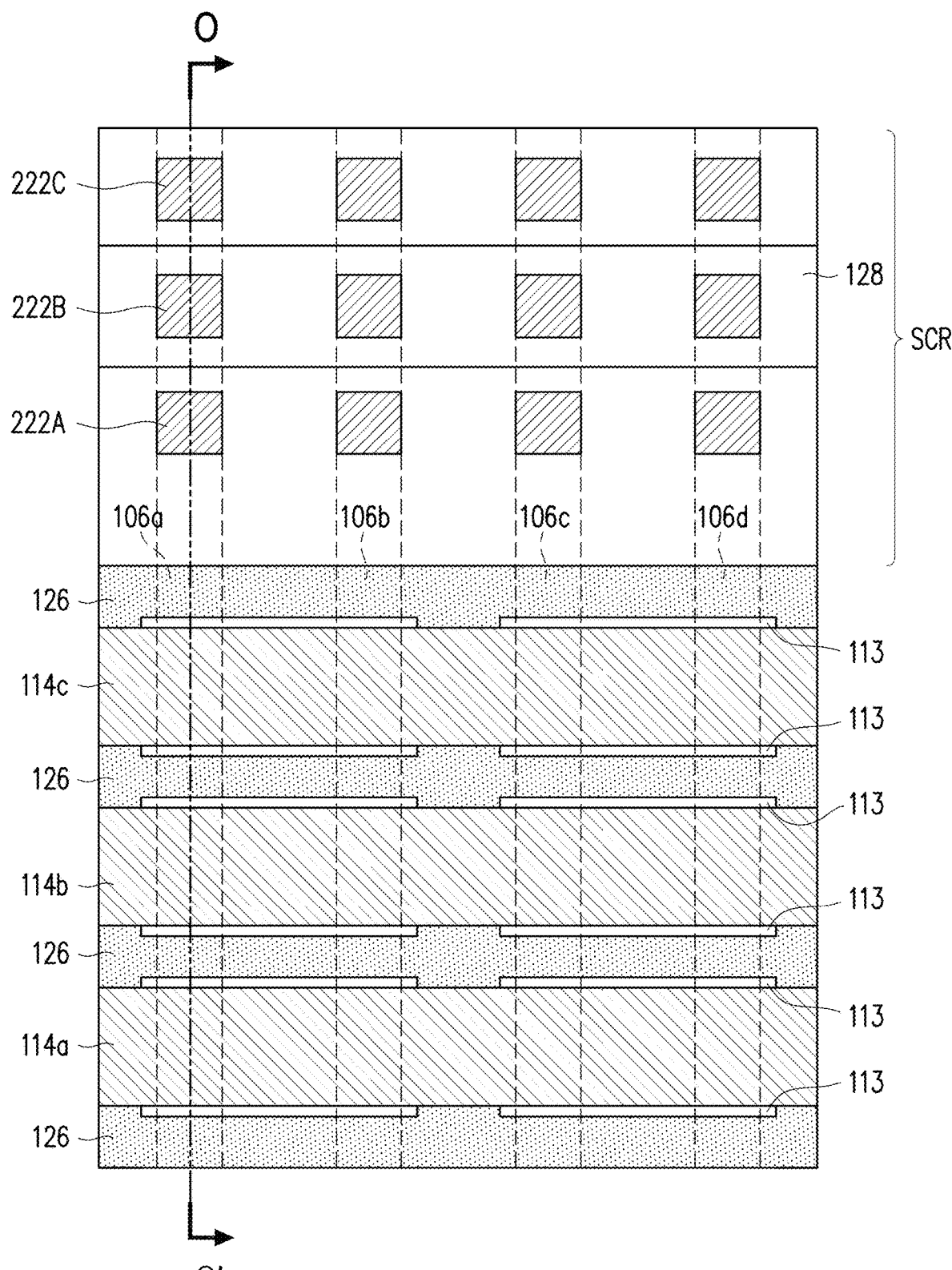
Figure 36C:
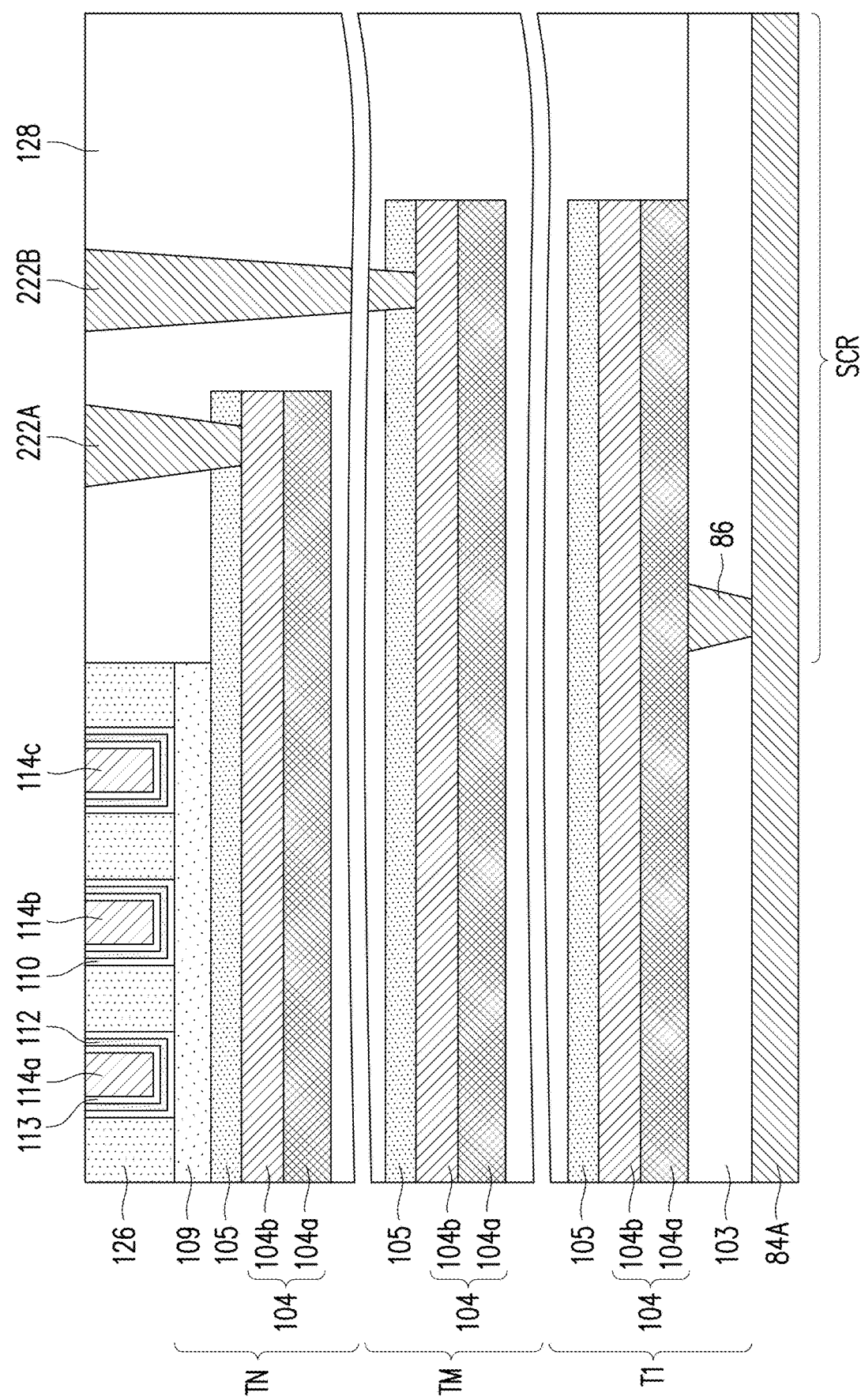
Figure 36D:
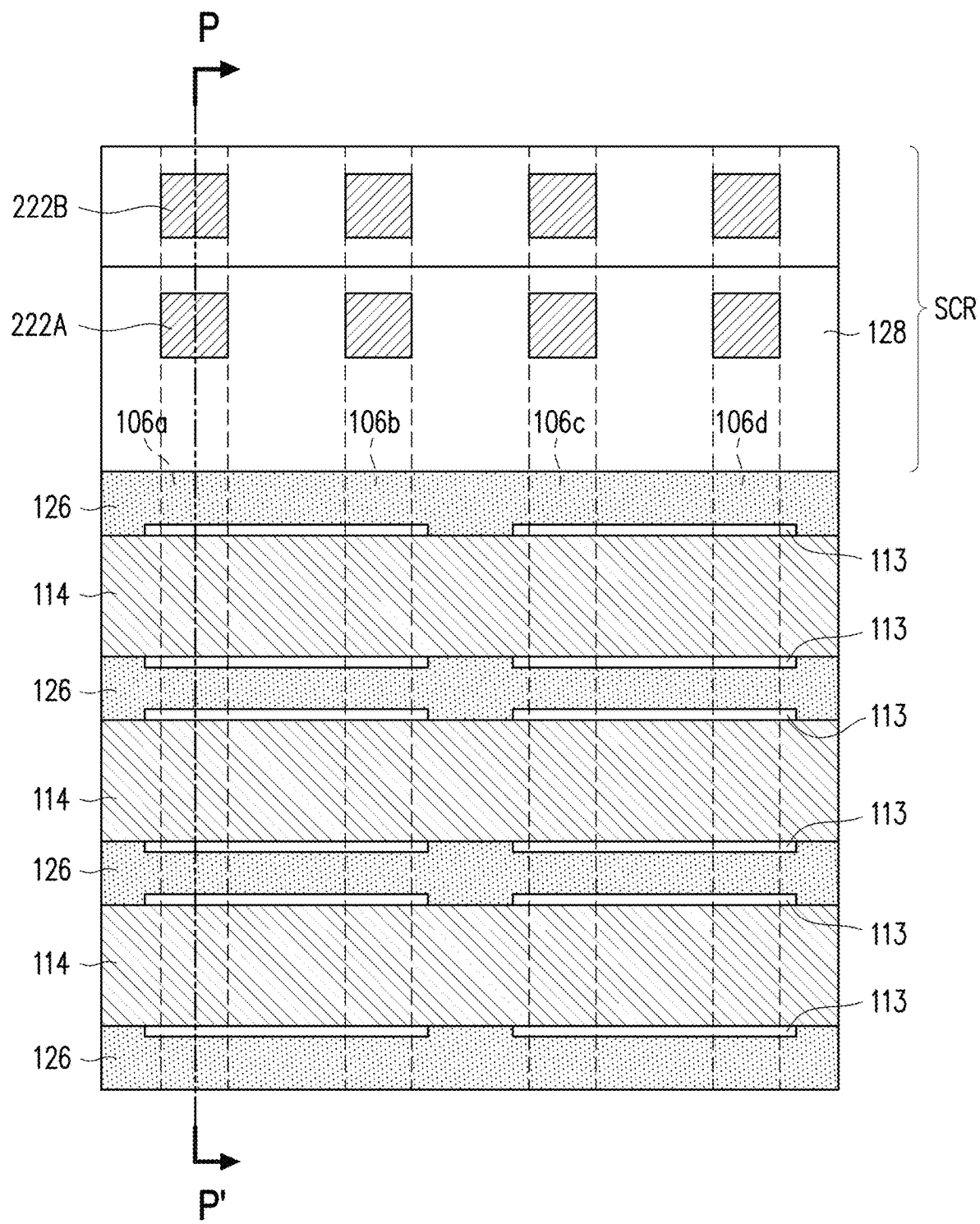

FIGS. 36A and 36C are schematic views of a region of the semiconductor device SD10 in which a memory array TN is being manufactured. FIG. 36A and FIG. 36C illustrate cross-sectional views of the structure along lines O-O' and P-P' of top-views of the memory arrays TN shown in FIG. 36B to FIG. 36D. FIG. 36B and FIG. 36D illustrates the top-views of the memory arrays TN shown in FIG. 36A and FIG. 36C.

In FIG. 36A and FIG. 36B, in some embodiments, the semiconductor device SD10 of FIG. 10 includes a staircase region SCR, and the bit line stacks 106 of the memory arrays T1, TM, and TN extend to staircase region SCR. After the memory array TN is formed, a dielectric layer 128 is formed on the memory array TN. The dielectric layer 128 includes at least one layer of an insulating oxide, such as silicon oxide, and may be formed via suitable deposition processes, such as ALD, CVD, or the like. The dielectric layer 128 may be planarized via a planarization process, for example via grinding, chemical-mechanical polishing, or the like.

The bit lines 104 in the plurality of bit-line stacks 106*a*, 106*b*, 106*c* may be coupled to the interconnection layer to realize the connection to the supporting circuit system (for example, a decoder, a sense amplifier, etc.). Referring to FIGS. 36A and 36B, in some embodiments, the bit lines 104 in the memory arrays T1, TM, and TN are respectively coupled to the conductive vias 222C, 222B, and 222A extending through the dielectric layers 128 and the hard mask layers 105 of the memory arrays T1, TM, and TN. In some embodiments, the conductive vias 222C, 222B and 222A may be formed during forming the metallization level M6 or M7 illustrated in FIG. 10.

Referring to FIGS. 36C and 36D, in alternative some embodiments, the bit lines 104 in the memory arrays TM and TN are respectively coupled to the conductive vias 222B and 222A extending through the dielectric layers 128 and the hard mask layers 105 of the memory arrays TM and TN, while the bit lines 104 in the memory array T1 may be coupled to the underlying interconnect conductive line 84A by means of a conductive via 86 extending through the dielectric layer 103 of the memory arrays T1. In some embodiments, the conductive vias 222B and 222A may be formed during forming the metallization level M6 or M7 illustrated in FIG. 10, and the conductive via 86 may be formed after forming the dielectric layer 103 of the memory array T1 and before forming the conductive layer 104*a*' shown in FIG. 12.

Similarly, in some embodiments, multiple word lines 114*a*, 114*b*, 114*c* may be coupled to an overlying conductive vias (not shown).

Figure 37:
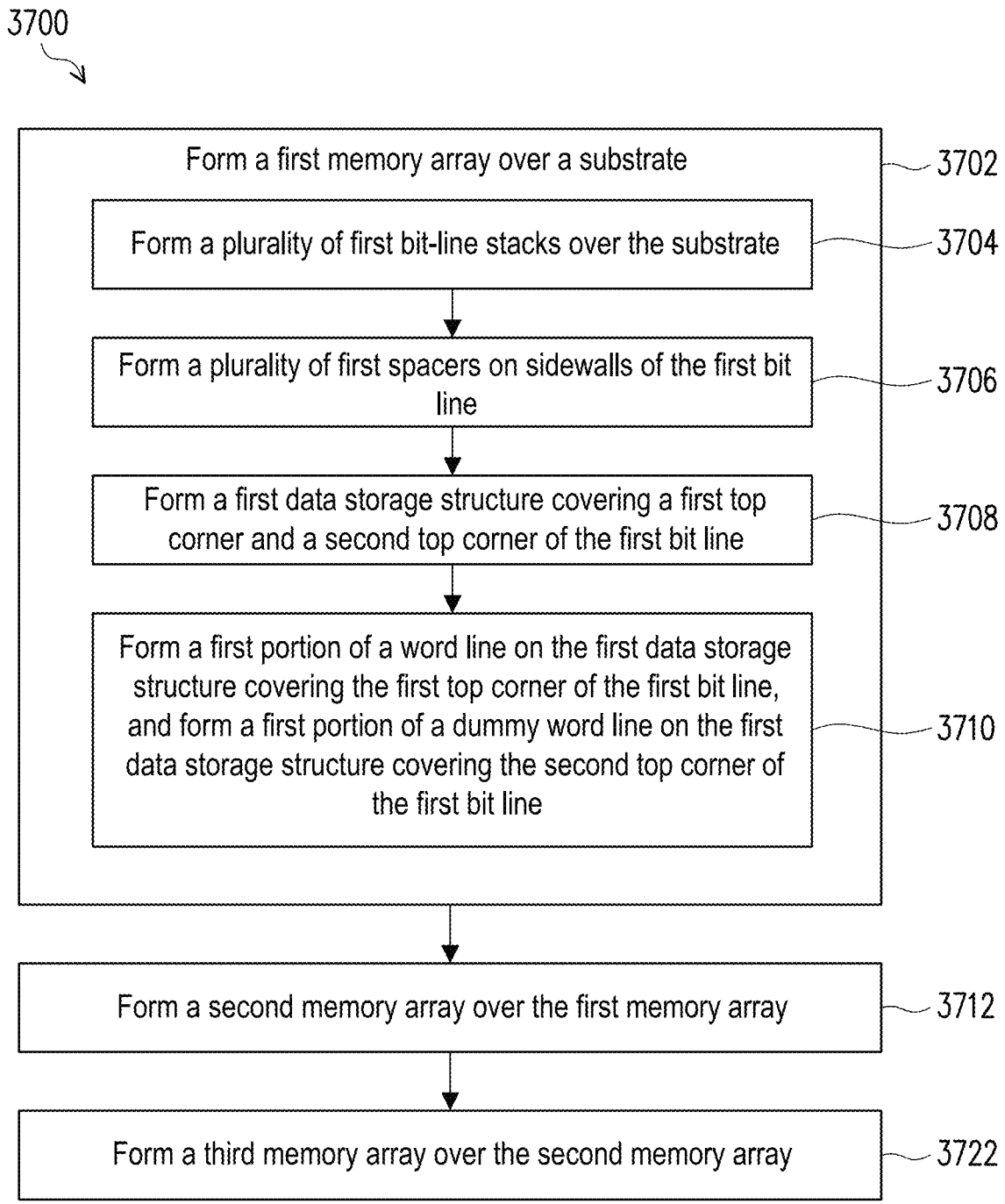
FIG. 37 illustrates a flow diagram 3700 of some embodiments of a method of forming an integrated circuit having a memory array including bit-line stacks having staircase structure.

FIG. 37 illustrates a flow diagram 3700 of some embodiments of a method of forming an integrated circuit having a memory array including bit-line stacks having staircase structure.

While method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3702, a first memory array is formed over a substrate. FIG. 12 to FIG. 15A illustrate cross-sectional views of some embodiments corresponding to act 3702.

At 3704, a plurality of first bit-line stacks are formed over the substrate, and each of the plurality of first bit-line stacks comprising: a first bit line disposed over the substrate; and a first hard mask layer covering a top surface of the first bit line. FIG. 12 illustrates a cross-sectional view of some embodiments corresponding to act 3704.

At 3706, a plurality of first spacers on sidewalls of the first bit line is formed on a lower sidewall of a first sidewall of the first bit line. FIG. 13 illustrates a cross-sectional view of some embodiments corresponding to act 3706. In some embodiments, the first hard mask layer and the plurality of first spacers are partially removed to expose a portion of the top surface of the first bit line, the first top corner, the second top corner and upper sidewalls of the first bit line.

At 3708, a first data storage structure is formed to cover a first top corner and a second top corner of the first bit line. FIG. 15A illustrates a cross-sectional view of some embodiments corresponding to act 3708.

At 3710, a first portion of a word line is formed on the first data storage structure covering the first top corner of the first bit line, and a first portion of a dummy word line is formed on the first data storage structure covering the second top corner of the first bit line. FIG. 15A illustrates a cross-sectional view of some embodiments corresponding to act 3710.

At 3712, a second memory array is formed over the first memory array. FIG. 20 to FIG. 22A illustrate cross-sectional views of some embodiments corresponding to act 3712.

At 3722, a third memory array is formed over the second memory array. FIG. 25A to FIG. 33A illustrate cross-sectional views of some embodiments corresponding to act 3722.

Accordingly, in some embodiments, the present disclosure relates to an integrated circuit comprising memory array having a plurality of bit-line stacks exposing a top corners of bit lines thereof. By consistently forming conductive filaments along a single side of the plurality of bit-lines stacks, variations in a number, size, and/or location of conductive filaments between different bit-lines can be reduced, thereby reducing the forming voltage, the set voltage, and the reset voltages and improving performance of RRAM devices within the memory array.

In accordance with some embodiments of the disclosure, a memory array comprises a first bit-line stack disposed over a substrate, a first spacer, a first data storage structure, and a word line. The first bit-line stack comprises a first bit line disposed over the substrate; and a first hard mask layer partially covering a top surface of the first bit line. The first spacer is disposed on a lower sidewall of a first sidewall of the first bit line. The first hard mask layer and the first spacer expose a top corner of the first bit line. The first data storage structure covers the top corner of the first bit line. The word line covers a sidewall of the first data storage structure.

In accordance with some embodiments of the disclosure, an integrated circuit, comprises a first memory array disposed over a substrate. The first memory array comprises a first bit-line stack, a plurality of first spacers, a word line, and a first data storage structure. The first bit-line stack is disposed over the substrate and comprises a first bit line disposed over the substrate; and a first hard mask layer partially covering a top surface of the first bit line. The plurality of first spacers are disposed on lower sidewalls of the first bit line. The first hard mask layer and the plurality of first spacers expose a first top corner and a second top corner of the first bit lin. The word line is disposed between the plurality of first bit-line stack. The word line comprises a first portion disposed to cover the first top corner of the first bit line; and a second portion disposed to cover the second top corner of the first bit line. The first data storage structure is sandwiched between the word line and the first bit line.

In accordance with some embodiments of the disclosure, a manufacturing method of an integrated circuit comprises forming a plurality of first bit-line stacks over the substrate. Each of the plurality of first bit-line stacks comprises a first bit line disposed over the substrate; and a first hard mask layer covering a top surface of the first bit line. method of an integrated circuit further comprises forming a plurality of first spacers on sidewalls of the first bit line, wherein a first hard mask layer and a plurality of first spacers expose a first top corner and a second top corner of the first bit line; and forming a first portion of a word line on the first data storage structure covering the first top corner of the first bit line, and forming a first portion of a dummy word line on the first data storage structure covering the second top corner of the first bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
a first bit-line stack disposed over a substrate, and the first bit-line stack comprising:
a first bit line disposed over the substrate;
a first hard mask layer partially covering a top surface of the first bit line;
a first spacer, disposed on a lower sidewall of a first sidewall of the first bit line, wherein the first hard mask layer and the first spacer expose a top corner of the first bit line;
a first data storage structure covering the top corner of the first bit line; and
a word line covering a sidewall of the first data storage structure.

2. The memory array of claim 1, wherein the first data storage structure further covers a portion of the top surface of the first bit line and an upper sidewall of the first sidewall of the first bit line.

3. The memory array of claim 1, wherein the word line comprises a protrusion extends laterally toward the first hard mask layer.

4. The memory array of claim 3, wherein the word line gas a T-shape or an inversed staircase shape.

5. The memory array of claim 1, further comprising:
a first selector sandwiched between the first data storage structure and the word line.

6. The memory array of claim 1, wherein the first bit line of the first bit-line stack comprises:
a first conductive layer disposed over the substrate;
a second conductive layer sandwiched between the first conductive layer and the first hard mask layer, wherein a resistance of the second conductive layer is lower than a resistance of the first conductive layer, and a top corner of the second conductive layer is in contact with the first data storage structure.

7. The memory array of claim 1, further comprising:
a second spacer disposed on a sidewall of the first hard mask layer and a second sidewall of the first bit line, wherein a height of the first spacer is lower than a height of the second spacer.

8. The memory array of claim 1, further comprising:
a second bit-line stack disposed over the substrate, wherein the word line is disposed in a space between the second bit-line stack and the first bit-line stack; and
a second data storage structure disposed between the second bit-line stack and the word line.

9. The memory array of claim 8, wherein two adjacent sidewalls of the first bit-line stack and the second bit-line stack have staircase structures.

10. The memory array of claim 8, further comprising:
a third bit-line stack disposed over the substrate, wherein the second bit-line stack is disposed between the first bit-line stack and the third bit-line stack; and
a dielectric layer is sandwiched between the third bit-line stack and the second bit-line stack.

11. An integrated circuit, comprising:
a first memory array disposed over a substrate, the first memory array comprising:
a first bit-line stack disposed over the substrate, the first bit-line stack comprising:
a first bit line disposed over the substrate; and
a first hard mask layer partially covering a top surface of the first bit line;
a plurality of first spacers disposed on lower sidewalls of the first bit line, wherein the first hard mask layer and the plurality of first spacers expose a first top corner and a second top corner of the first bit line;
a word line disposed between the plurality of first bit-line stack, comprising:
a first portion disposed to cover the first top corner of the first bit line; and
a second portion disposed to cover the second top corner of the first bit line; and
a first data storage structure sandwiched between the word line and the first bit line.

12. The integrated circuit of claim 11, wherein the first memory further comprising:
a first selector sandwiched between the first data storage structure and the first portion of the word line, and between the first data storage structure and the second portion of the word line.

13. The integrated circuit of claim 12, further comprising:
a interlayer sandwiched between the first data storage structure and the first selector.

14. The integrated circuit of claim 12, further comprising:
a second memory array disposed over the first memory array, the second memory array comprising:
a dielectric layer disposed over the first memory array
a second bit-line stack stacked over the first bit-line stack;
a second spacer, disposed on a lower sidewall of a first sidewall of the second bit line, wherein a top corner of a second bit line of the second bit-line stack is exposed;
a second data storage structure covering the top corner of the second bit line;
an extension of the word line covering a sidewall of the second data storage structure, and connected to the first portion of the word line;
a body part of the word line connected to the extension and disposed on the second bit-line stack; and
a dielectric layer disposed on the second portion of the word line.

15. The integrated circuit of claim 14, wherein the first portion and the extension of the word line form a bamboo joint shape.

16. A manufacturing method of an integrated circuit, comprising:
forming a first memory array over a substrate comprising:
forming a plurality of first bit-line stacks over the substrate, and each of the plurality of first bit-line stacks comprising:
a first bit line disposed over the substrate; and a first hard mask layer covering a top surface of the first bit line;

forming a plurality of first spacers on sidewalls of the first bit line, wherein a first hard mask layer and a plurality of first spacers expose a first top corner and a second top corner of the first bit line;

forming a first data storage structure covering the first top corner and the second top corner of the first bit line; and forming a first portion of a word line on the first data storage structure covering the first top corner of the first bit line, and forming a first portion of a dummy word line on the first data storage structure covering the second top corner of the first bit line.

17. The manufacturing method of the integrated circuit of claim 16, further comprising:

partially removing the first hard mask layer and the plurality of first spacers to expose a portion of the top surface of the first bit line, the first top corner, the second top corner and upper sidewalls of the first bit line; and forming the first data storage structure to cover the portion of the top surface of the first bit line, the first top corner, the second top corner, and the upper sidewalls of the first bit line.

18. The manufacturing method of the integrated circuit of claim 16, further comprising:

forming a second memory array over the first memory array, comprising:

forming a first dielectric layer over the first memory array;

forming a plurality of second bit-line stacks on the second dielectric layer, and each of the plurality of second bit-line stacks comprising:

a second bit line disposed on the second dielectric layer; and a second hard mask layer on a top surface of the second bit line;

forming a plurality of second spacers on sidewalls of the second bit line;

forming a second dielectric layer on the first dielectric layer and the plurality of second bit-line stacks;

forming a first opening in the second dielectric layer, wherein the first opening exposes a first top corner of the second bit line and a top surface of the second hard mask layer;

forming a second data storage structure to cover the top surface of the second dielectric layer and the first opening;

patterning the second data storage structure and the first dielectric layer to form a second opening, wherein the second opening exposes the first portion of the word line; and forming a second portion of the word line on the second data storage structure in the first opening and the second opening to electrically connected to the first portion of the word line.

19. The manufacturing method of the integrated circuit of claim 18, further comprising:

before forming the second data storage structure, removing a portion of the second hard mask layer and the plurality of second spacers exposed by the first opening to expose a portion of the top surface, the first top corner and an upper sidewall of the second bit line; and forming the second data storage structure to cover the portion of the top surface, the first top corner and the upper sidewall of the second bit line.

20. The manufacturing method of the integrated circuit of claim 18, further comprising:

before forming the second memory array, forming a third memory array on the first memory array, comprising:

forming a third dielectric layer on the first memory array;

forming a plurality of third bit-line stacks on the fourth dielectric layer, and each of the plurality of third bit-line stacks comprises:

a third bit line on the fourth dielectric layer; and a third hard mask layer on a portion of a top surface of the third bit line;

forming a plurality of third spacers on sidewalls of the third bit line;

partially removing the third hard mask layer and the plurality of third spacers to expose a portion of the top surface of the third bit line, a first top corner, a second top corner and upper sidewalls of the third bit line forming the third data storage structure to cover the portion of the top surface of the first bit line, the first top corner, the second top corner, and the upper sidewalls of the third bit line;

removing a portion of the third data storage structure and a portion of the third dielectric layer to form a third opening;

forming a third portion of the word line on the third data storage structure in the third opening, and connected to the first portion of the word line, and forming a second portion of the dummy word line on the first portion of the dummy word line.

* * * * *